US00RE34806E

United States Patent [19]

Cann

[11] E Patent Number: Re. 34,806

[45] Reissued Date of Patent: Dec. 13, 1994

[54] MAGNETOPLASMADYNAMIC PROCESSOR, APPLICATIONS THEREOF AND METHODS

[75] Inventor: Gordon L. Cann, Laguna Beach, Calif.

[73] Assignee: Celestech, Inc., Irvine, Calif.

[21] Appl. No.: 879,560

[22] Filed: May 4, 1992

Related U.S. Patent Documents

Reissue of:

[64] Patent No.: 4,682,564
Issued: Jul. 28, 1987
Appl. No.: 512,728
Filed: Jul. 11, 1983

U.S. Applications:

[63] Continuation of Ser. No. 387,977, Jul. 28, 1989, abandoned, which is a continuation-in-part of Ser. No. 210,241, Nov. 25, 1980, abandoned.

[51] Int. Cl.[5] ..... C23C 16/50

[52] U.S. Cl. ..... 427/446; 427/571; 427/580; 118/723 FI; 118/723 DC; 204/156; 422/186.03; 422/186.05; 422/186.21; 219/121.43; 219/121.47; 156/345; 156/643

[58] Field of Search ..... 427/34, 37, 38, 39, 427/47, 571, 580, 446; 219/121.11, 121.36, 121.48, 121.5, 121.52, 121.56, 122, 123, 121.47, 121.43; 118/723, 620, 723 FI, 723 DC, 723 HC; 156/345, 643; 422/186.03, 186.05, 186.21; 204/156

[56] References Cited

U.S. PATENT DOCUMENTS

| | | | |
|---|---|---|---|
| 2,537,255 | 1/1951 | Brittain . | |
| 3,238,414 | 3/1966 | Keller et al. . | |
| 3,243,954 | 4/1966 | Cann . | |
| 3,309,873 | 3/1967 | Cann . | |
| 3,324,316 | 6/1967 | Cann . | |
| 3,340,601 | 9/1967 | Garibotti . | |
| 3,388,291 | 6/1968 | Cann . | |
| 3,413,509 | 11/1968 | Cann et al. . | |
| 3,437,871 | 4/1969 | Cann et al. . | |
| 3,449,628 | 6/1969 | Cann et al. . | |
| 3,452,249 | 6/1969 | Cann . | |
| 3,453,469 | 7/1969 | Cann et al. . | |
| 3,453,474 | 7/1969 | Cann et al. . | |
| 3,453,488 | 7/1969 | Cann et al. . | |
| 3,453,489 | 7/1969 | Cann et al. . | |
| 3,462,622 | 8/1969 | Cann et al. . | |
| 3,467,885 | 9/1969 | Cann . | |
| 3,501,262 | 3/1970 | Arless et al. | 423/613 |
| 3,516,386 | 6/1970 | Landwehr et al. | 118/721 |
| 3,597,650 | 8/1971 | Anderson . | |
| 3,828,223 | 8/1974 | New | 423/613 |
| 3,869,593 | 3/1975 | New et al. . | |
| 3,890,535 | 6/1975 | Gautherin et al. . | |
| 3,916,034 | 10/1975 | Tsuchimoto . | |
| 3,961,103 | 6/1976 | Aisenberg . | |
| 4,003,770 | 1/1977 | Janowiecki et al. . | |
| 4,013,533 | 3/1977 | Cohen-Solal et al. . | |

(List continued on next page.)

OTHER PUBLICATIONS

Amex Systems, Inc.-Final Technical Report, Dec. '80.
Thrust Efficiencies of Electromagnetic Engines, Electro-Optical Systems, Inc., AIAA Journal vol. 6, No. 3, Mar. '68.

(List continued on next page.)

*Primary Examiner*—Terry J. Owens
*Attorney, Agent, or Firm*—Weil, Gotshal & Manges

[57] ABSTRACT

Embodiments of magnetoplasmadynamic processors are disclosed which utilize specially designed cathode-buffer, anodeionizer and vacuum-insulator/isolator structures to transform a working fluid into a beam of fully ionized plasma. The beam is controlled both in its size and direction by a series of magnets which are mounted in surrounding relation to the cathode, anode, vacuum insulator/isolators and plasma beam path. As disclosed, the processor may be utilized in many diverse applications including the separation of ions of differing weights and/or ionization potentials and the deposition of any ionizable pure material. Several other applications of the processor are disclosed.

109 Claims, 22 Drawing Sheets

U.S. PATENT DOCUMENTS

| | | | |
|---|---|---|---|
| 4,047,624 | 9/1977 | Dorenbos | 118/729 X |
| 4,123,316 | 10/1978 | Tsuchimoto . | |
| 4,123,686 | 3/1966 | Kelly et al. . | |
| 4,156,832 | 5/1979 | Kistemaker . | |
| 4,162,431 | 7/1979 | George et al. | 219/121.52 |
| 4,194,106 | 3/1980 | Rudaz et al. | 219/123 |
| 4,229,679 | 10/1980 | Lode . | |
| 4,256,780 | 3/1981 | Gaerttner . | |
| 4,275,287 | 6/1981 | Hiratake | 219/121.5 |
| 4,292,568 | 9/1981 | Wells et al. . | |
| 4,293,794 | 10/1981 | Kapetanakos . | |
| 4,393,333 | 7/1983 | Sakudo . | |
| 4,401,054 | 8/1983 | Matsuo . | |
| 4,438,368 | 3/1984 | Abe . | |
| 4,452,686 | 6/1984 | Axenov et al. . | |
| 4,512,867 | 4/1985 | Andreev . | |
| 4,551,221 | 11/1985 | Axenov . | |

OTHER PUBLICATIONS

Electromagnetic Acceleration of Ions in Axially Symmetric Fields, AIAA 7th Aerospace Sciences Meeting, Jan. 20–22, 1969.

Annular Magnetic Hall Current Accelerator, Electro–Optical Systems, Inc., Aug. 31–Sep. 2, 1964.

High Specific Impulse Thermal Arc Jet Thrustor Technology, Electro–Optical Systems, Inc., Sep. '65.

Mechanisms of Magnetoplasmadynamic Arcjet Acceleration Processes, Technion, Incorporated, Dec. 27, 1978.

The Use of E. M. Accelerators in High Pressure Test Facilities, Technology, Incorporated, May, '72.

Aerodynamic Separation of Gases and Isotopes the Plasma Centrifuge, von Karman Institure for Fluid Dynamics, May 29–Jun. 2, 1978.

X–Atron Diagnostics, Electro–Optical Systems, Inc., Jun. 14, 1968.

High Specific Impulse Thermal Arc Jet Thruster Technology, Electro–Optical Systems, Inc. Feb. '67.

High Specific Impulse Thermal Arc Jet Thruster Technology, Electro–Optical Systems, Inc., Dec. '64.

Karr, Vacuum Deposition of Material Films on Substrates Utilizing Controlled Plasma, Oct. '76, vol. 19, No. 5, pp. 1518–1420.

Meyerand, Jr., The Oscillating–Electron Plasma Source, pp. 81–90 (undated).

Moore, Cann and Gallagher, High Specific Impulse Thermal Arc Jet Thrustor Technology, Air Force Aero Propulsion Lab., Jun. '65.

Diagnositic Measurements in ALPHA (Alkali Plasma Hall Accelerator).

Diagnostic Measurements: Local Energy Flux (pp. 37–41), Sec. 4.1.

CONTINUOUS MODEL

WIRE MODEL

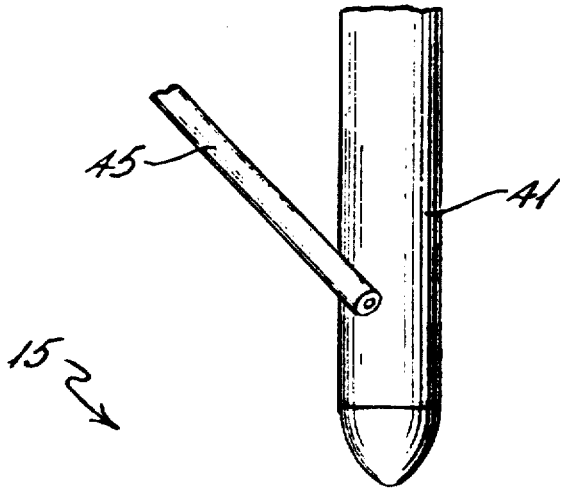
Fig. 9
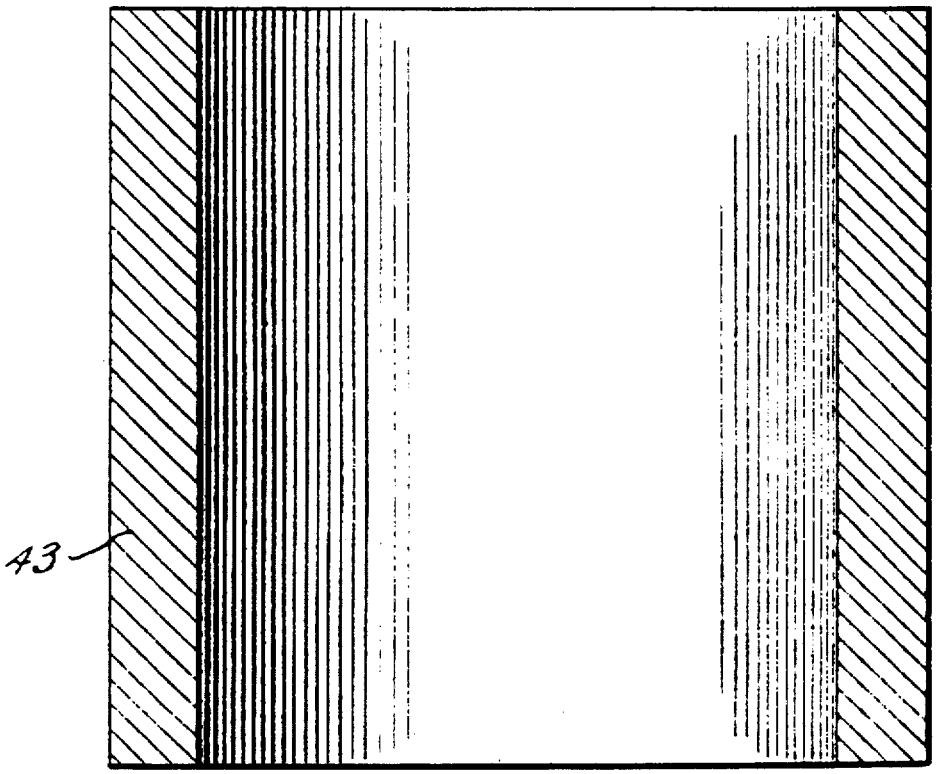

MAGNETOPLASMADYNAMIC PROCESSOR, APPLICATIONS THEREOF AND METHODS

Matter enclosed in heavy brackets [ ] appears in the original patent but forms no part of this reissue specification; matter printed in italics indicates the additions made by reissue.

BACKGROUND OF THE INVENTION

[This application] *This is a continuation of copending application Ser. No. 07/387,977 filed on Jul. 28, 1989, now abandoned, which is a reissue of Ser. No. 06/512,728, filed on Jul. 11, 1983, now U.S. Pat. No. 4,682,564, which* is a C-I-P of application SER. No. 210,241 filed Nov. 25, 1980, now abandoned.

FIELD OF THE INVENTION

The magnetoplasmadynamic phenomena was first discovered in 1961 by applicant and described in U.S. Pat. No. 3,243,954. A device that was designed and tested was intended for space propulsion applications and is commonly known as a plasma propulsion system. The principal design and performance requirements were to fully ionize a single species vapor and accelerate all the ions to a preferred high velocity into space. The device was to have high thrust efficiency, where thruster efficiency was defined as $$\text{Thrust efficiency} = \eta\text{mass}\eta\text{exhaust}\eta\text{power}$$

where $$\eta\text{mass} = \text{mass utilization efficiency} = \frac{\text{mass ionizd}}{\text{mass injected}}$$

and $\eta$exhaust = exhaust efficiency = $v/v_{max}$ and $$\eta\text{power} = \text{power efficiency} = \frac{\text{thrust power}}{\text{electrical power input}}$$

$$\text{Thrust power} = m_{ions} \times \frac{(v)^2}{2}$$

where $m_{ions}$ = mass flow of ions v = average velocity of ions

See Table (5) for typical values

No attempt was made to separate materials in this process as the intended application did not direct the development to that end.

Subsequent to the issuance of the above discussed patent, applicant received, as sole patentee or co-patentee 7 U.S. patents which are believed to be only very generally related to the subject matter of the instant patent application. U.S. Pat. No. 3,309,873 was a CIP of U.S. Pat. No. 3,243,954 and disclosed a fourth embodiment of accelerator over and above the three embodiments of accelerator disclosed in U.S. Pat. No. 3,243,954. This fourth embodiment discloses a plasma accelerator for use at channel pressures of about 1-10 mm. HG.

Subsequently U.S. Pat. No. 3,388,291 was issued and constituted a further refinement on the above discussed two patents. This patent broadly introduced the concepts of (1) the anode sheath, (2) the cathode jet, and (3) the electric ram jet but as pertains to the instant invention lacks the refinement and detail as well as the buffer structure, isolator structures, multiple magnet structure and gas injection details of the instant invention.

Subsequently, U.S. Pat. No. 3,413,509 was issued and this patent generally disclosed the concepts of (1) the cathode buffer, (2) injection of feed gas near the anode, and (3) opposed electrode confinement, none of which were disclosed with the specificity disclosed herein. As pertains to the instant disclosure, that patent lacks the physical structure of the present processor and as such has mechanical confinement limitations. Further, there is no disclosure therein of the decisive and critical implications of the minimum voltage hypothesis.

Subsequently, U.S. Pat. No. 3,453,469 was issued which is related to above discussed U.S. Pat. No. 3,413,509 as both patents matured from applications which were C.I.P.'s of prior application Ser. No. 458,837 filed May 20, 1965. This patent disclosed the concepts of (1) plasma containment with opposed electrodes, and (2) mechanical pumping out of the apparatus chamber from a plurality of locations, each of which lacks a sophistication of the present invention. Application Ser. No. 458,837 matured into U.S. Pat. No. 3,453,488 and further U.S. Pat. No. 3,453,474 was also a C.I.P. of Ser. No. 458,837.

Finally, U.S. Pat. No. 3,467,885 was issued and disclosed the concepts of (1) open ended plasma confinement, (2) the equation for the length of the cathode jet and (3) sonic jet details.

Regarding the above discussed patents, it is noted that they teach some of the basic concepts disclosed herein and the instant invention provides the sophistication to enable the practice of the herein disclosed applications. Again, while the above discussed patents are believed generally related to the instant invention, their pertinence to the instant invention may be best characterized by the degree of sophistication of the concepts taught herein as opposed to therein. For example, prior U.S. Pat. No. 3,453,469 discloses a plurality of pumps for evacuating the chamber, each mechanical in nature whereas, herein, mechanical, sorption, condensation and ion pumps are disclosed. Many other such examples will become self-evident through comparison of this application with the subject matter disclosed in the prior patents. None of prior patents disclose for example the vacuum insulator/isolator concepts taught herein.

The magnetoplasmadynamic phenomena herein described is simply the controlled interaction of a high current electrical discharge and an applied solenoidal magnetic field through the induced current and magnetic field resulting when the plasma is produced, confined and accelerated by the applied electric and magnetic fields. This type of interaction phenomena is referred to as the Hall Current effect. The significance of the work of Cann and others lies in:

(a) the development and appreciation of the mechanisms of electromagnetic acceleration and confinement;

(b) the development of a global understanding of the thermodynamics responsible for minimizing the system free energy and expressing these relations in terms of a minimum voltage hypothesis;

(c) correlating experimental data in terms of the above; and (d) the development of design concepts using the above items to optimize performance of a space plasma propulsion engine.

The proper voltage selection and propellant injection rate resulted in ionization and acceleration of the charged particles (ions and electrons) in the direction parallel to the applied magnetic field. Tile resulting plasma was accelerated to the desired exhaust velocity. Other prior art is also known to applicant. For example, Janowiecki, et al., U.S. Pat. No. 4,003,770 (also United States Patent Office Voluntary Protest Program Document No. B 65105) discloses a process for preparing solar cells in which p- or n-doped silicon particles are injected into a plasma stream where the particles are vaporized. The heated particles are then discharged from the plasma stream onto a substrate to provide a polycrystalline silicon film. During the heating and transport, a suitable atmosphere is provided so that the particles are surrounded to inhibit oxidation. However, Janowiecki, et al. do not suggest the use of his techniques for refining the silicon. Walter H. Brattain in U.S. Pat. No. 2,537,255, discloses the deposition of silicon for silicon photo-emf cells, using a mixture of hydrogen and silicon tetrachloride. However, this early technique does not disclose the use of a magnetoplasmadynamic effect for either production of these solar cells, nor the refining of metallurgical grade silicon into semiconductor grade silicon.

Tsuchimoto in U.S. Pat. No. 3,916,034 discloses a method for transporting semiconductors in a plasma stream onto a substrate. The plasma is directed by magnetic fields onto thin film substrates. Tsuchimoto is typical of prior ionization chambers for use with a magnetogasdynamic process. In that magnetogasdynamic process, mass utilization efficiency is low, making the method ineffective for refining mass quantities of silicon. All species are not normally ionized because no preferential ionization can be accomplished with this invention. That is because the dopants are mixed externally from the ionization chamber by switching the magnetic fields. Tsuchimoto discloses a device having severe limitations as compared to the instant invention. He discloses the surface area of deposition as on the order of 1 $cm^2$, the discharge current as 1–3 amps, the pressure in the plasma source chamber as $10^{-2}$ Torr and the tolerance of the cathode to the presence of oxidizing material is quite low. As Will be seen hereinafter, each of these disclosed aspects of the Tsuchimoto device are vastly different from the teachings of the present invention. Further, Tsiichimoto is believed non-pertinent because:

(1) be requires a separate cathode filament heater in order to sustain discharge;

(2) his plasma is not uniformly electromagnetically accelerated to a controllable energy; in his discussion the prior art, he implies electrostatic acceleration;

(3) his discharge voltage of 200–300 volts differs from that of the present invention;

(4) his typical power levels of 300–900 watts differ;

(5) col. 7, lines 26–48 indicate a lack of purification of the ion beam.

Other distinctions are also present which are believed relevant but for reasons of brevity are not pointed out herein.

Further, applicant is aware of IBM disclosure Vol. 19 No. 5 (1976) to P. C. Karr. This disclosure gives few if any specifics on operating parameters and is distinct from the instant invention in at least the following particulars:

(1) No specifics of the control of coils 11, 12, 13 are given), only general statements as to their purpose. Herein, the description of the electromagnets is given both theoretically and in exemplary form;

(2) The plasma is transported through a "rippling" technique whereas, herein, electro-magnetic axisymmetric acceleration is used;

(3) There is no disclosure of the separation of impurities or unwanted ions simultaneously with deposition. Herein, this is accomplished.

Again, for brevity, other distinctions are not pointed out herein.

Several references disclose glow discharge techniques used in deposition processes, For example, Cohen-Solal, et al. U.S. Pat. No. 4,013,533 is directed to a glow discharge sputtering process. Aisenberg, U.S. Pat. No. 3,961,103 is directed to a glow discharge system and subsequent ion beam deposition.

SUMMARY OF THE INVENTION

It is a first object of the present invention to provide a plasma processor in which a working fluid is transformed into a neutral beam of fully ionized plasma with the ion flux rate thereof being higher than 50 amperes equivalent.

It is a further object of the present invention to provide a plasma processor in which the plasma formed therein may be controlled both as to size and direction thru the combined use of electric and magnetic fields.

It is a still further object of the present invention to provide a plasma processor which is designed to remain electromagnetically as well as plasma dynamically stable over a wide range of controllable variables.

It is a yet further object of the present invention to provide a plasma processor wherein the plasma ions formed thereby are monoenergetic and the energy level can be controlled within defined limits.

It is a yet further object of the present invention to provide a plasma processor which is operable in steady-state fashion for hundreds of hours or more.

It is a yet further object of the present invention to provide a plasma processor with high mass utilization, power efficiency and processing rate.

It is a still further object to provide a plasma processor which may be adapted to perform ill the following applications:

(a) processing of an inert gas for annealing surfaces, film and layered structure;

(b) processing of a chemically active gas to perform etching operations or otherwise react with a deposition surface;

(c) processing and deposition of any pure material which may be ionized;

(d) processing and deposition of a material which will form a compound or mixture or act as a dopant to the substrate material;

(e) simultaneous deposition of two or more substances of comparable ionization potential;

(f) simultaneous deposition and annealing;

(g) deposition of conductors on semiconductor wafers or films;

(h) separation and purification of a component of a compound that has a lower ionization potential than another component thereof;

(i) collection and deposition of the separated and purified component; (j) utilization of axisymmetric mass spectrograph feature of processor to separate materials of different mass and comparable ionization potential;

(k) collection and deposition of the so separated materials;

(l) space propulsion;

(m) function as a component of a linear magnetic mirror fusion machine;

(n) convert thermal or kinetic energy of plasma into electrical energy, when operated as an MPD generator using a fully ionized plasma as the energy source.

Further objects of the present invention include the following:

It is an object of this invention to make thin doped semiconductor crystals rapidly and cheaply.

It is a further object to make various semiconductor transistor, diodes, resistors and capacitors rapidly and inexpensively. It is a particular object to make these various semiconductor and thin film devices in such a way that large areas of the semiconductors may be inexpensively produced.

It is, accordingly, an object to provide a method and apparatus for refining silicon, and particularly for refining matallurgical grade silicon into a purer form of silicon to produce semiconductor grade silicon.

It is a further object to produce semiconductor grade material in thin Films having large areas, thereby providing an inexpensive base product for making silicon photovoltaic solarcells.

It is a further object of this invention to provide a method of refining materials such as silicon in layers using magnetoplasmadynamic techniques.

Accordingly, it is a further object of the present invention to provide a new and improved method and apparatus for the separation of materials which does not depend upon conventional chemical reduction processes, conventional catalytic processes, vapor transport processes, laser beating, differential ionization, electron beam beating or a melted crystal pull process to obtain separation of species. However, a further object of the invention is to provide a new and improved means of electromagnetic separation by selective ionization and acceleration in a magnetic field as well as by utilizing the axisymmetric mass spectrograph separation techniques unique to this device. Particularly it is an object to provide a method and apparatus which has a low cost relative to present separators and which requires less power to operate.

It is a further object of the present invention to provide a means to form large area silicon films used for solar cells, and particularly large area silicon solar cells in a process which is economical to operate and which has a low power consumption.

It is still a further object to refine silicon for solar cells to be used in terrestrial applications in which the cost of production of the solar cells, and particularly the power consumption costs of production, are significantly less than the value of the power expected to be produced by the solar cells during the lifetime of the solar cells.

Accordingly, the invention, in one aspect thereof, is directed to an apparatus for depositing materials in layers to form wafers and/or films of material by means of magnetoplasmadynamic deposition. A plasma beam is electro-magnetically accelerated in a vacuum chamber by means of a magnetoplasmadynamic generator comprising a cathode, an anode, an accelerating magnet adjacent to the cathode, a trimmer magnet adjacent to the anode, and a focusing magnet. The focusing magnet has a magnetic flux pattern which can be rotated so as to direct the plasma beam in different directions as the plasma is ejected from the plasma generator. In one aspect of the invention, a means is provided for injecting materials into the plasma in order to create a modified plasma stream. These injected materials may comprise a carrier gas for the desired ionizable materials. The injected materials may also comprise dopants used for depositing a doped layer of the material. The doped layer can be of any desired thickness.

In another aspect, the focusing magnet may be placed on a gimbal so as to allow the magnetic flux field of the focusing magnet to be rotated, thereby permitting deposition of materials evenly on various portions of the target area.

In yet a further aspect of the invention, the apparatus is used to deposit a substrate before the semiconductor material is deposited.

In yet a further aspect of the invention, the material to be deposited is provided in the form of a hollow cathode. The dopant and carrier may then be injected so as to pass through the hollow cathode as the dopant and carrier enter the plasma stream.

In yet a further aspect of the invention, the apparatus is used to deposit a substrate before the semiconductor material is deposited. While the semiconductor material is deposited, doped layers of the semiconductor material are applied by the magnetoplasmadynamic generator. A top terminal may then be electro-deposited by the plasma generator onto the semiconductor material. This top terminal may be formed by mechanically placing a metal strip or grid on top the semiconductor and bonding the metal with a material which is applied by electrodeposition using the plasma generator.

In still another aspect, this invention is directed to a method for producing semiconductor materials such as semiconductor grade silicon in a vacuum environment.

A plasma is established between a cathode and an anode. The plasma is accelerated with an accelerating magnet and focused onto a deposition area located on a target area with a focusing magnet. The semiconductor material, such as silicon, is placed in the plasma, thereby forming the plasma stream.

The deposition area may be moved along the target area by changing the flux orientation of the focusing magnet.

In yet another aspect, the completed semiconductors or semiconductor films may be removed from the target area by a robot means so that subsequent semiconductors or semiconductor films may be formed without the requirement that the vacuum chamber be pumped down each time a new semiconductor film or unit is to be formed.

In yet a further aspect of this invention, metal terminals such as aluminum terminals may be formed on semiconductors by magnetoplasmadynamic-deposition techniques.

Other aspects of the invention such as, for example, details of the trimmer magnets and vacuum insulator-/isolator structure will be described in great detail hereinafter.

BRIEF DESCRIPTION OF THE DRAWINGS

FIG. 9 shows a schematic representation of the arc-forming section of the embodiment of FIG. 6.

THEORETICAL BASIS FOR INVENTIVE CONCEPTS TAUGHT HEREIN ION PRODUCTION

Figure 1A:
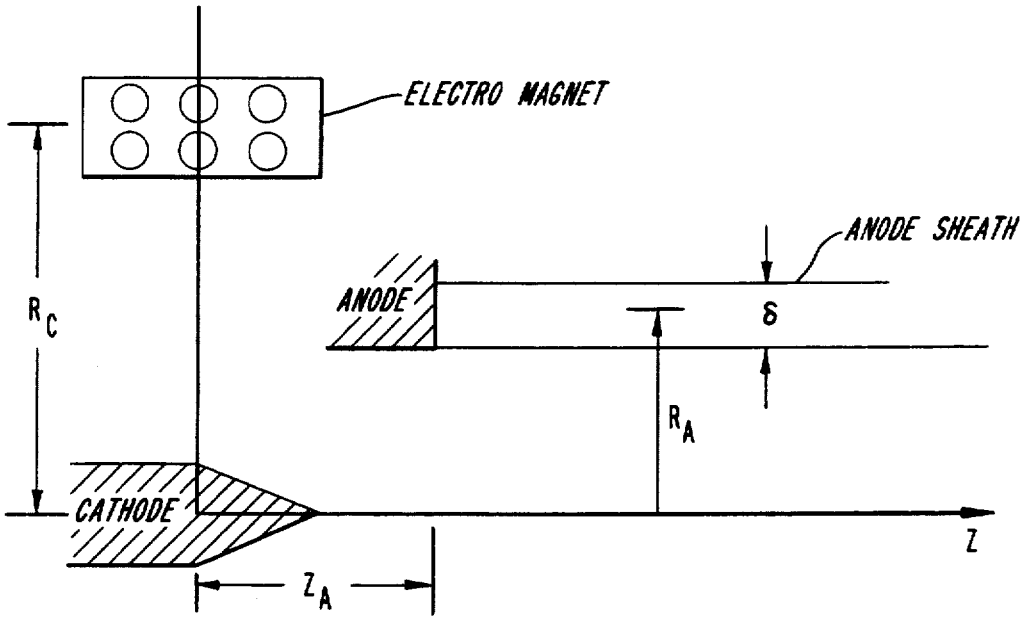
FIG. 1a shows a schematic representation of the relationship between a cathode, anode, electromagnet and anode sheath.

The momentum conservation equations indicate that some torque and force reaction must occur on the processor during operation thereof. For this to happen, ions must be produced in and expelled from the device with both axial and angular velocity. The lower the ion flux rate, the higher the resultant velocities must be and, consequently, the beam power must be higher. On the other hand, as the ion production and expulsion rate increases, the power in ion production becomes very high; hence some ion flow rate must exist at which the electrical power into the discharge is a minimum. If the arc current is held fixed, this implies that the discharge seeks a minimum voltage Anode in which to operate. The above argument then indicates that the arc accomplishes this end by ionizing the optimum amount of material thru-put to expel in the exhaust beam. The key, then, to explaining the operating characteristics of the device lies in determining the optimum ion exhaust rate and in understanding the production process for these ions throughout the volume of the discharge.

Atoms are not confined to any great extent by the electric discharge and/or applied magnetic field. Hence the flow field of the gas will be substantially the same as one would find for the gas issuing from the orifice with no discharge present. The discharge must now encompass this gas and adjust the electron temperature and density throughout its volume so as to ionize the optimum amount of material. Clearly, to get good material utilization, the injected flow rate should be close to the ion flow rate in the beam. However, in the interest of obtaining best overall efficiency, it may be necessary to inject slightly more material than is used by the beam. This would help to restrict the volume of the discharge and perhaps keep the electron temperature to lower values, thus reducing power loss by electron energy convection to the anode.

Since a significant number of atom-electron collisions are elastic (non-ionizing) collisions, the energy used to ionize one atom must be considerably greater than the ionization potential of the atom. The energy difference is transferred into the internal energy of the atoms and ions. If most of the injected mass is eventually ionized, this energy is not lost, but is available to be transferred into beam kinetic energy by eventual expansion through a magnetic nozzle to be described hereinafter. It is obvious, of course, that this internal energy of the heavy particles can never be higher than that of the electrons. This argument indicates that the ionization process need not be efficient. However, the number of inelastic collisions that excite the electrons to states that can radiate should be minimized. This is basically a problem of working fluid selection.

The electron internal energy results from the electron current passing through the potential drop and being randomized by collisions with heavy particles. For this reason it would be expected that the highest electron energy would be found ill the anode sheath, after the electrons have fallen through most of the potential drop. This is fortuitous, since it is precisely in this region that the highest ion production rate is wanted, to let the ions gain a maximum of kinetic energy by falling through the potential back toward the cathode jet.

However, some ions must be produced near the cathode attachment area. These ions must be accelerated downstream in the cathode jet against the axial electric field. This is accomplished by collisional transfer of momentum from the electrons which have obtained the momentum from $j \times B$ forces.

ION ACCELERATION

In the discussion to follow, the following definitions are applicable:

$|e|$ = charge on the electron
$E_r$ = radial electric field
$E_z$ = axial electric field
$u_I$ = radial ion velocity
$v_I$ = azimuthal ion velocity
$w_I$ = axial ion velocity
$B_r$ = radial magnetic field strength
$B_\theta$ = azimuthal magnetic field strength
$J_r$ = radial current density
$J_\theta$ = azimuthal current density (Hall Current density)
$J_z$ = axial current density
$\sigma$ = electrical conductivity
$P_o$ = ambient pressure at outer edge of anode sheath
$P_i$ = ambient pressure at inner edge of anode sheath
$\mu_o$ = permeability of vacuum
I = total electric current in the electric discharge (arc current)
$R_{as}$ = average radius of annular anode sheath
$n_I$ = number density of ions
u = radial velocity of plasma
$u_e$ = radial velocity of electrons
$w_e$ = axial velocity of electrons Momentum can be transferred to the ions from electric fields or from collisions with other particles. For convenience, the momentum exchange processes in a fully-ionized gas through which an electric discharge is passing shall be discussed.

Locally, the force on each ion is given by the following expressions:

$$\text{Axial: } F_z = |e|\{E_z + \mu_I B_{\theta - v_I} B_r - J_z/\sigma\} \quad 1$$

$$\text{Radial: } F_r = |e|\{E_r + v_I B_z - w_I B_\theta - J_r/\sigma\} \quad 2$$

$$\text{Azimuthal: } F_\theta = |e|\{w_I B_r - u_I B_z - J_\theta/\sigma\} \quad 3$$

If an electric discharge is established in a uniform axial magnetic field we shall call the region where the current flows downstream the "anode sheath" and the region where it flows upstream the "cathode Jet." If a cathode of maximum diameter $R_c$ is surrounded by an anode ring of diameter $R_A (R_A > R_c)$ we ask the questions:

1. Does the cathode jet expand out to meet the anode sheath?

2. Does the anode sheath contract in diameter to meet the cathode jet?

3, Do both (1) and (2) occur simultaneously?

Consider First the cathode jet. If the cathode jet is to expand outwardly, conservation of momentum states that the axial momentum of the jet must increase and the rotational momentum of the jet must increase. However, the local $(E + v \times B)$ axial and tangential electric fields are both in the wrong direction to accelerate the ions and the momentum must hence be transferred to them by electron collisions. This is a highly dissipative process, resulting in strong heating of the electrons. This increases the rates of entropy production over that caused by ion-electron drag in a purely dissipative plasma (no body force).

In the anode jet the situation is quite different. Both $E_z$ and $u_I B_\theta$ are in the positive z coordinate direction, thus helping to accelerate the ions axially. The only dissipative or entropy producting process is that associated with the electron-ion drag. Similarly, in the azimuthal direction the local electric field $u_I B_z$ aids the Hall currents in spinning up the ions. This allows the Hall currents to be smaller and thus dissipate less energy in spinning up the gas to the required velocity. These rather crude arguments indicate that if the discharge tends to operate at a minimum potential, then the current in the anode sheath would tend to move inward to meet the cathode jet, rather than vice versa.

Further strength is lent to this argument when the radial force balance on the anode sheath is investigated. Assuming that no radial force can exist on the anode sheath as a whole, an integral of the radial momentum equation gives the following relation:

$$P_o - P_i = \int J_\theta B_z dr - \int J_z B_\theta dr - \int J_\theta B_z dr = \frac{\mu_o I^2}{8\pi^2 R_{AS}^2} + (P_i - P_o) \quad 4$$

where $P_o - P_i$ = the pressure difference across the sheath.

$R_{AS}$ = average radius of the anode sheath. This equation indicates that Hall currents must exist in the anode sheath for it to maintain its radial equilibrium. The Hall currents can be induced, however, only if the anode sheath moves radially inwardly across the magnetic field lines, i.e., $$-J_\theta = \frac{\sigma B_z}{|e| n_I}\{(-J_r) + |e| n_I u\} \quad 5$$

or $$-J_\theta = \sigma \mu_c B_z \quad 5a$$

In the more general case where the solenoidal magnetic field diverges, rather than being uniform $$-J_\theta = \sigma(u_e B_z - w_e B_r)$$

From the above discussions we postulate a model for the device as follows when it is operating in a magnetic field that is initially purely axial and then, at some distance $(z > L)$ downstream, is made to diverge.

1. A uniform diameter cathode jet is established which carries only a small fraction of the injected mass flow rate.

2. An annulus of plasma is established off of the anode face. The injected mass is accumulated within this annulus. All of the discharge current initially passes through the annulus, either distributed fairly uniformly azimuthally or as a concentrated spoke, spinning aximuthally at a high velocity.

3. The average radius of this anode sheath decreases downstream. This causes the ions in the sheath to be accelerated slightly in the axial direction and to be spun up to high azimuthal velocities. The electrons are simultaneously heated, mainly by the ion-electron drag in the azimuthal direction, where the azimuthal electron motion is helping to spin up the ions.

4. At axial positions near the electrodes, and even some considerable distance downstream, a significant potential drop exists and must be supported between the cathode jet and anode sheath (can be over 50% of the potential difference across the electrodes).

5. The anode sheath eventually meets the cathode jet at z=L and the current path is completed. No discharge current flows at axial positions beyond this point, at which time the axial electric field in the cathode jet goes thru a zero.

6. At positions of z>L. the magnetic field acts like a magnetic nozzle. As the field diverges the ions are accelerated axially by two processes:

a. Conservation of angular momentum requires that as the jet radius increases, rotational ion energy must be transferred to axial and radial kinetic energy.

b. The high energy electrons tend to expand out of the nozzle ahead of the ions, thus setting up a positive axial electric field that accelerates the ions. In this manner, all of the energy of the particles in the beam can be converted into the kinetic energy of the ions. Obviously, some of this energy will reside in the radial and azimuthal velocity of the ions; however, a high percentage of the plasma beam momentum will be converted into axial motion. The mathematical details of working out the implications and performance potential of a device working with these postulated mechanisms is presented in the next section.

INTEGRALS OF THE MOMENTUM EQUATIONS

In the following discussion the following definitions are relevant:

$P$=plasma pressure
$P_{oc}$=pressure at outer edge of the cathode jet
$R_{cj}$=outer radius of cathode jet
$J_r$=radial current density
$J_z$=axial current density
$B_r$=radial magnetic field strength
$B_\theta$=azimuthal magnetic field strength
$B_z$=axial magnetic field strength
$\mu_o$=permeability of vacuum
r=radial coordinate
z=axial coordinate
s=dummy variable
I=total discharge current
d(vol)=volume element
dS=surface clement
$A_\theta$=vector potential
$\Psi$=scalar potential
$\omega_e=\sigma|B|/|e|n_I$ There are a few cases where the net electromagnetic force in an axisymmetric body can be computed without detailed knowledge of the distributions of current and magnetic field. In the general case, the momentum equations must be integrated simultaneously with continuity, energy, Ohm's laws, Maxwel's equations and the equations of state, The cases chosen here are such that the integrand (force-per-unit volume) can be put into the form of a divergence, by using Maxwell's equations and simplified momentum equations. These forces can be integrated in terms of total current, radius, and applied magnetic field.

Pressure Due to $J_zB_\theta$Pinch

Here the average pressure on the cathode is computed in terms of the current and radius of attachment. The equations used are a momentum equation $$p/dr=-J_zB_\theta.\ p(r=R)=P_{\sigma} \quad 6$$

an induction equation $$1/rd/dr(rB_\theta)=\mu_oJ_z.\ B_\theta(r=0)=0_1 \quad 7$$

a total current integral $$I=\int_o^R J_z(r)2\pi rdr. \quad 8$$

and a definition of average pressure $$P_{av}=\frac{1}{\pi R^2}\int_o^R P(r)2\pi rdr \quad 9$$

Combining the above reactions, it follows that independent of the distribution of $J_z$, the average cathode pressure is given by:

$$P_{av}=P_o+\frac{\mu_oI^2}{8\pi^2R^2} \quad 10$$

The pressure given by Eq. 10 will act on the cathode to give a thrust. This thrust force is given by $\mu_oI^2/8\pi$ and is independent of the distribution of the current density at the cathode, and of the size of the cathode attachment.

Thrust Due to $J_rB_\theta$ Pumping

The amount of thrust in an axially symmetric volume due to radial currents and induced azimuthal magnetic field can be evaluated in terms of the magnetic field distribution at the boundaries. This, in turn, call be evaluated from the total currents. The following relations are used:

$$\frac{1}{r}\ \frac{\partial}{\partial r}(rB_\theta)=\mu_oJ_z \quad 11$$

$$\frac{\partial B_\theta}{\partial z}=\mu_oJ_r \quad 12$$

From Eq. 12 it follows that $J_rB_\theta=-\partial/\partial z\ (B_\theta^2/2\mu_o)$ $$\text{Thrust}=\int_o^{R_{cf}}\int_{z_1(r)}^{z_2(r)}J_rB_\theta 2\pi rdzdr \quad 13$$

$$=\int_o^{R_{cf}}2\pi r\left[\frac{-B_\theta^2}{2\mu_o}\right]_{z1(r)}^{z2(r)}dr$$

$B_\theta$ can be found by integrating Eq. 11:

$$B_\theta(r,z)=\frac{1}{r}\int_o^r sJ_z(s,z)ds \quad 14$$

Equation 13 shows that thrust can be evaluated in terms of magnetic field and Eq. 7 shows that magnetic field depends only upon axial current. If:

(a) Current leaves cylindrical anode of radius $R_A$ (b) Current enters circular cathode of radius $R_c$ with uniform current density then $$\text{Thrust} = \frac{\mu_o I^2}{4\pi}\left(\tfrac{1}{4} + \ln\frac{R_A}{R_c}\right)$$

Torque Due to ($rJ_zB_r = rJ_rB_z$)

In an axially symmetric volume with radial and axial currents and magnetic fields, there will be a torque which occurs when the current crosses the magnetic field. To evaluate this torque, introduce the vector potential $A_\theta$.

$$B_r = -(\partial A_\theta/\partial z)B_z = (1/r)(\partial/\partial r)(rA_\theta) \quad 16$$

The quantity ($rA_\theta$) is constant along a magnetic field line. The torque-per unit volume is given by:

$$rJ_zB_r - rJ_rB_z = -J_r\frac{\partial(rA_\theta)}{\partial r} + J_z\frac{\partial(rA_\theta)}{\partial z} \quad 17$$

For the axially symmetric case, $\frac{\partial(rA_\theta)}{\partial\theta} = 0$, hence $$\begin{aligned}\text{Torque} &= -J\cdot V(rA_\theta)\\ &= -\nabla\cdot(rA_\theta J)\end{aligned} \quad 18$$

where $\nabla.J=0$ has been used. Upon integration over a volume R of surface S, outward normal n $$\int_R (\text{torque})d(\text{vol}) = \int_S (-rA_\theta)(J\cdot n)dS \quad 19$$

If $rA_\theta$ is constant at anode and cathode $$\begin{aligned}\text{Torque} &= I[(rA_\theta)_{anode} - (rA_\theta)_{cathode}]\\ &= I\int_{\text{cathode}}^{\text{anode}}\left[\frac{\partial(rA_\theta)}{\partial r}dr + \frac{\partial(rA_\theta)}{\partial z}dz\right]\\ &= \frac{I(\text{Magnetic Flux Between Cathode and Anode})}{2\pi}\end{aligned} \quad 20$$

Finally for a point cathode, and an average axial field $B_z$ through a circular anode of radius $R_A$, $$\text{Torque} = \tfrac{1}{2}BIR_A^2 \quad 21$$

Max Thrust Due to $J_{\theta Br}$

In an axially symmetric volume where $J_\theta$ is induced (by the Hall effect), the amount of axial force cannot be larger than for the case of a completely diamagnetic plasma. In this limiting case, the $J_\theta$ lies completely in the surface of the volume, and no magnetic fields exist inside the volume. The currents and magnetic field are computed as follows: Let $B-B_0+B_1$, where $B_0$ is the applied field due to external magnets and $B_1$ is the field due to induced currents within the volume. Outside of the plasma, $\nabla XB_1$ is zero, hence $B_1=\nabla\Psi$ is a scalar field. Since $\nabla.B_1=0$, then $$\nabla^2\Psi = 0 \text{ (outside of plasma)} \quad 22$$

Since $\bar{B}.\bar{n}=0$ at the plasma surface $$\partial\Psi/\partial n = -(B_0).n(\text{at plasma surface}) \quad 23$$

In solving the Laplace Eq. 22 with boundary condition of Eq. 23, the force is given by $$\text{Force} = -\int\int(B_0+\nabla\Psi)^2 ndS \quad 24$$

where $\bar{n}$ is an outward normal and S is the surface area of the plasma.

The same result can be obtained by the following method. Here we shall attempt to solve for the surface $J_\theta$ distribution for a particular plasma configuration shown in FIG. 1a. We use a $\theta$-Ohm's law (where $\Psi_e$ is the Hall parameter for electrons).

$$J_\theta = -\frac{\psi_e}{|B|}(J_zB_r - J_rB_z), \quad 25$$

and the induction equations $$\begin{aligned}&\frac{\partial B_r}{\partial z} - \frac{\partial B_z}{\partial r} = \mu_o J_\theta\\ &\frac{1}{r}\frac{\partial}{\partial r}(rB_r) + \frac{\partial B_z}{\partial z} = 0\end{aligned} \quad 26$$

In Eq. 25 the coefficient $\Psi_e/|B|$ does not depend upon magnetic field, since $\Psi_e$ is proportional to $|B|$. We assume $J_z$ and $J_r$ are known, based upon visual observations of the operation of the accelerator. It appears that $J_r=0$, and $J_z$=total current divided by cross sectional area of the anode jet ($2\pi R_a\delta$). Thus Eq. 25 becomes $$J_\theta = -\left[\frac{\psi_e}{|B|}\frac{I_A}{2\pi R_A\delta}\right]B_r \quad 27$$

From Eq. 27 we see that $B_r$ (and not $B_z$) is important for calculating $J_\theta$. We can use the integral solution of Eq. 26 which assumes no magnetic material is present:

$$\left.\begin{aligned}&B_r(r,z) = \frac{\mu_o}{2\pi r}\int\int G(r,s;z-t)J_\theta(s,t)dsdt\\ &\text{where}\\ &G(r,s;z-t) = \int_o^\pi\frac{rs(z-t)\cos\phi d\phi}{[r^2-2rs\cos\phi+s^2+(z-t)^2]^{3/2}}\end{aligned}\right\} 28$$

When applying Eq. 28 we use Eq. 27 for the value of $J_\theta$ in the region of the anode jet, and the known $J_\theta$ in the electromagnet. Thus, Eq. 27 becomes:

$$J_{\theta,Hall} = -\frac{\psi_e}{|B|}\frac{I_A}{2\pi R_A\delta}\frac{\mu_o}{2\pi r}X \quad 29$$

$$\left\{\begin{aligned}&\int\int_{\text{coil}} G(r,s;z-t)J_{\theta,coil}(s,t)dsdt\\ &+\int\int_{\text{anode jet}} G(r,s,z-t)J_{\theta,Hall}(s,t)dsdt\end{aligned}\right\}$$

Eq. 29 is an integral equation for the Hall current in the anode jet.

Exact solutions are not available for Eq. 29. An approximate solution bas been obtained by lumping the distributed Hall currents $J_\theta$ into concentrated currents. We will refer to this technique (FIG. 18) as the "wire model." The Hall currents are replaced approximately by hoop currents in a set of wires. The error of the lumping has been estimated, by changing the number of wires-per-unit length of the anode jet, and shown to be small.

The solution found was for infinite conductivity, or more precisely $\lambda \rightarrow \propto$ where $$\lambda = \frac{\mu_o \psi_e I_A}{|B|(2\pi)^2 R_A} = \frac{\mu_o \sigma I_A}{|e| n_I (2\pi)^2 R_A}$$

This is the limit of a completely diamagnetic plasma.

Figure 1B:
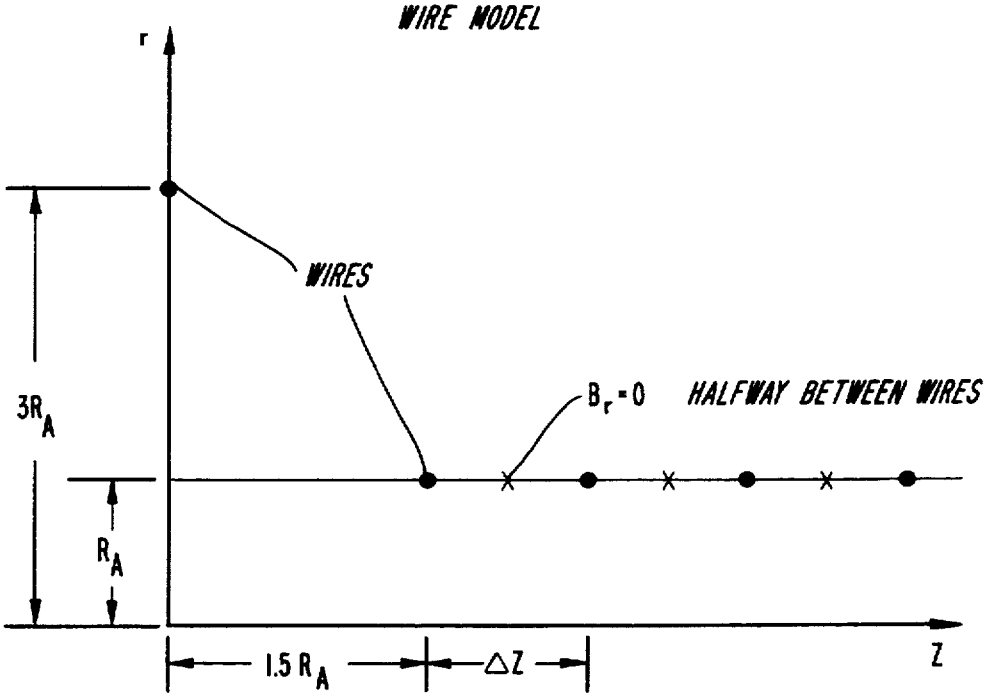
FIG. 1b shows a "wire model" of the representation of FIG. 1a for induced field analysis.

To solve the wire model, the current density is concentrated into a set of wires (see FIG. 1B). Thus, the wire for the electromagnet coil bas a current $I_c$, where $I_c$ is equal to the number of turns times the current in one conductor. The wires which carry the Hall currents in the anode jet carry a current of $J_\theta$, Hall.$\nabla z.\delta$. The integral Eq. 29 is thus replaced by a set of simultaneous algebraic equations. In the infinite $\lambda$ case, which corresponds to infinite conductivity, $B_r=0$. Thus, $(B_r)_j=0$, where j stands for one of the points shown in the wire model of FIG. 1B.

$$O = G(R_A, R_o, z_j)I_e + \sum_{i=1} G(R_A, R_A, z_j - z_i)I_i \quad (31)$$

Figure 2:
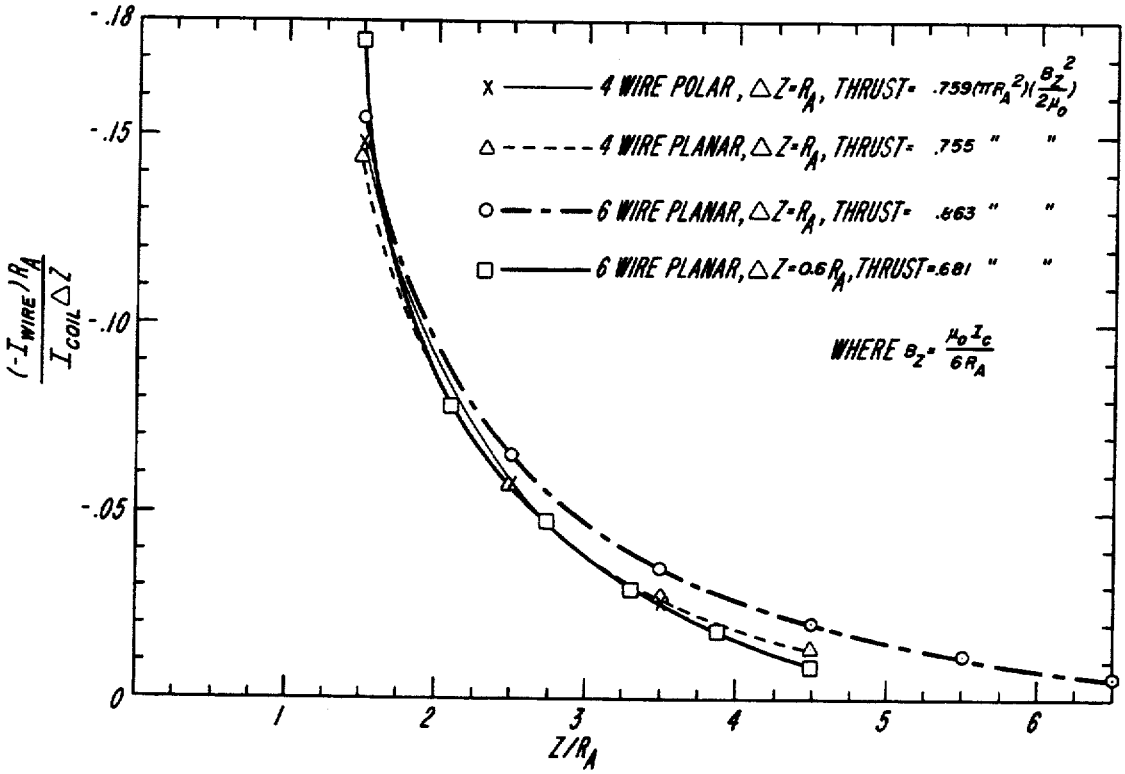
FIG. 2 shows a graph of computed Hall wire currents and thrusts.

Some solutions of Eq. 31 are shown in FIG. 2. The Kernel function LG defined in Eq. 28 can be computed in terms of elliptic integrals.

$$G(r, s; t) = \frac{2rst}{[(r+s)^2 + t^2]^{3/2}} \quad \frac{(2-k^2)E(k) - 2(1-k^2)(K(k)}{k^2(1-k^2)} \quad (32)$$

where E and K are elliptic integrals and $K^2=4rs/\{(r+s)^2+t^2\}$. To simplify the computations, a function $G_{planar}$ based upon a flat geometry was used $$G_{planar}(r, s; t) = \frac{4r^2st}{[(r-s)^2 + t^2][(r+s)^2 + t^2]} \quad (33)$$

This is a good approximation to the Kernel function near the coil. The electromagnetic thrust can be computed either from the integral of the $J_\theta B_r$ forces in the jet or by the reaction on the coil.

$$\begin{aligned} \text{Thrust} &= \iint_{\text{coil}} J_{\theta,coil} B_r 2\pi r dr dz \\ &= - \iint_{\text{anode jet}} J_{\theta,Hall} B_r 2\pi r dr dz \end{aligned} \quad (34)$$

For the example of FIGS. 1A and 1B, the integration was made over the coil. The thrust is approximately 80 percent of the product of the cross-sectional area of the anode jet times the magnetic pressure which would exist along the centerline if there were no Hall currents. This is probably an upper limit of the possible thrust.

When the induced magnetic field due to the Hall currents is small compared to the applied magnetic field, the axial force on the magnets (i.e. thrust) can be expressed approximately as:

$$\text{Axial thrust } B_A I(R_A - R_e^1) \quad (35)$$

where

I=arc discharge current $B_A$=magnetic field strength at the anode $R_A$=radius of anode $R_e^1$=effective radius of virtual cathode (less than $R_A$)

This is a semi-empirical expression

Further Theory of Operation

When electrical discharges are operated with an axisymmetric electrode configuration and solenoidal magnets, electromagnetic forces react on the electrode system and magnet coil. This force is a maximum when the central electrode is the cathode. Since momentum must be conserved, an equal and opposite force must be transferred to some working fluid which may consist of:

(1) Material injected through the electrode system, (2) Ambient material entrained into the discharge, (3) Material eroded from insulators, and/or (4) Material eroded from electrodes.

The electromagnetic force transferred to the gas call be expressed as follows:

$$F_{EM} = \frac{\mu_o I^2}{4\pi}\left(\frac{3}{4} + \ln\frac{R_A}{R_c}\right) + B_A I(R_A - R_c') \quad (36)$$

where

I=current in the electric discharge.

$B_A$=average strength of an applied solenoidal magnetic field in the plane of the anode attachment region.

$R_A$=inner radius of the anode.

$R_C$=outer radius of the cathode.

$R_c^1$="virtual" outer radius of the cathode-usually the radius of the cathode jet in the plane of the anode attachment zone.

$\mu_o$=permeability of free space: $4\pi \times 10^{-7}$ (MKS).

This force is transmitted directly to the ions and electrons of the working fluid that passes through the discharge. Collisions between atoms and electrons and/or atoms and ions may transfer some of this force to the neutral particles, especially at higher pressures. Power is consumed by the discharge in order to accomplish this and an expression for the power consumed is shown below when only one species is present in the working fluid:

$$P = IV = \frac{F_{EM}^2}{2m_I} + m_I\{V_r + V_D^1 + \Sigma V_{Ii}\}\frac{|e|}{m_I} + P_A + P_k + (m - m_I)\Delta h_g + P_r \quad (37)$$

where:

$P_r$=Bremsstrahlung radiated power.

V=potential drop across the electrodes.

m=mass flow rate injected through arc chamber.

$\nabla h_g$=enthalpy increase of unionized gas.

e=charge on the electron.

$V_D^1$=fraction of dissociation energy/ion.

$\Sigma_i V_{Ii}$=ionization energy for atom ionized to the ith level.

$m_I$=mass of the ion.

$V_r$=voltage drop associated with line radiation in producing an ion.

$P_A$=power transferred to anode.

$P_k$=power transferred to cathode.

$m_1$=mass flow rate of ions.

As mentioned in the previous section the power consumed is a strong function of the mass flow rate of ions and will go through a minimum as a function of the ion flux rate, $m_I$, if ionization and acceleration are occur-ring in the same regions of space and accomplished with the same electrical discharge. Let the ion flux rate at which this minimum occurs be $(m_I)_{cr}$. Then, $$(m_I)_{cr} = \frac{F_{EM}}{\left\{\frac{2|e|}{m_I}\left(V_r + V_D^1 + \sum_i (V_I)_i\right)\right\}^{\frac{1}{2}}} \quad 38$$

The basic mechanism by which the discharge achieves the desired ion production rate ($m_1$) is by volume ionization of atoms by electron impact changed through adjustment of the electron temperature. When the discharge is "starved" (insufficient flow rate of material with the lowest first ionization potential) the discharge usually increases in volume, the voltage across the discharge increases, and the electron temperature increases. If more than one species of atoms is present in the material being fed through the anode, the higher electron temperature may initiate first ionization of a second species. If only one species is present and it is not hydrogen, then the increased electron temperature may initiate second ionization of that material. Alternatively, the higher the electron temperature will increase the heat flux rate to the anode attachment spot. The heat flux rate may go high enough to cause evaporation of anode material. The discharge may then ionize this material and inject it into the beam. A fourth eventuality may occur if the ambient pressure of some substance is high enough to ensure numerous electron atom collisions within the volume encompassed by the discharge. The volume encompassed by the discharge may increase by a large factor and the discharge may ionize the ambient material and recirculate it in the tank. All of these modes of operation have been observed in studies of space prpulsion engines.

The processor may be "starved" in a number of ways:

(i) The discharge current can be increased.

(ii) The strength of the applied magnetic field can be increased.

Figure 6:
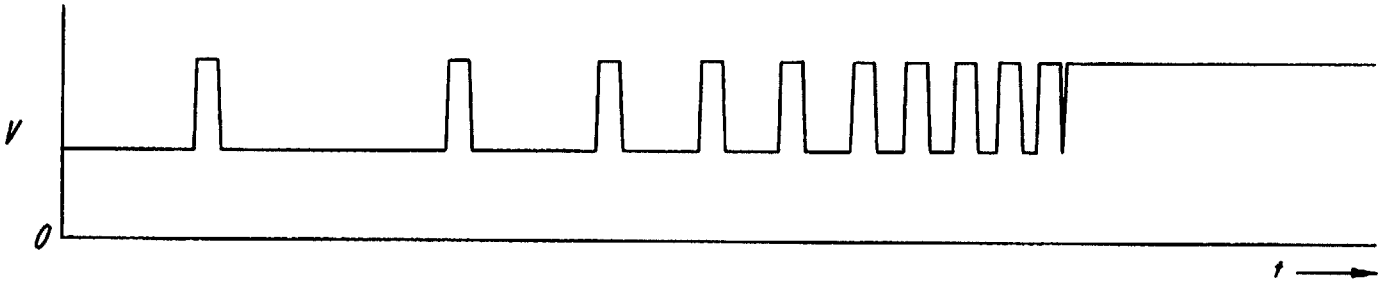
FIG. 6 shows a graph of voltage versus time for dual mode operation.
Figure 7A:
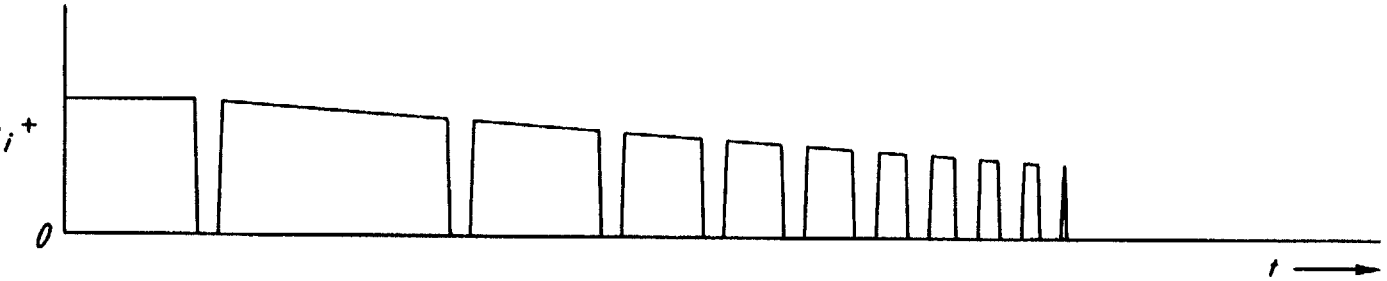
FIG. 7a shows a graph of mass flow rate versus time for singly ionized Lithium.
Figure 7B:
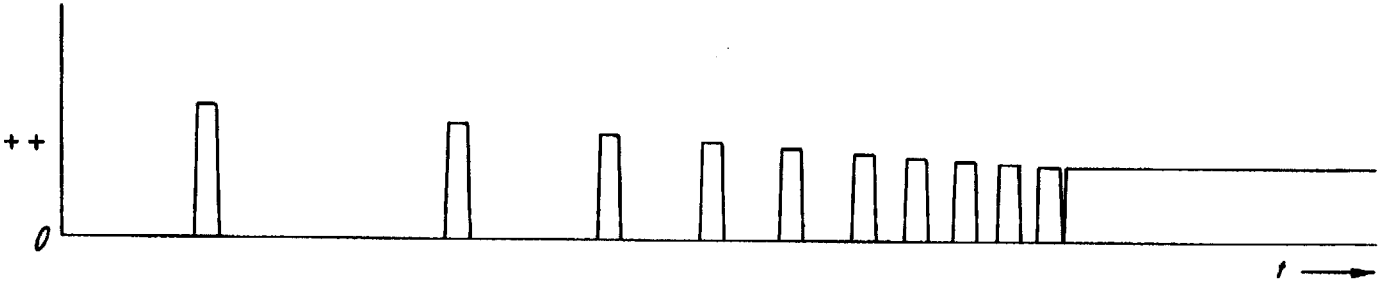
FIG. 7b shows a graph of mass flow rate versus time for doubly ionized Lithium.

(iii) The mass flow rate of working fluid can be decreased. If any one of these changes is effected while an engine is running in an unstarved mode, the processor responds in a unique manner. To be specific, assume that the processor is operating with lithium vapor as the working fluid and that the unstarved mode of operation is represented by an adequate supply of litium singly ionized atoms. If the mass flow rate is reduced gradually, then the response of the processor is shown schematically in FIG. 6. Pulses of doubly ionized lithium ions are generated periodically accompanied by a voltage pulse. The frequency of these pulses increases as the mass flow rate is decreased until at some mass flow rate the processor ejects only double ionized lithium and the voltage remains constant at the upper level. When the processor is operating in the transition regime the between these two levels, operation will be called dual mode operation. (See FIGS. 6,7a,7b) The ions and neutral gas particles can be coupled through collisions if the gas density is high. When the gas density is low they can be completely uncoupled, which we assume here. Hence:

$$F = m_I(v_I) + (m - m_I)(v_g) \quad 39$$

Since $$m_{cr} = m_I = F_{EM}/v_{cr} \text{ and } v_g >> v_I \quad 40$$

We can identify $$v_I = v_{cr} \quad 41$$

The minimum voltage hypothesis thus leads to the following predictions:

(1) A minimum amount of mass flow rate $m_{cr}$ must be available to the discharge:

$$(m_I)_{cr} = F_{EM}/v_{cr} \quad 42$$

(2) The exhaust velocity of the ions, $v_{cr}$, will be uniform and constant over wide ranges of operating conditions at:

$$v_{cr} = \sqrt{\frac{2|e|}{m_I}\left(\sum_i V_{Ii} + V_D' + V_r\right) - 2\Delta h_g} \quad 43$$

(3) The potential drop across the electrodes of the discharge will be:

$$V = \frac{P_A + P_N}{1} + \left\{\frac{\mu_o I}{4\pi}\left(\frac{3}{4} + \ln\frac{R_A}{R_C}\right) + B(R_A - R_c')\right\} v_{cr} + (m - m_I)\frac{\Delta h_g}{I} \quad 44$$

Figure 4:
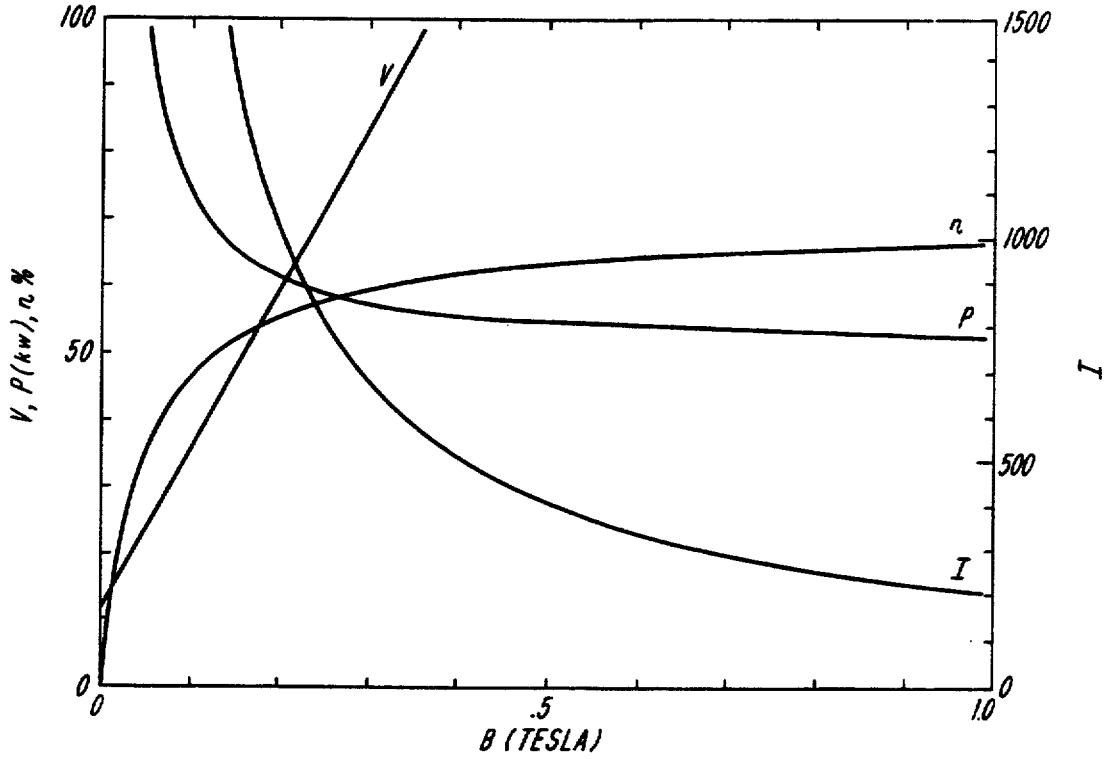
FIG. 4 shows the performance characteristics of the magnetoplasmadynamic source when $SiH_4$ is the silicon source material.
Figure 5:
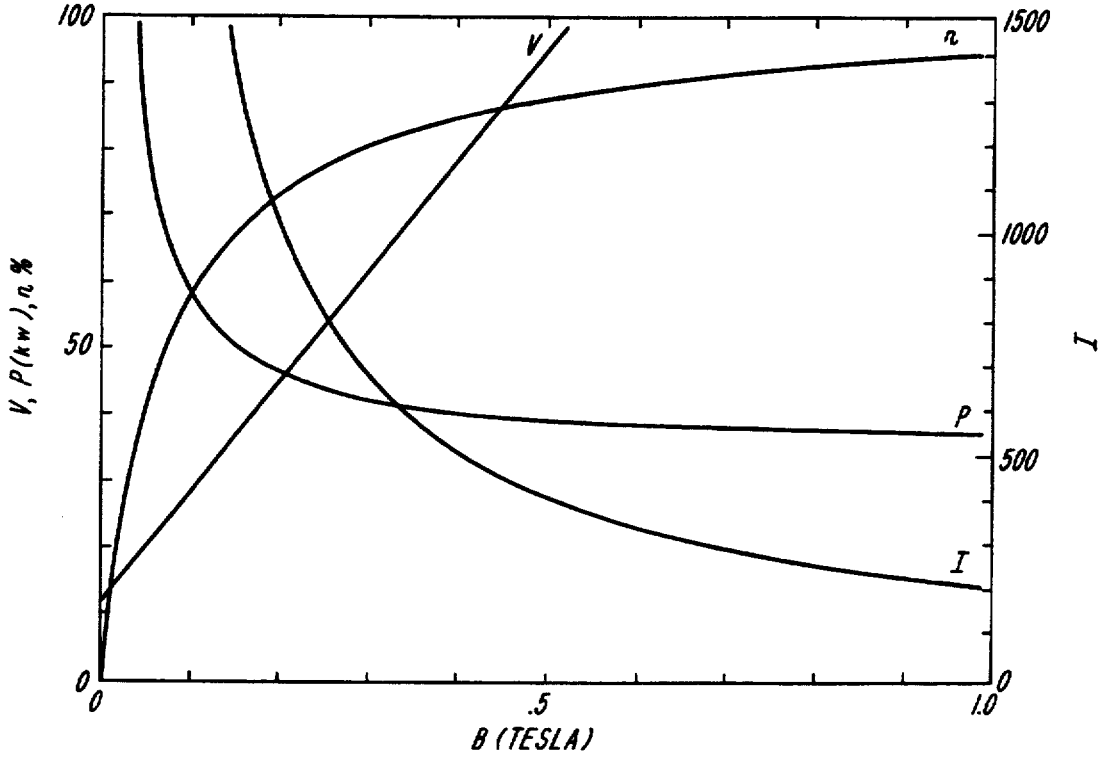
FIG. 5 shows the performance characteristics of the magnetoplasmadynamic source when the silicon source material is silicon per se.

Using some simplifying assumptions, these equations have been evaluated for a processor that singly ionizes silicon atoms. The results of these calculations are shown in FIGS. 3, 4 and 5 and associated data is displayed in respective tables 1, 2 and 3.

TABLE 1

Figure 3:
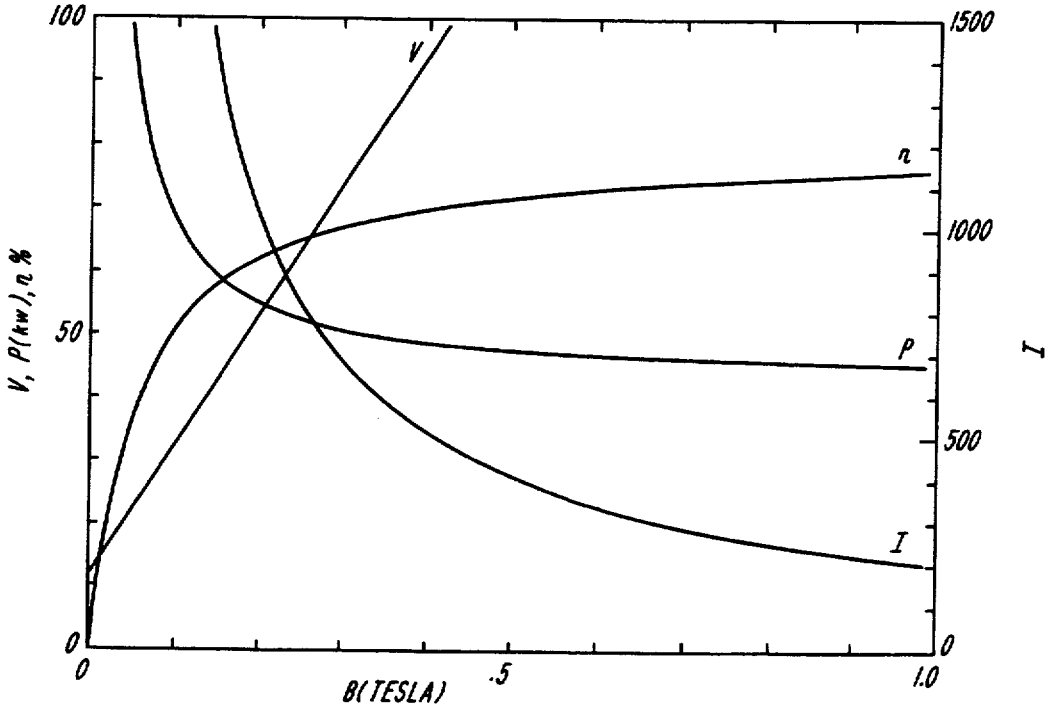
FIG. 3 shows the performance characteristics of the magnetoplasmadynamic source when $SiCl_4$ is the silicon source material.

Performance characteristics of the Magnetoplasmadynamic source (see FIG. 3)

| | |
|---|---|
| Silicon Source Material = | $SiCl_4$ |
| Anode radius (m) = | 0.050 |
| Cathode Radius (m) = | 0.005 |
| Substrate Radius (m) = | 0.150 |
| Anode Rad.-Virtual Cathode Rad. (m) = | 0.020 |
| Deposition Rate (micron/sec) = | 3.000 |
| At B = .25 Tesla: | |
| Approx. Substrate Temperature (°K.) = | 1569.190 |
| Voltage = | 63.674 |
| Current = | 820.870 |
| Power (kw) = | 52.268 |
| Thermal Efficiency = | 0.650 |
| Power Loss to Cathode = | 3.530 |
| Power Loss to Anode = | 6.299 |
| Volume Power losses = | 8.472 |
| Mass Flow Rate (mgm sec), silicon = | 491.973 |
| Mass Flow rate (mgm/sec), Hydrogen = | 0.000 |
| Mass Flow Rate (mgm/sec), Chlorine = | 2484.355 |
| Power in Spin (kw) = | 1.887 |
| Power in Axial Velocity (kw) = | 15.097 |
| Power in Ionization Energy (kw) = | 16.984 |
| Pressure on Substrate (Torr) = | 4.396 |
| Minimum Arc Chamber Pressure (Torr) = | 42.164 |
| Maximum Arc Chamber Pressure = | 111.224 |
| Max. Silicon Partial Press. in Arc Chmbr. = | 22.245 |

TABLE 2

Performance characteristics of the Magnetoplasmadynamic Source (see FIG. 4)

| | |
|---|---|
| Silicon Source Material = | $SiH_4$ |
| Anode radius (m) = | 0.050 |
| Cathode Radius (m) = | 0.005 |

TABLE 2-continued

| | |
|---|---|
| Substrate Radius (m) = | 0.150 |
| Anode Rad.-Virtual Cathode Rad. (m) = | 0.020 |
| Deposition Rate (micron/sec) = | 3.000 |
| At B = .25 Tesla: | |
| Approx. Substrate Temperature (°K.) = | 1569.190 |
| Voltage = | 71.938 |
| Current = | 820.870 |
| Power (kw) = | 59.052 |
| Thermal Efficiency = | 0.575 |
| Power Loss to Cathode = | 3.530 |
| Power Loss to Anode = | 6.299 |
| Volume Power Losses = | 15.25 |
| Mass Flow Rate (mgm/sec), Silicon = | 491.973 |
| Mass Flow rate (mgm/sec), Hydrogen = | 70.627 |
| Mass Flow Rate (mgm/sec), Chlorine = | 0.000 |
| Power in Spin (kw) = | 1.887 |
| Power in Axial Velocity (kw) = | 15.097 |
| Power in Ionization Energy (kw) = | 16.984 |
| Pressure on Substrate (Torr) = | 4.396 |
| Minimum Arc Chamber Pressure (Torr) = | 18.332 |
| Maximum Arc Chamber Pressure = | 48.357 |
| Max. Silicon Partial Press. in Arc Chmbr. = | 9.671 |

Performance characteristics of the Magnetoplasmadynamic source (see FIG. 5)

| | |
|---|---|
| Silicon Source Material = | Silicon. |
| Anode radius (m) = | 0.050 |
| Cathode Radius (m) = | 0.005 |
| Substrate Radius (m) = | 0.150 |
| Anode Rad.-Virtual Cathode Rad. (m) = | 0.020 |
| Deposition Rate (micron/sec) = | 3.000 |
| At B = .25 Tesla: | |
| Approx. Substrate Temperature (°K.) = | 1569.190 |
| Voltage = | 53.353 |
| Current = | 820.870 |
| Power (kw) = | 43.796 |
| Thermal Efficiency = | 0.776 |
| Power Loss to Cathode = | 3.530 |
| Power Loss to Anode = | 6.299 |
| Volume Power losses = | 0.000 |
| Mass Flow Rates (mgm/sec), Silicon = | 491.973 |
| Mass Flow Rates (mgm/sec), Hydrogen = | 0.000 |
| Mass Flow Rate (mgm/sec), Chlorine = | 0.000 |
| Power in Spin (kw) = | 1.887 |
| Power in Axial Velocity (kw) = | 15.097 |
| Power in Ionization Energy (kw) = | 16.984 |
| Pressure on Substrate (Torr) = | 4.396 |
| Minimum Arc Chamber Pressure (Torr) = | 17.143 |
| Maximum Arc Chamber Pressure = | 20.223 |
| Max. Silicon Partial Press. in Arc Chmbr. = | 20.223 |

GENERATION OF THE CONCEPT OF AN ELECTROMAGNETIC THROAT IN AN ELECTROMAGNET NOZZLE

Fundamental changes occur in the flow field of a gas when the Mach number goes from subsonic to supersonic. This is most easily characterized by studying the flow of a gas in a channel of varying cross-section. The expression relating the change in cross sectional area of the Mach number is:

$$dM = M\frac{\left(1+\frac{\gamma-1M^2}{2}\right)}{M^2-1}\frac{dA}{A}$$

where $$M = m/a$$

$$a = \sqrt{\gamma RT}$$

$\gamma$=ratio of specific beats
R=gas constant
T=temperature of the gas
A=cross-sectional area of the channel Three regimes are defined:

M<1 subsonic dA negative
M=1 sonic dA zero
M>1 superxonic dA positive

An equation similar to eq. 45 can be derived for the flow of a single species of charged particles:

$$dM = \frac{\frac{e}{mu_{cr}^2}d\phi}{M-\frac{1}{M^\gamma}}$$

where e=charge of particle
m=mass of particle
$u_{cr}$="sonic" velocity of particle
$\phi$=electric potential Again, three regimes can be defined:

M<1 subsonic ed$\phi$ negative
M=1 sonic d$\phi$ zero
M>1 supersonic ed$\phi$ positive The important conclusion to be drawn here is that the electric potential plays the same role in electromagnetic flow as the channel area does in gas dynamic flow. The electric field must go through a zero in order for the charged particles to accelerate to a high supersonic velocity. The position where this occurs is defined as the electromagnetic throat.

PLASMA PHYSICS AND SCALING CONSIDERATIONS

In deriving 36–46 a number of assumptions about the plasma physics have been made. Some of the most relevant are listed below:

a. All of the material injected through the anode is ionized ($m=m_{cr}$).

b. All of the ionized material in the anode sheath and cathode jet is magnetically confined within a "magnetic nozzle."

These assumptions have an implicit interaction with regimes of operation that have been empirically determined, such as size and power level for steady, efficient operation. An attempt is made in this section to "quantify" some of these empirically determined regimes.

CURRENT CARRYING CAPACITY OF A MAGNETICALLY CONFINED PLASMA

The radial momentum equation for magneto-plasma dynamics has four dominant terms as follows:

$$\partial p/\partial r = P\,(v^2/r) + j\theta B_2 - j_2 B\theta$$

Simply stated, the three terms on the right establish a radial pressure gradient.

($pv^2/r$) defines a centrifugal force term and contributes a positive gradient to the pressure.

$j\theta B_2$ defines a confining force generated by the plasma diffusing radially outward across the applied magnetic field. The azimuthal current, $j\theta$, is the Hall current generated by this diffusion process. This term contributes a negative pressure gradient.

$j_z B\theta$ defines the well-known pinch force term for confining the plasma and contributes a negative pressure gradient.

Figure 11:
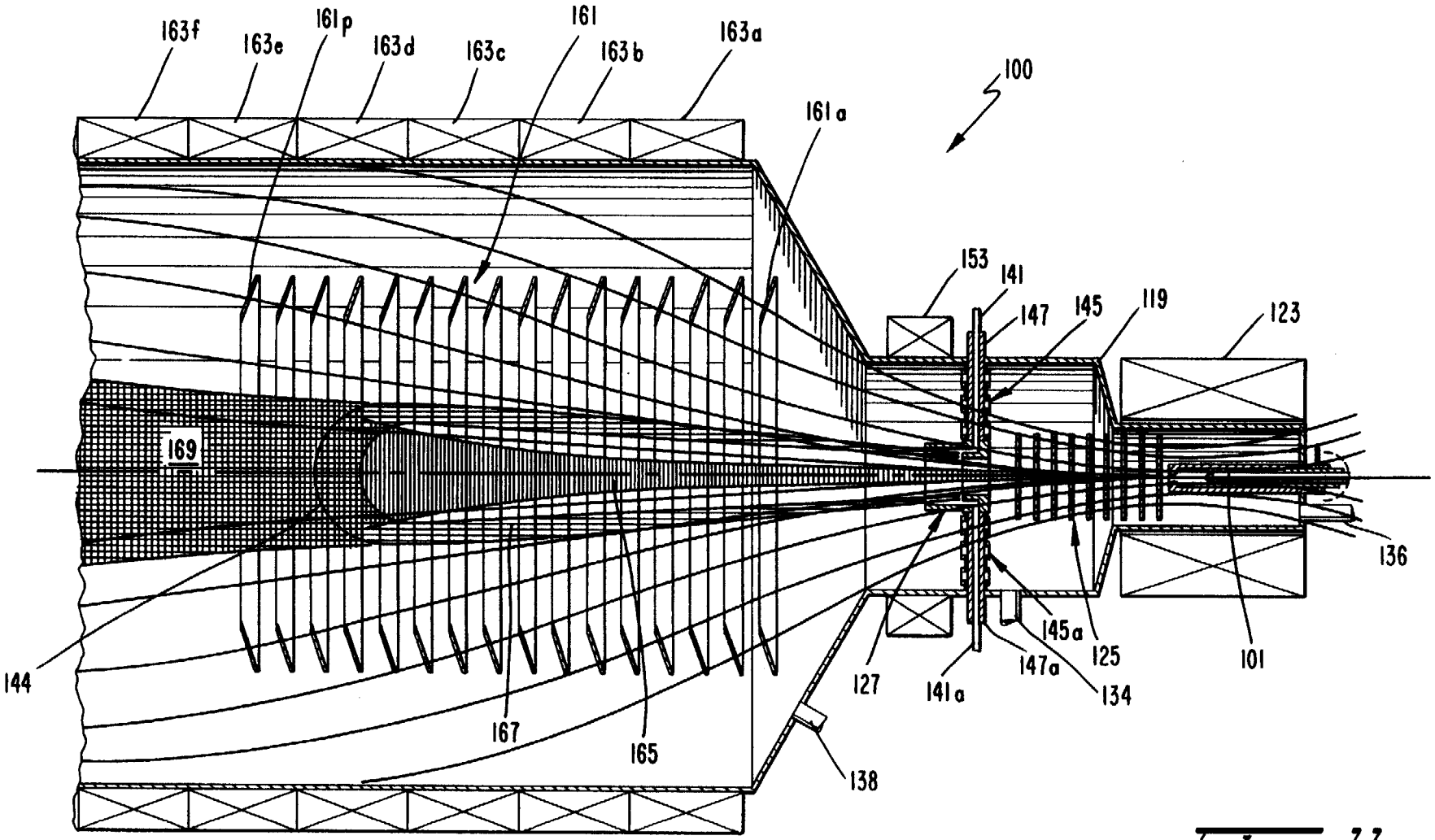
FIG. 11 shows a side schematic representation of a further embodiment of magnetoplasmadynamic processor.
Figure 12:
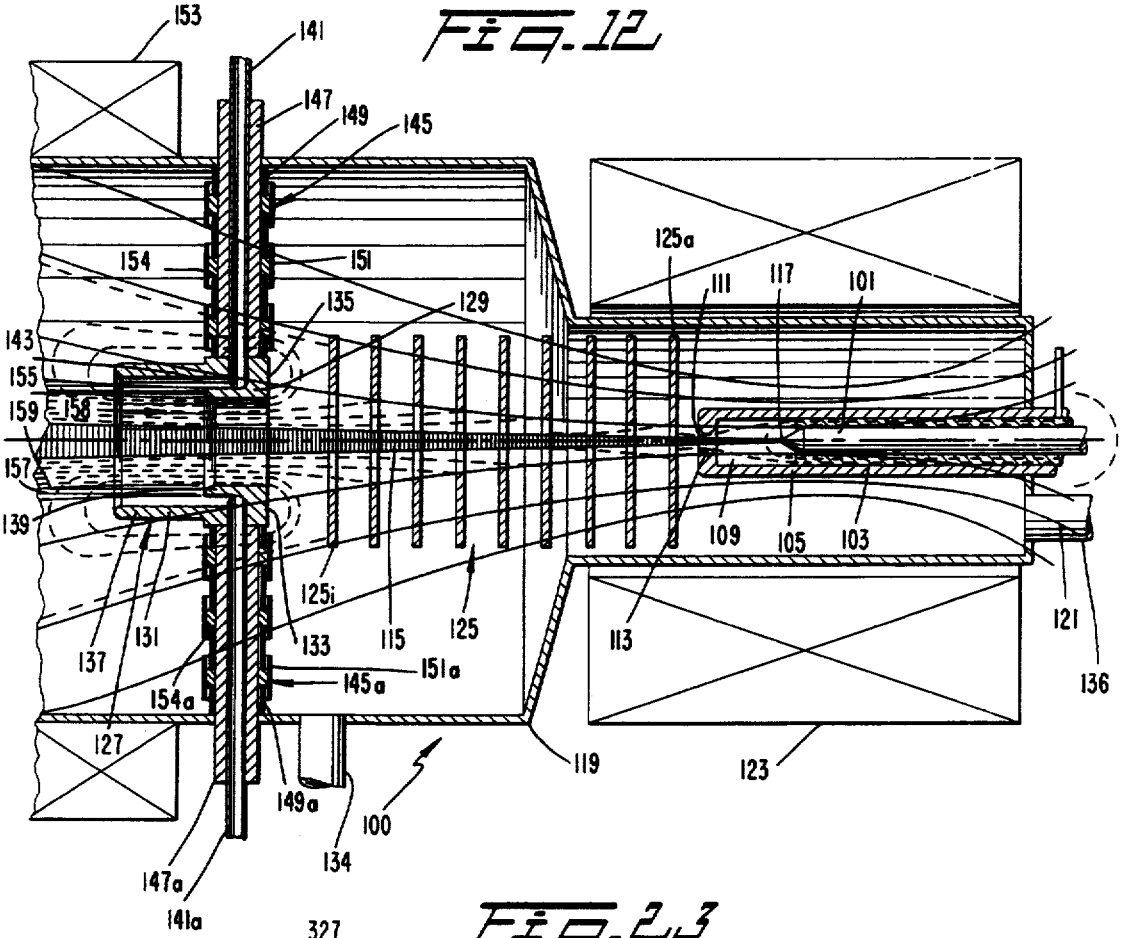
FIG. 12 shows a cross sectional view thru the line 12—12 of FIG. 13
Figure 16:
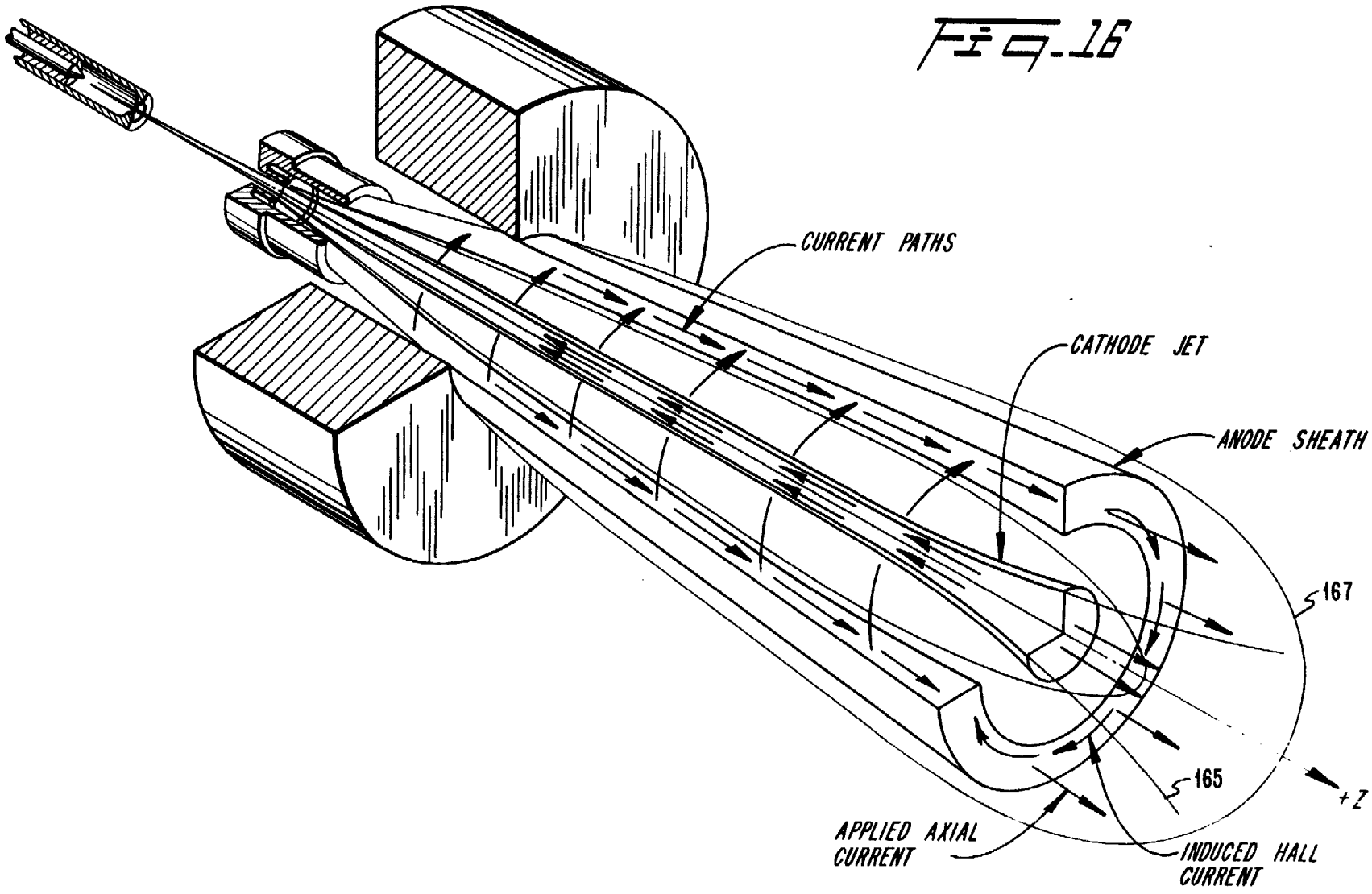
FIG. 16 shows a schematic representation of electric current paths.

Some relatively simple modeling can be used in order to obtain a specific relation among these terms in an axisymmetric cathode jet shown schematically in FIGS. 11, 12 and 16

$$\text{(i) } jz = \frac{-I}{A_o} \text{ (constant axial current density)} \tag{48}$$

$$\text{(ii) } B_\theta = \frac{-\mu_o I r}{2A_o} \text{ (results from } I\text{)} \tag{49}$$

$$\text{(iii) } v = \omega r \text{ (constant angular velocity)} \tag{50}$$

$$\text{(iv) } j\theta = \frac{-\sigma w_c r}{2r_o^2} \frac{d}{d_z}(r_o^2 B_z)(\text{"Classical" diffusion}) \tag{51}$$

In the above equations the symbols are defined as follows:

$p$ = plasma pressure
= $p(r, z)$
$\rho$ = plasma density
= $\rho(r, z)$
$v$ = azimuthal velocity
= $v(r, z)$
$\omega$ = angluar velocity
= $\omega(z)$
$j_\theta$ = azimuthal current density
= $j_\theta(r, z)$
$j_z$ = axial current density
= $j_z(z)$
$B_\theta$ = azimuthal magnetic field strength
= $B_\theta(r, z)$
$B_z$ = axial magnetic field strength
= $B_z(z)$
$r$ = radial co-ordinate in an axi-symmetric cylindrical co-ordinate system.
$A_o$ = cross-sectional area of confined plasma
= $A_o(z)$
= $\pi r_o^2$
$I$ = axial current carried by the plasma
= constant
$\mu_o$ = permittivity of the free space
= $4_\pi - 10^{-7}$ (*MKS*)
= constant
$w_c$ = axial velocity of electrons
= $w_c(z)$
$\sigma$ = electrical conductivity of the plasma
= $\sigma(z)$
$z$ = axial co-ordinate in an axi-symmetric cylindrical co-ordinate system.

Equations 48 through 51 can be introduced into equation 47. The relation that results from this substitution is shown below:

$$\frac{\partial p}{\partial r} = \rho\omega^2 r - \frac{\sigma w_c B_z r}{2r_o^2} \frac{d}{dz}(r_o^2 B_z) - \frac{\mu_o I^2 r}{2\pi^2 r_o^4} \tag{52}$$

To consistent with the assumptions concerning the radial distribution of axial and azimuthal current the radial pressure gradient must be assumed small so the the centrifugal force balances the electromagnetic confining forces. This results in the relation:

$$\frac{\mu_o I^2}{2\pi^2} + \frac{\sigma w_c r_o^2 B_z}{2} \frac{d}{dz}(r_o^2 B_z) = \rho\omega^2 r_o^4. \tag{53}$$

The next step is to obtain some relation between the gas density and the current carrying capacity of the column. Since the plasma is approximately neutral:

$$n_l = n_c$$

hence: $I = |e|\pi r_o^2 n_e(w_l - w_e)$
Since the current is negative $$n_l \simeq n_c = \frac{I}{\pi r_o^2 |e|(w_c - w_l)} \tag{55}$$

Substituting this relation into equation 53 we get:

$$\frac{\mu_o I^2}{2\pi^2} - \frac{m_o r_o^2 I}{\pi |e|(w_c - w_l)} + \frac{\sigma w_c}{4} \frac{d}{d_z}(r_c^2 B_z)^2 = 0 \tag{56}$$

where $v_o = \omega r_o$ $w_l$ = axial velocity of ions.
(+*ve* due to mass flow away from the cathode)
= $w_{l(z)}$.

This equation can be written as:

$$I^2 - bI + C = 0$$

where $$b = \frac{2\pi m_o v_o^2}{|e|\mu_o(w_c - w_l)}$$

$$c = \frac{\pi^2 \sigma w_c}{2\mu_o} \frac{d}{dz}(r_o^2 B_z)^2$$

Both b and c are positive quantities. The solution to this quadratic relation is:

$$I = \frac{b \pm \sqrt{b^2 - 4c}}{2} \tag{58}$$

hence;

$$b > I > (b/2)$$

or $$(b/2) > I > 0$$

and $$\frac{d}{dz}(r_o^2 B_z)^2 \leqq \frac{2m_o^2 v_o^4}{\mu_o |e|^2 \sigma w_c (w_c - w_l)^2} \tag{61}$$

Consistent with the observation that $$\frac{m_o v_o^2}{2} = |e| V_l \tag{62}$$

the reference current can be written as $$I_{ref} = b = \frac{4\pi V_l}{\mu_o(w_e - w_l)} \quad 63$$

In order to obtain the minimum value for the current, the electron axial diffusion velocity must be made as high as possible. This would be close to "sonic" speed, hence:

$$(w_e - w_l)_{max} \simeq \sqrt{\frac{1.67kT_e}{m_e}} \quad 64$$

The electron temperature should be held below 6000° K. in order to minimize ionization of ambient chlorine or hydrogen atoms. Using the ionization potential for silicon, we get $$I_{ref} = \frac{4\pi \times 8.12}{4\pi \times 10^{-7} \times \sqrt{\frac{1.67 \times 1.38 \times 10^{-23} \times 6000}{}}}$$

$$= 208 \text{ amps}$$

Using the upper branch of the solution to equation 57 the minimum arc current should be between 100 and 200 amperes, depending upon the amount of diffusion across the applied magnetic field.

Further insight to this problem may be obtained by considering the case when no diffusion occurs across the applied magnetic field lines. Since spin is induced by the discharge current crossing the applied magnetic field lines, there will be no gas spin, leaving only the pressure gradient to balance the pinch forces. This gives.

$$p_{av} = \frac{\mu_o I^2}{8\pi^2 r_o^2} \quad 65$$

$$I = n_e w_e |e| \pi r_o^2$$

$$= \frac{p_{av}}{2} \frac{w_e |e| \pi r_o^2}{kT}$$

Combining these relations $$\frac{2kTI}{|e|\pi r_o^2 w_e} = \frac{\mu_o I^2}{8\pi^2 r_o^2} \quad 66$$

$$I = \frac{16\pi kT}{\mu_o |e| w_e}$$

Again, if the electron drift velocity $w_e$ approaches sonic speed, a minimum useable current can be calculated. This becomes.

$$I_{min} = \frac{16\pi m_e}{\gamma \mu_o |e| M} \sqrt{\frac{\gamma kT}{m_e}} = \quad 67$$

$$\frac{4 \times 9.1 \times 10^{-31}}{1.67 \times 10^{-7} \times 1.6 \times 10^{-19}} \sqrt{\frac{1.67 \times 1.38 \times 10^{-23} \times 6000}{9.1 \times 10^{-31}}}$$

$$= 53.1 \text{ amperes}$$

when the Mach) number, M, approaches unity. The two expressions for the minimum current will approach each other as $$4\,kT_e \rightarrow |e| V_I$$

Equation 58 predicts a low current solution exists with the current range $$\frac{4\pi V_l}{\mu_o(w_c - w_l)} > I > o \quad 69$$

Interesting enough, low current Hall Current Accelerators have been operated and results reported, among others, by Hess of NASA Langley and Meyerand of United Aircraft Corp. Typically these devices operate at 1–10 amperes of current and voltages of several hundred volts. They operate at low pressure (microns) and some have heated cathodes for electron sources. Ion production is due to high energy, non-thermal electrons, hence all species will be ionized to a more or less equal extent.* The mass and energy flux rate are typically two to three orders of magnitude lower than is available form the high power accelerators, hence they would not provide the desired high deposition rate or power to maintain the high film temperature. Meyer and observed $H^{30}$, $H_2^+$, $H_3^+$ in his experiments reported in Ref 14.

The following publications are pertinent to this discussion Hess, R. V., Experiments and Theory for Continuous Steady Acceleration of Low Density Plasmas, Proceedings of the XI International Astronautical Congress, Stockholm, Volume I, pp. 404–411 (1960).

Hess, R. V., et al, "Theory and Experiments for the Role of Space-Charge in Plasma Acceleration: in Proceedings of the Symposium on Electromagnetics and Fluid Dynamics of Gaseous Plasma, Polytechnic Press, New York (1961).

R. V. Hess, Experiments and Theory for Continuous Steady Acceleration of Low Density Plasmas, Proceedings of the XI International Astronautical Congress, Stockholm 1960. Vol. 1, pp. 404–411. Wien: Springer, 1961.

R. V. Hess, Fundamentals of Plasma Interaction with Electric and Magnetic Fields, Paper No. 59, pp. 313–336, Proceedings of the NASA-University Conference on the Science and Technology of Space Exploration, Vol. 2, November, 1962.

R. V. Hess, J. Burlock, J. R. Sevier and P. Brockman, Theory and Experiments for the Role of Space-Charge in Plasma Acceleration. Proceedings of the Symposium on Electromagnetics and Fluid Dynamics of Gaseous Plasma, New York, N.Y., April, 1961, pp. 269–307, Polytechnic Press of tee Polytechnic Institute of Brooklyn, 1962.

Meyerand, R. G., Jr. and Brown, S. C., "High-Current 10n Source. "Rev. Sci. Instr., vol., 30, no. 2, February 1959, pp. 110–111.

Meyerand, R. G. Jr., "The Oscillating-Electron Plasma Source." Progress in Astronautics and Rocketry, vol. 5. p. 81 thru 90.

Some reservations must be made concerning the applicability of the general approach adopted here until some critical experiments are carried out and the results compared with the predictions. Some points of concern are as follows:

(i) When electrons are conducting current in an environment dominated by collisions with atoms and electrons, the drift Mach number is likely to be much less than unity. This would increase the predicted values for the minimum current.

(ii) "Classical" diffusion of the plasma across the magnetic field lines has been assumed. Anomalous diffusion may occur under some operating conditions, if not in all. This would increase the predicted values for the minimum current.

DETAILED DESCRIPTION OF THE PREFERRED EMBODIMENTS

Figure 8:
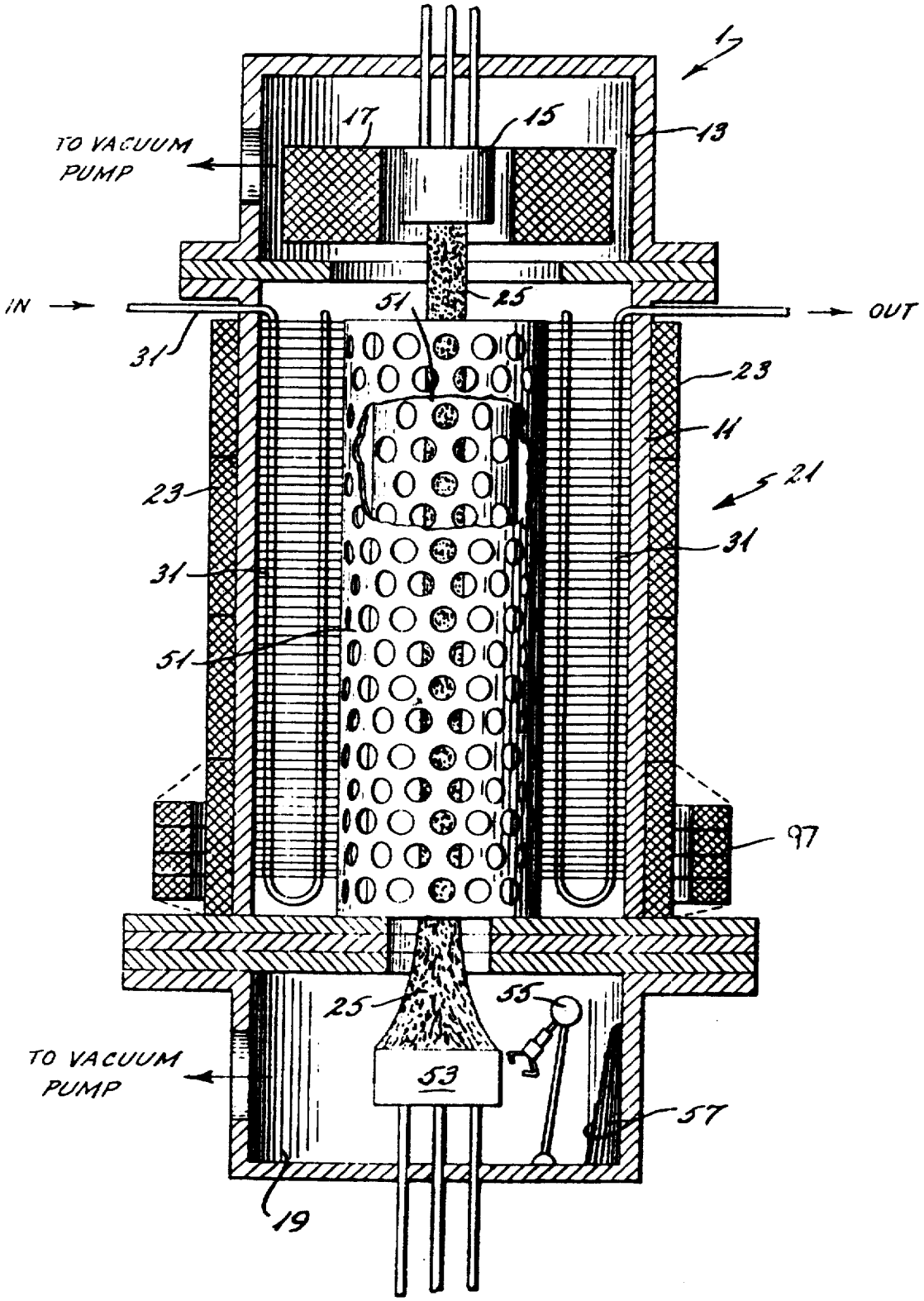
FIG. 8 shows a schematic representation of a first embodiment of magnetoplasmadynamic device according to the invention.

Referring to FIG. 8, the magnetoplasmadynamic deposition device 1 according to the invention is contained within a vacuum housing 11. In an upper portion 13 of the magnetoplasmadynamic device 1, is an arc-forming section 15 which is surrounded by accelerating magnet 17. The center portion 21 or the device is located directly beneath the arc-forming section, and is surrounded by a focusing magnet 23. The lower portion of the device is the deposition chamber 19 which is located directly beneath the center portion 21, and which contains the deposition target 53.

In order that some of the ions in the column 25 may be projected into the deposition chamber 19, it is necessary that a vacuum be maintained within the vacuum housing 11 so that the ions within the plasma column 25 are not obstructed by other fluid material between the arc-forming section 15 and the deposition chamber 19. In the preferred embodiments, a very high vacuum is maintained so that the pressure is below $10^{-4}$ Torr. It is preferred to maintain pressure levels of $10^{-6}$ Torr or lower in order to minimize contamination and extraneous interactions with the working fluids. However, the economics of decreasing this background pressure must be considered against the cost of increased vacuum pumping capacity.

To accomplish these high vacuum levels, a combination of cryosorption, cyrogenic, ionic and mechanical pumping may be used.

FIG. 8 also shows arc section power lead 22, arc section cooling conduits 28, 30 and 32.

Additional extraction of carrier materials is accomplished by a liquid nitrogen-cooled coil assembly 31. The coil assembly 31 is located in the center portion 21 so as to surround the column of plasma 25. Gases which escape from the plasma within the column 25 then condense on the coil assembly 31.

As shown in FIG. 9, the arc-forming section 15 comprises a rod-like cathode 41 and a cylindrical anode 43. An injector 45 is mounted adjacent the cathode so as to permit injected fluid to pass over the cathode 41. When an arc is established between the cathode 41 and anode 43, fluid in the vicinity of the arc is ionized, thus forming an ionized plasma stream.

Referring back to FIG. 7, the fluid ionized in the arc-forming section 15 is accelerated by the accelerating magnet set 17 and focused by the focusing magnet set 23 in order to form the narrow column of plasma 25. However, if the fluid injected by the injector 45 is composed of, or forms elements and compounds of, differing ionization potentials, the elements or compounds with the highest ionization potentials will be unaffected by the discharge and magnetic field and will therefore tend to diffuse out of the column of plasma 25. Furthermore, if binary (molecules), rather than ionic species are formed, these compounds will tend to very rapidly separate themselves from the plasma stream. Thus, such binary compounds may be rapidly extracted. In other words, the ions formed by injecting fluid with the injector 45 are under the influence of tile electromagnetic fields formed by the accelerating and focusing magnets 17, 23, and follow restricted trajectories. Those atoms which are not under the influence of the electromagnetic field are free to diffuse out of the plasma stream. The different trajectories provide a means for separating material species.

Because of the different ionization potentials of different materials, the materials can also be separated by ionizing all of the materials. The resulting ions will have different masses and ionization potentials and will, therefore, have different trajectories as they come under the influence of the electromagnetic fields of the accelerating and focusing magnets 17, 23 and can hence be separated.

As will be described later, in the preferred embodiment, silicon tetrachloride will be the primary material injected through the injector 45. Elemental silicon becomes separated from the compound in the arc-forming section, thereby leaving chlorine and impurity-containing chlorides. The device must now incorporate some technique of separating the chlorine and impurity containing chloride from the silicon while still insuring that the partial pressure (of chlorine) within the vacuum housing 11 remains adequately low (less than $10^{-4}$ Torr). Because of the difference in the ionization potential between silicon and chlorine, the arc will preferentially ionize the silicon. The silicon ions will be trapped by the applied magnetic fields and the chlorine will diffuse out of the narrow column of ions 25. The coil assembly 31 constitutes the primary element in a cyrogenic pumping tower. Between the column of ions 25 and the coils assembly 31 are cooled baffles 51 which serve to intercept much of the hot, but non-ionized, material which is not confined in the plasma beam by the magnetic fields and hence tends to diffuse outward. Disassociated atoms which impinge on the cooled baffle will reassociate to molecules with a corresponding release of energy. The baffles 51 remove this thermal load via external cooling circuits and hence greatly reduce the thermal load on the cryogenic coil.

When the narrow beam of plasma 25 enters the deposition chamber, ions remaining in the narrow beam of ions deposit upon a target 53, thus forming a layer or a semiconductor device. Since it is desired that ultimately the semiconductor materials be used outside the device 1, the semiconductor materials, such as the silicon should be removable from the target area. There are several methods of accomplishing this:

(1) A semi-permanent or temporary layer of a material to which the silicon does not adhere may be placed over the target area. An example of this type of material would be boron nitrite. Depending upon the interface temperature, the boron nitrite will decompose to some extent and the boron will diffuse into the silicon film deposited on the boron nitrite. This results in heavy doping which renders the bottom surface of the silicon conducting (approximately $=10^{-3}$ ohms/cm). This permits the bottom surface to act as a back conductor for a semiconductor device which will be formed from the semiconductor material.

(2) The silicon can be deposited on a reusable substrate sheet of a refractory material such as molybdenum or tungsten. By properly controlling the thermal cycling of the the substrate, the silicon deposited thereon can be made to break loose from the refractory sheet due to the difference in the thermal expansion coefficients of the two materials.

(3) The silicon call be deposited on the surface of a "pool" of high density, low vapor pressure liquid metal such as tin.

(4) The silicon can be deposited upon the surface of a semiconductor base material, which forms part of the intended semiconductor device. Where the silicon is deposited on solid material (as in cases 1 and 2), it may be desirable to scribe the target materials with grooves in order to facilitate directional growth of metallic crystals which are deposited on the target materials. These grooves could be 5–19 microns deep, 5–10 microns wide and have a center-to-center separation of 10–15 microns between adjacent grooves. This will encourage crystalline nucleation centers formed during thee deposition of the silicon to align, thereby producing large crystals or even a single crystalline film.

DOPANT INJECTION

It is possible to inject a dopant material into the plasma stream in order to provide a doped layer on the semiconductor material while controlling the depth and density of the doped layer. This is done by injecting a dopant stimultaneously with the primary semiconductor material, either in the same injection port or separately. Thus, as the semiconductor ions are deposited, the dopant, which is placed in the narrow column of plasma 25, diffuses into the silicon when the silicon is deposited onto a target 53.

Preferably, the dopant is provided as a gaseous chloride or hydride, acid the chloride or hydride is mixed with the main feed of the silicon compound in proper proportions just prior to injection into the arc-forming section 15 to the injector 45. Possible compounds could be:

$B_2H_6$
$PCl_2$
$PCl_3$
$AsCl_3$

Of these compounds, $BCl_3$ and $PH_3$ are considered to be the preferred compounds for producing silicon solar cells.

Also, as mentioned before, when silicon is deposited on a sheet of boron nitrite, boron doping or the silicon will occur, especially near the interface between the silicon and the boron nitrite. The temperatures of the substrate and of the film will determine the concentration and penetration of the boron into the silicon.

The following table lists the physical properties of the various materials injected by the system. Ideally, the material injected should be in a fluid or gaseous form. The ionization potential of those elements which are to be deposited should be relatively low and the ionization potential of carrier materials should be relatively high. The melting and boiling points of the materials are important for the purposes of extracting the materials from the environment by passing cryogenic materials through the coil assembly 31.

| Symbol | Material | Mol. Wt. | Ionization Potential | Chloride and/or Hydride | M.P.C* | B.P.C* | Vapor Pressure (Torr) 195.8° C. |
|---|---|---|---|---|---|---|---|
| Si | Silicon | 28.06 | 8.12 | | 1420 | N/A | |
| Cl | Chlorine | 35.46 | 12.95 | $CL_2$ | −101.6 | −34.7 | $10^{-9}$ |
| H | Hydrogen | 1.00 | 13.53 | $H_2$ | −259.14 | −252.8 | $10^3$ |
| N | Nitrogen | 14.01 | 14.48 | $N_2$ | −209.86 | −195.8 | 760 |
| | Hydrogen Chloride | 36.46 | N/A | H Cl | −112 | −83.7 | $1.5 \times 10^{-5}$ |
| | | | Preferred Substances | | | | |
| 1. | Tetrachlorosilane | 168.29 | N/A | Si $Cl_4$ | −70 | 57.57 | N/A |
| 2. | Trichlorosilane | 135.44 | N/A | Si $HCl_3$ | −134 | 33. | N/A |
| 3. | Dichlorosilane | 100.99 | N/A | Si $H_2Cl_2$ | −112 | 8.3 | N/A |
| 4. | Chlorosilane | 66.54 | N/A | Si $H_3CL$ | −118.1 | −30.4 | N/A |
| 5. | Silane | 32.09 | N/A | Si $H_4$ | −185 | −111.8 | N/A |
| 6. | Disilane | 62.17 | N/A | $Si_2$ $H_6$ | −132.5 | −14.5 | N/A |
| 7. | Trisilane | 92.24 | N/A | $Si_3$ $H_8$ | −177.4 | 52.9 | N/A |
| 8. | Tetrasilane | 122.32 | N/A | $Si_4$ $H_{10}$ | −93.5 | 80 | N/A |

PROCESS AUTOMATION CONSIDERATIONS

In order to produce many square meters of semiconductor grade silicon film with one vacuum pump-down operation, some method of moving the substrate and/or the target material must be devised. In the embodiment in which a solid substrate is used for a target area, solar cell films which are deposited on the target 53 would be removed from the target 53 and stored within the vacuum housing 11, thereby allowing subsequent films to be deposited at the target 53.

A robot 55 would be used to lift the subsequent films from the target 53. A plurality of completed films 54 are then stored by the robot 55 in the deposition chamber 19 awas from the target 55 and the plasma column 25. It can be seen that this storage of completed films 56 permits the device 1 to continue to deposit subsequent films.

It is also possible to have the robot 55 place preformed substrates (not shown) on the target 53 prior to the deposition of each film by the device. Thus the completed films 57 would each have their own substrates which may be left with the films or later separated from the films.

In the case where the silicon is deposited on the surface of the liquid metal, the robot 55 may be used to pull the film along the surface of the liquid. The film may be continuously deposited and a cutting means such as a laser (not shown) may be used to sever the film into desired lengths before the lengths are stored as completed films 57.

It is contemplated that the magnetoplasmadynamic deposition device 1 may be further used to deposited top and bottom conductors and terminals on the solar cells or conductors. This can be done by suitable dopant as well as by electrodepositing appropriate metals to the film. For example, aluminum may be injected into the arc-forming section 15 in the form of aluminum trichloride. The chloride diffuses from the aluminum and the aluminum ions are projected downward in a narrow column of plasma 25. This relatively pure aluminum will then form a bond with the silicon to form a conductor or terminal. A pre-formed grid may be placed on the film in order to enhance the top conductor or terminal. The grid work is then bonded to the film by the deposition of materials such as aluminum or highly doped silicon. Thus, the completed films 57 would have affixed to them terminals or conductors prior to the removal of the completed films from the vacuum housing 11.

Solar cells need anti-reflective coatings in order to improve their collection of solar power and hence the efficiency of the cell. This layer can ideally be made of glass ($SiO_2$), formed by depositing silicon on top of the top conductor while injecting oxygen over the surface of the depositing layer. By proper thermal control of the film during this deposition phase, the reaction to form an amorphous glass layer or a crystal quartz layer can be encouraged. The deposition of the silicon and oxygen may be made sequentially in any desired order or simultaneously.

OPERATION

Figure 10:
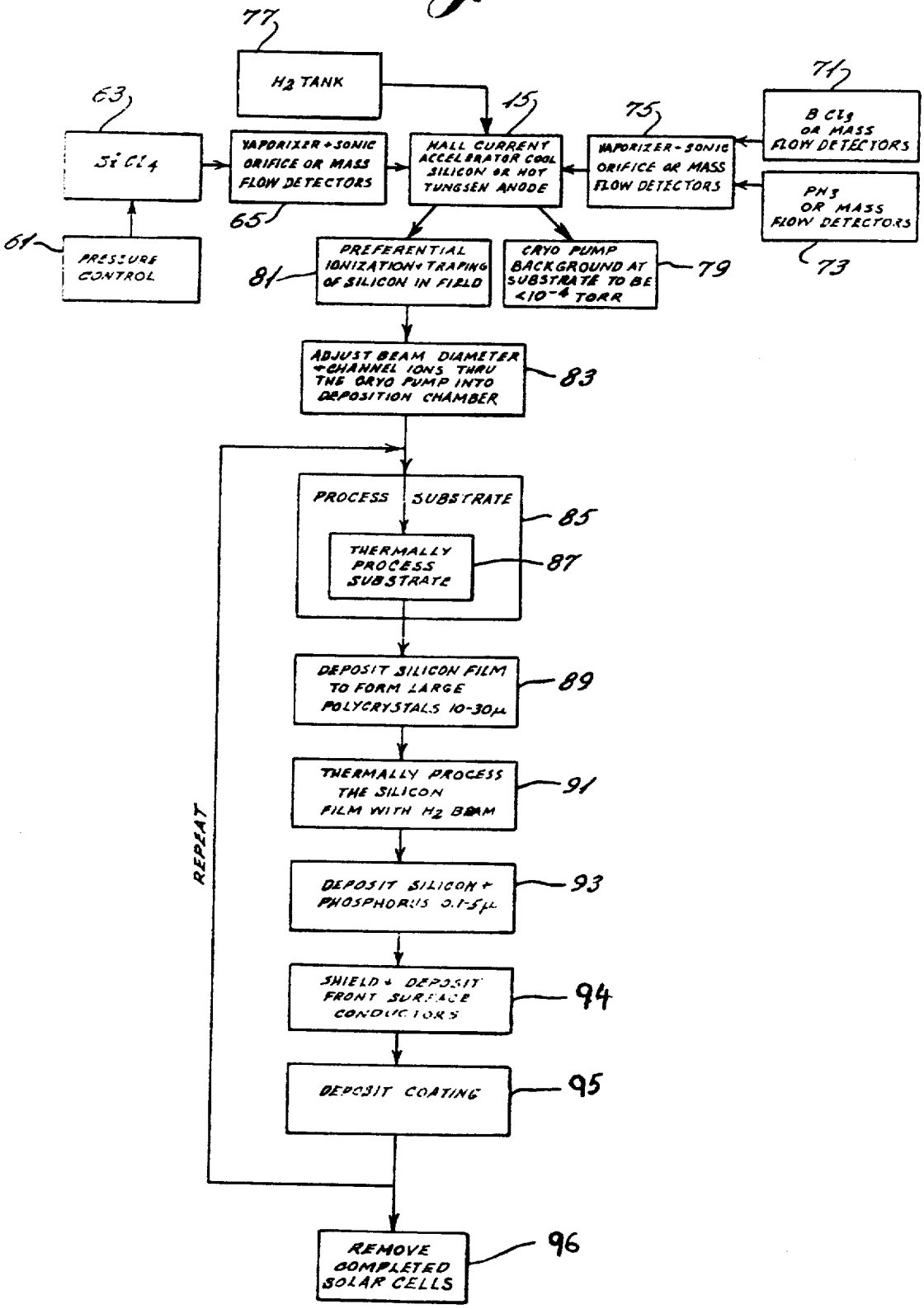
FIG. 10 shows a block diagram representing a process of forming semiconductor films in accordance with the invention.

Referring to FIG. 10, the processes of refining silicon and depositing solar cells are achieved by carefully controlling the different materials that are injected into the system, as well as the arc control and plasma focusing parameters. Pressure from a pressure control 61 is applied to a source of silicon tetrachloride 63. The silicon tetrachloride is injected into the arc-forming section 15 by means of a vaporizer and now controller apparatus 65. One or more dopant supplies 71, 73 provide dopant through a dopant control apparatus 75. Hydrogen from a hydrogen source 77 may be injected in order to provide additional carrier gas to remove impurities and to facilitate the formation of plasma beam. The various gases formed in the arc-forming section 15 are pumped out at a vacuum pumping section 79. The ions emitted from the arc-forming section 15 are preferentially ionized in order to direct silicon and other materials to be deposited at the target 53 (FIG. 8) in a step represented by block 81. This is achieved by the out-gassing performed by the vacuum pumping section 79, as well as the focusing magnets 23. The focusing magnets direct the ions toward the target 53 in the deposition chamber 19, as represented by step 83. In step 85, the substrate is prepared to accept the column of ions 25. This step includes the thermal processing of the substrate in order to establish the substrate at a proper temperature to either adhere or gradually separate from the deposited materials, as desired. This is represented as a part of the processing or the substrate by block 87. The ions, as they impinge upon the target, form a crystalline film, represented by a step 89. The hydrogen provided at 77 may be used to form a plasma beam in order to thermally process the silicon and to prepare the silicon to receive a dopant layer. This is represented by block 91.

The dopant is then applied, as represented by block 93, after which front surface conductors are deposited, using a matrix shield in a step represented by block 94.

Final processing is performed at block 95. This processing may include the deposition of a thin arsenic layer in order to improve the photosensitive characteristics of the resultant photocells. Finally, in step 96, after the last silicon films or solar cells are formed, the completed films or cells 57 are removed from the deposition chamber 19.

ARTICULATING MAGNETS

If it is desired to create large area film substrates, it is necessary to articulate the target 53 with respect to the narrow column of plasma 25. This articulation provides a larger deposition pattern on the target 53 than would be achieved by merely permitting the column of plasma 25 to diffuse.

As previously mentioned, in the case in which the narrow column of plasma 25 is focused onto a liquid metal substrate, the robot 55 may be used to pull the deposited materials along the "lake" of liquid metal, thus effectively removing the target 53 relative to the narrow column of plasma 25.

However, when a solid substrate is used, it is necessary to either move the target 53 or the column of plasma 25. If it is desired that the target 53 be retained in a specific location, then the narrow column of plasma 25 may be articulated by shifting the magnetic fields of the focusing magnet 23. This can be achieved by providing an articulating portion 97 of the focusing magnet 23. The articulating portion 97 functions as a part of the focusing magnet 23 but is capable of shifting its magnetic axis or of shifting its flux pattern in order to angularly divert the narrow beam of plasma 25 as the plasma approaches the target 53. This may be done by selectively energizing part of the articulating portion 97 or by physically rotating the portion 97 on a gimbal apparatus.

Figure 13:
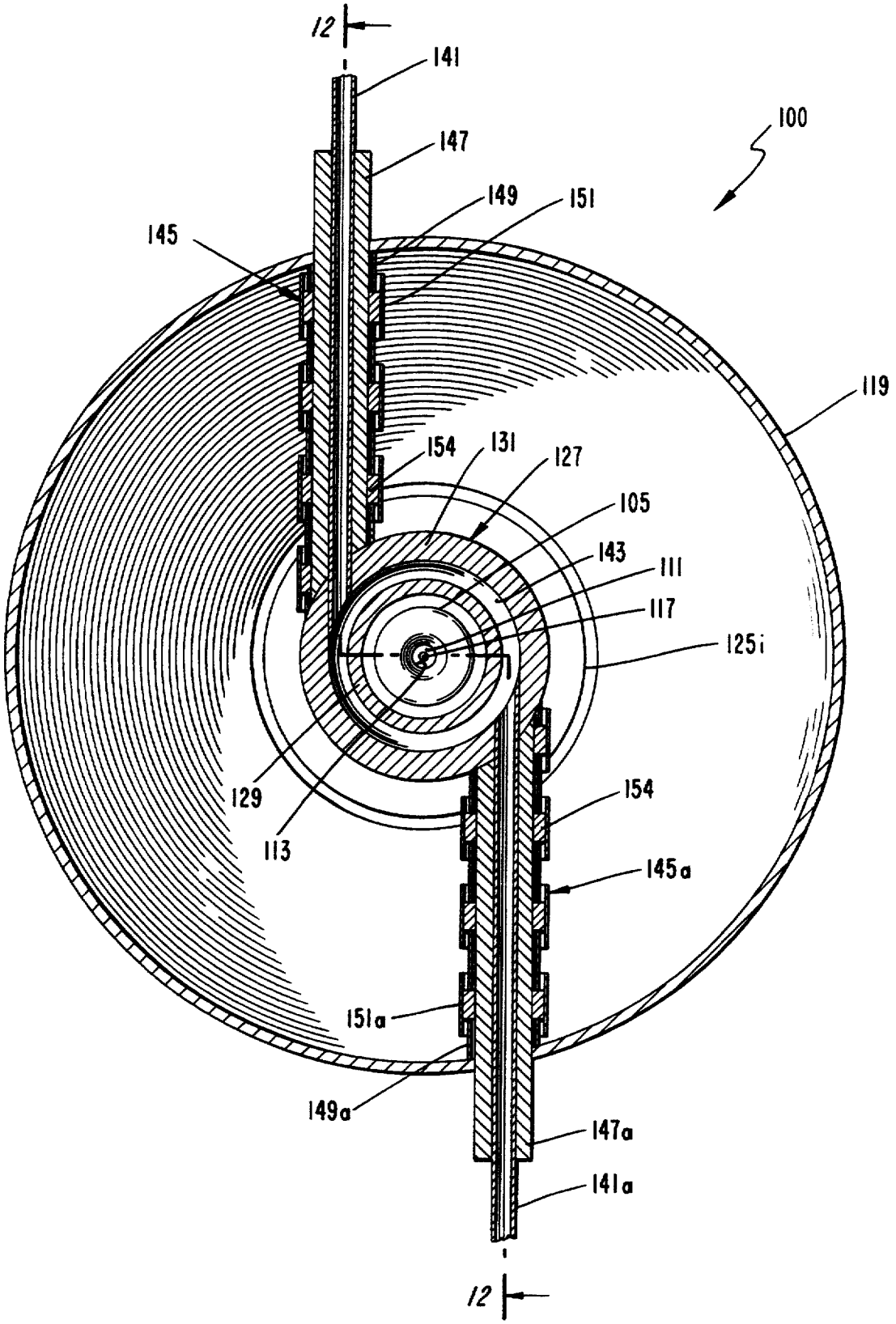
FIG. 13 shows a cross section through the anodeionizer.

Referring now to FIGS. 11–13, a preferred embodiment of a high throughput magnetoplasmadynamic processor 100 is disclosed. The processor includes a thermionic cathode 101 surrounded by an insulator 103. A buffer electrode 105 is mounted in surrounding relation to insulator 103, and has extending therethrough a gas inlet conduit 107 which communicates with a cavity 109 formed within the electrode 105 through helical passages 107'. Cavity 109 has an outlet orifice 111 defined by an annular lip 113 which orifice 111 acts to control the pressure of gas within the cavity 109 as well as to assist in establishing the diameter of cathode jet 115. By controlling the pressure of gas within the cavity 109, the orifice 111 also ensures stable arc attachment on the conical tip 117 of the cathode 101 which ensures that sufficient gas is ionized to establish the current carrying magnetically contained cathode jet 115. The above-described structure is sealed within a vacuum chamber 119 which has an area designated by reference numeral 121 which sealingly admits therewithin the various power, gas and cooling feed-thru lines required for device operation. As shown in FIGS. 11 and 12, connections 134, 136, 138 are provided for connection to mechanical vacuum pumps (not shown).

Figure 28:
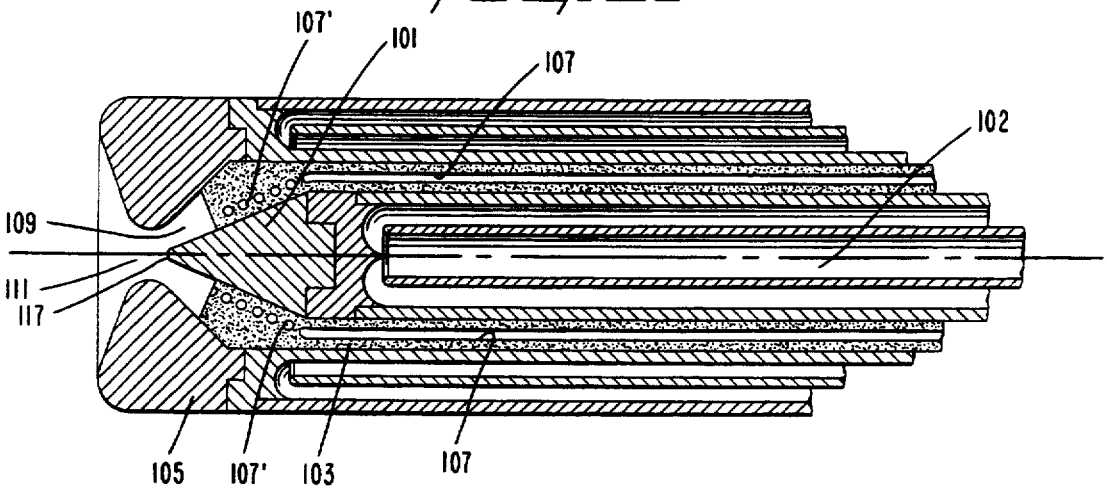
FIG. 28 shows a detailed view in cross-section of the cathode-buffer.

FIG. 28 shows a detailed view of the cathode-buffer 101, 105. As best shown therein, the straight gas passages 107 extend from the helical passages 107' completely through the insulation 103 to a point (not shown) upstream of the cathode 101 at the gas supply. Tubes 102 are mounted in surrounding relation to cathode 101 and convey coolant therethrough to keep the cathode 101 within desired limits of temperature. Further, tubes 104 surround buffer 105 and also convey coolant to keep the buffer 105 within desired temperature limits.

The above-described assemblage of components is placed on the centerline of a substantially symmetrical electromagnetic coil 123 which centerline corresponds to the centerline of the magnetic field produced by the coil 123. The coil 123 is specifically designed to give the desired magnetic field strength at the cathode tip 117, in the range of about 0.2 to over 10 Tesia, with the peak field strength slightly behind the tip 117 as indicated by line 123A, which ensures a slow divergence of the magnetic field lines downstream of the cathode tip 117. While the coil 123 is shown as located outside the vacuum chamber 119, if desired, it may be located within vacuum chamber 119.

This design, as above-described, permits the arc cathode attachments to be as small as 2 millimeters in diameter, even though hundreds of amperes of current are drawn. Current densities can thus be over 10,000 amps/sq. cm. One feature of this type of cathode is that the discharge is self-sustaining as contrasted to the non-self-sustaining structure of, for example, Tsuchiomoto (U.S. Pat. No. 3,916,034). The (1) heat transfer and (2) ion bombardment to the cathode attachment from the ionized gas supply the energy necessary to maintain the temperature of tip 117 near the melting point of tungsten as well as to supply the energy to "boil" off the electrons, i.e., work function energy, of about 4.5 electron volts per electron. The buffered design of cathode discussed here is essential to obtain the required current capacity and small cathode attachment diameter needed for the successful operation of the magnetoplasmadynamic processor.

The gas is injected through conduit 107' with as high a swirl component as is feasible. This accomplishes many objectives, the two most important being:

(1) the arc is thus stabilized on the center line, and (2) any unionized gas escaping the orifice 111 has a large radial component in velocity and hence will quickly escape from the cathode jet and be pumped out of the vacuum chamber.

Just downstream of the orifice 111, a series of disc-like members 125a–i are mounted within the chamber 119. As is best seen in FIG. 12, the discs 125a–i preferably have similar outer diameters but their inner diameters vary, from a small inner diameter for disc 125a progressively increasing to the largest inner diameter for disc 125i. The disc 125i is located just upstream of the anode 127. The combination of discs 125a–i constitutes a vacuum insulator/isolator 125. In the region between the orifice 111 and the anode 127, the electric potential lines tend to follow magnetic field lines whenever plasma exists. The isolator discs 125a–i quench any plasma, e.g., plasma streaming back from the anode 127 that might form along magnetic field lines between the anode 127 and upstream components such as orifice 111 and the outside cathode set 115, thus permitting a strong radial electric field to develop between inner anode ring 129 and the virtual cathode or cathode jet 115 and also a large potential difference to develop between the anode 127 and the buffer electrode 105.

As best seen in FIGS. 12 and 13, anode 127 includes an inner ring 129 and an outer cylinder 131 in surrounding relation to ring 129. Cylinder 131 has one end 133 formed substantially flush with an end 135 of ring 129 and gas another end 137 extending significantly farther downstream than end 139 of ring 129, for a purpose to be described hereinafter. A tube 141 is also provided which extends tangentially (see FIG. 13) into a gap 143 formed between the ring 192 and cylinder. The tube 141 conducts feed gas into the gap 143. As shown, the tube 141 is surrounded by a tubing vacuum insulator/isolator structure 145 which includes an insulator covering 147 made, preferably, of boron nitride, shielding cylinders 149 of small diameter, shielding cylinders 151 of large diameter and discs 154 of insulator material which fixedly mount (he cylinders 149, 151 to the covering 147. The structure 145 is provided so as to avoid interference between the power lead for anode 127 and the potential distribution within the vacuum chamber 119. Also best shown in FIGS. 12 and 13, is structure facilitating supply of dopant gas to gap 143. The elements of this structure are identical to those related to the feed gas tube 141 (with one exception) and have been given the same reference numerals with a suffix letter "a." The sole exception lies in the fact that dopant gas supply structure does not include a power lead either integral with tube 141a or otherwise, However, if desired, the anode power lead could be incorporated in the dopant gas supply structure rather than in the feed gas supply structure. As shown, the tube 141 is made of a metallic material and performs two functions: (1) supplies working fluid to gap 143 and (2) comprises the anode power lead. If desired, however, the power lead could comprise a separate element if the tube is an insulator. Such separate power lead could be made concentric with tube 141 if desired. The cylinders 149, 151 are preferably made of the same material as the working fluid to avoid evaporative contamination in chamber 119. Alternatively, the cylinders 149, 151 may be made of a material having low vapor pressure and high melting point such as, for example, tungsten or molybdenum. If desired, more than two gas inlets 141b, c may be provided to supply gas tangentially to gap 143.

The anode 127 and related structure described above are mounted within the vacuum chamber 119 and are mounted therein within an ionizing magnet coil 153 which is used to "fine tune" the magnetic field lines as they pass through the ring 120 and cylinder 131. This fine tuning is done in order to ensure anode attachment on the lip 155 of ring 129 and so as to obtain the best ionizing efficiency in the gap 157 defined by magnetic field line 159 and cylinder 131.

By injecting the gas with a high azimuthal velocity into the annulus 143 the residence time of the gas in the anode is greatly increased over that which would occur with radial injection, giving a much higher probability of atom ionization by the part of the annular or rotating column discharge (anode sheath 159) inside of the outer anode cylinder 131.

The correct amount of gas must be injected through the anode to insure that the desired mode of operation is achieved. By controlling the amount of gas injected, the following modes of operation may be achieved:

(i) single ionization of only one species (ii) single ionization of more than one species (iii) multiple ionization of only one species (iv) multiple ionization of more than one species (v) erosion of anode material if desired (vi) ionization and entrainment of ambient gas if desired (vii) inject gas into anode which will react with anode material to form gaseous compound which is then decomposed by the discharge and the anode material ionized.

This is accomplished by reference to equations 36 and 38.

Figure 29:
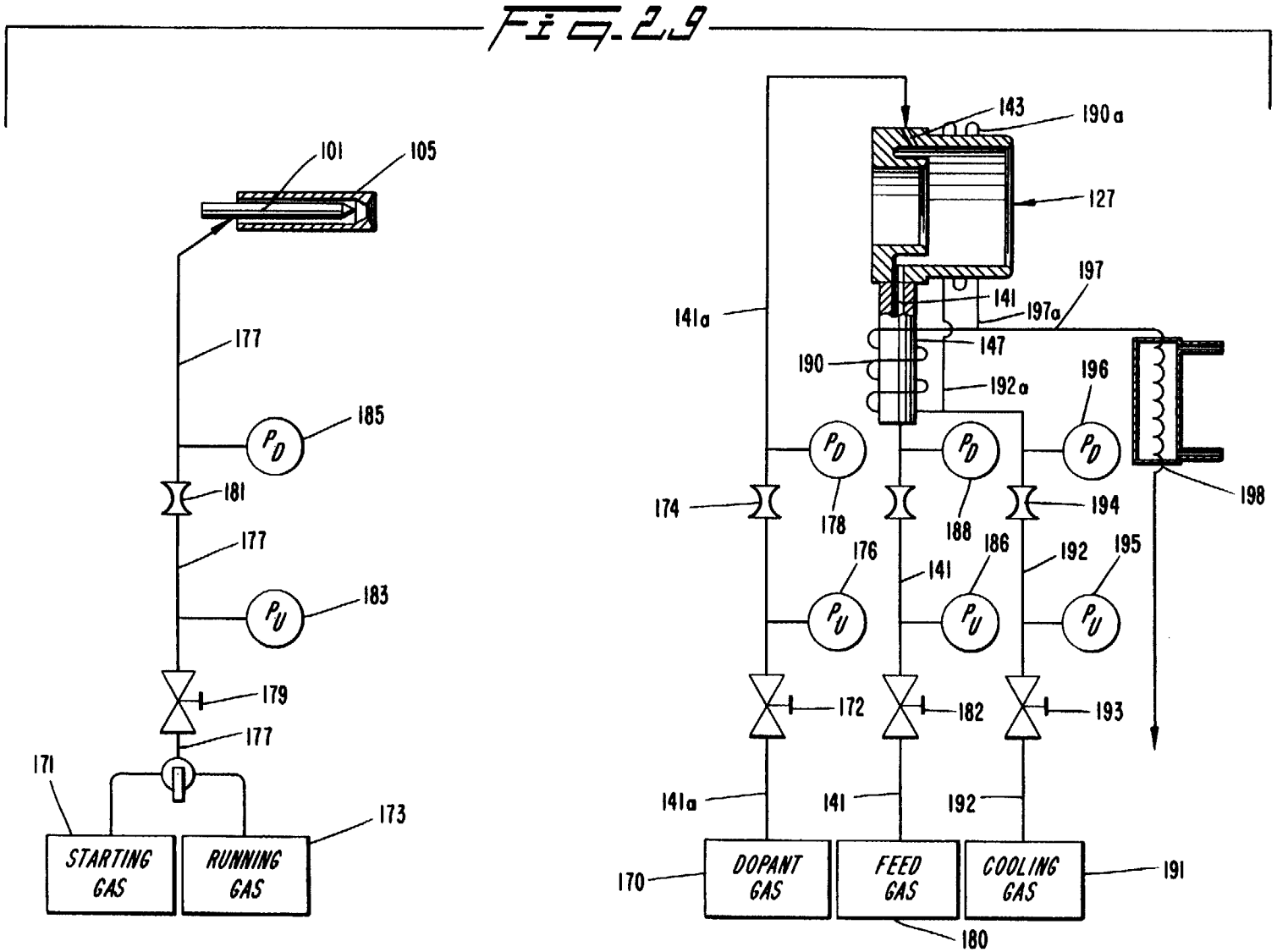
FIG. 29 shows a schematic view of the gas supply systems for the cathode-buffer and anode ionizer.

FIG. 29 shows an embodiment of gas supply systems. As shown, the cathode and buffer 101, 105 are supplied with gas from one of two sources 171, 173. A selector valve 175 is switchable between the two sources 171, 173 depending upon whether the processor is in the starting or running mode. Valve 175 connects with flow line 177 which includes metering valve 179, restriction 181 and upstream 183 and downstream 185 pressure gauges which enable the gas flow rate to be determined. The flow line 177 connects with cathode/buffer gas passages 107.

The anode 127 is fed with dopant gas at gap 143 through tube 141a which connects with dopant gas source 170. Also in tube **141*a* are metering valve 172, restriction 174 and pressure gauges 176, 178 which enable dopant gas flow rate to be determined. Feed gas is fed to the gap 143 through the above-described tube 141 from feed gas source 180. Tube 141 includes metering valve 182, restriction 184 and gauges 186, 188** which enable feed gas flow rate to be determined.

Also shown in FIG. 29 is a cooling system for tube 141 which includes a coil 190 surrounding tube cover 147. Cooling gas source 191 connects to coil 190 through tube 192 which also includes connected therein metering valve 193, restriction 194 and gauges 195, 196 which enable the flow rate of cooling gas to be determined. Tube 197 connects with the downstream side of coil 190 and connects with heat exchanger 198 which acts to remove heat from the cooling gas. Further, to cool the anode 127, a line 192a is tapped off coolant line 192 which connects with cooling coil 190a mounted in surrounding relation to anode 127. The outlet of coil 190a connects with tube 197 through line 197a.

Referring now, in particular, to FIG. 11, downstream of the anode 127 and coil 153 are located a plurality of conical segments 161a–p which as a whole comprise a downstream vacuum insulator/isolator 161, placed at a radius so as not to interfere with the free development of the discharge path through the anode sheath 159. A group of shaping magnets 163a–f are placed in surrounding relation to the axis of the plasma beam and segments 16la–p to control the diameter of the plasma beam that emerges from the discharge as well as the direction of the plasma beam.

The object of this downstream isolator array 161 is to intersect all magnetic field lines that pass through the anode 127 other than those passing through the anode orifice 114 and to quench any plasma in the annular region between the isolators 16la–p and the downstream structure, e.g., the vacuum tank.

By using three sets of isolator segments (125a–i), (149, 151) and (161a–p) all possible plasma electrical shorting paths between structural components, for example the vacuum tank and the anode, between the vacuum tank and the buffer electrode, and between the anode and the buffer electrode, are blocked, except for the magnetic flux lines going through the anode orifice. If no target or substrate is placed in the path of the beam there is a plasma "electrical short" between the cathode and the tank so that the potential of the tank may stabilize at a level close to that of the cathode.

In actual fact, the axial electric field in the cathode jet reverses downstream of the region where the cathode jet and anode sheath meet. At this position the potential may be 6–15 volts positive with respect to the cathode. As the electron temperature and density decrease downstream from this region, the potential of the plasma decreases and approaches that of the cathode. In some cases the plasma potential at the beam tank interface may be negative with respect to the cathode because of this plasma potential drop which can be expressed as:

$$\Delta V = \left\{ \frac{kT_e}{e} \ln \frac{(n_e)^*}{(n_e)_t} \right\}$$

Where the axial position at which the axial electric field reverses can be defined as an electromagnetic throat in the electromagnetic nozzle. The flow at this point has a strong similarity to the Mach one condition in regular gas dynamic flow. A detailed analysis of collision less plasma flow indicates that the electric field in the axial direction of flow must reverse at tile position where each species of particles goes through an equivalent "Mach one" condition. Magnetic field contouring in the downstream region is required to help establish this "electromagnetic throat" at the desired axial position to accomplish the objectives of the processor. As pointed out earlier, no discharge current flow downstream of the electromagnetic throat. Recirculating currents in all three directions aximuthal, axial and radial, may flow in this region to establish the proper condition for the plasma to exit the magnetic field. It is further noted that flow upstream of tile electromagnetic throat is subsonic, whereas flow downstream thereof is supersonic.

At this juncture, it is noted that one of the main points of distinction between the embodiment of FIGS. 11–13 and the embodiment of FIGS. and 9 lies in the fact that the processor 100 of FIGS. 1–13 has 3 sets of magnets 123, 153 and 163 as opposed to the two sets of magnets 17,23 shown in the processor 1. A discussion of the three magnet systems follows:

The electromagnetic system provides a number of interrelated functions in the Hall Current, MPD Accelerator. Primarily, the applied axial magnetic field provides confinement and direction to the ion flow. Interaction with the current flow also induces a desirably high spin rate of the anode attachment point. The applied magnetic field strength is one of the three primary parameters which may be varied to exercise control of the MPD operating characteristics. The other two are current and mass flow rate.

In the deposition process, the downstream magnetic field strength will be instrumental in the control of the dimensions and uniform deposition rate of silicon particles on the substrate.

For the purpose of design concept discussions, the electromagnets will be considered in three parts. These are the cathode region accelerating field coils, the anode region trimmer coils and the downstream beam confinement and focusing coils.

ACCELERATING ELECTROMAGNETS

The applied magnetic field in the electrode region should be axial, with maximum centerline strength slightly aft (away from the anode) of the cathode emitting surface. The resultant magnetic confinement pressure then gradually decreasing as the electrons flow downstream as the cathode jet, through the anode bore. The desired configuration of the magnetic flux lines are illustrated in FIG. 12 the center plane of the electromagnets, and the corresponding peak field, are positioned so as to have the cathode tip in a slightly diverging field.

The magnitude of the centerline field strength will be on the order of 2,000–20,000 gauss. This presents no technical problem, as such field strengths are easily obtained by fairly compact coils for the inner volume being considered. The minimum size and electrical power requirements could be achieved by placing the coils intermittently around the electrode system. For the high vacuum requirements and purity desired for the deposition process, however, other factors must be considered.

SOLENOIDAL ELECTROMAGNET DESIGN

The first examination given to means of obtaining a desirable magnetic field could include the possible usage of permanent magnets as well as electromagnet varities. However, for the MPD device permanent magnets have severe limitations. Foremost, little control of the field strength can be conveniently obtained. The inherent bulkiness, mass, and sensitivity to thermal and magnetic cycling are undesirable. Further, their field strength deteriorates rapidly above a few hundred degrees. The design concept for the MPD deposition system then will be confined to electromagnets for the accelerating trimming and focusing fields.

The preliminary design of accelerating magnets can be approached by selection of certain desired quantities, such as centerline field strength, shape of field, method of construction, method of cooling and critical dimensions. The power input, cooling mass flow rates, forces and other dimensions can then be calculated.

Figure 25:
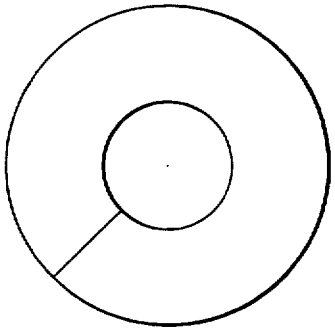
FIGS. 25 and 26 show end and side views respectively of a Gaumé type solenoid electromagnet.
Figure 26:
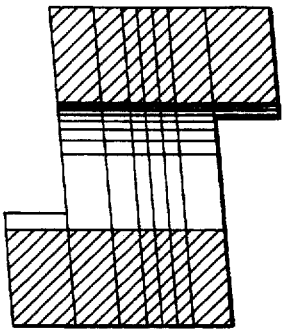

Three general categories of solenoidal electromagnets can be considered. There are the uniform current density, Bitter and Gaumé types (UCD). The UCD type is typically wound in several layers of square conductor, insulated between and offers great flexibility of design. The Bitter coil is constructed of uniform thickness disks, split radially and joined to adjacent disks to form a helix. The current density varies inversely as the conductor radius, which improves the center field efficiency The Gaumé design (FIGS. 25–26) uses disk thickness which decrease toward the coil mid-point, and results in both axial and radial current density variation which further increases the efficiency.

In the processor embodiments of this application, the Gaumé design has been employed.

In order to obtain adequate control of the strength and shape of the magnetic field in the anode and cathode regions when the electromagnets are exterior to the vacuum chamber, a trimmer magnet 153 will be required. It will also be desirable to increase the diameter of the vacuum chamber in at least 3 steps as shown in FIG. 11 in order to get the coils as close to the centerline as is feasible. The trimmer electromagnet 153 together with the electromagnet 123 over the cathode-buffer constitute the "acceleration" electromagnets. The coil 123 establishes the desired magnetic field strength at the cathode tip (2,000–20,000 gauss) and ensures that the cathode tip is in a magnetic field that diverges downstream. Coil 153 ensures that the field lines which pass thru the anode attachment annular ring 129 pass inside of the orifice of the anode cylinder 131 with a gap optimized at between 0.010 and 0.100 inches. The induced solenoidal magnetic field from the Hall currents in the plasma will affect the shape of this field line and the current through the trimmer 153 magnet must be adjusted to ensure that this critical magnetic field line has the proper shape at all operating conditions. The necessary information on how to adjust this current can be obtained from the analysis presented along with equations 22–34.

MAGNETIC CONFINEMENT AND FOCUSING

Confinement of the charged particles downstream from the electrode region is accomplished by an independent electromagnet assembly 163 which permits control and shaping of the plasma beam and deposition geometry. The desired magnetic field profile is such that the ions in the beam will be confined and directed entirely onto the substrate, while the non-ionized carrier gases and contaminates will diffuse from the beam and be captured on the cryogenic surfaces or by other pumping mechanisms.

The basis for this magnetic separation of silicon from the other materials, as discussed earlier, lies in the tendency of the arc to operate with a minimum potential drop. This strongly favors the ionization of silicon which has an ionization potential of about 8 electron volts as compared with about 13 volts for either hydrogen or chlorine.

This confinement of the silicon ions and focusing onto the substrate area can be accomplished with a slowly divergent magnetic field, down the length of the anode-to-substrate axis. This field must blend properly with the higher field produced by the accelerating coils, and smoothly decrease in strength along the axis to the substrate.

The overall magnetic flux line contours for the device are idealized in FIG. 11. The flux lines which intersect the anode bore diameter, where the working fluid is injected into the plasma and subsequently ionized, should also intersect the outer diameter of the substrate. The ions therein will be accelerated axially and radially due to the electric fields and the applied axial magnetic field will deflect the radial ion motion into azimuthal motion.

The resultant ion flow towards the substrate will generally be confined within the region bounded by the anode bore to substrate O.D. flux lines 166, with substantial inward ion movement, radially toward the cathode jet region to produce a fairly uniform radial distribution of mass at the substrate surface. Reference numeral 168 (FIG. 12) refers to lines of equal electric potential.

The design of electromagnets to produce a confining field can be approached on the following basis:

(1) The ion boundary defined by the anode bore to substrate O.D. flux lines can be established by fixing a constant value of magnetic flux at any axial position, i.e. induction times area will be constant.

$$B_2 r^2 = \text{Constant} \qquad 71$$

$$B_2 = (r_a/r_z)^2 B_o \qquad 72$$

For preliminary anode values of $r_a = 0.05$ meters and $B_a = 0.2$ Tesia, the axial field strength at the substrate should be:

$$B_{ss} = \frac{0.05^2}{0.15} 0.02 \text{ Tesla}$$

$$= 0.022 \text{ Tesla or } 220 \text{ Gauss}$$

(2) It is desirable to have a fairly uniform magnetic field in the region of the substrate, and for the field to be predominatly axial, with minimum radial components, all for the purpose of uniform silicon ion focusing onto the substrate, i.e.

$$B_z(r,z=B_z(0.2) \quad 73$$

and $$B_z >> B_r$$

Figure 27:
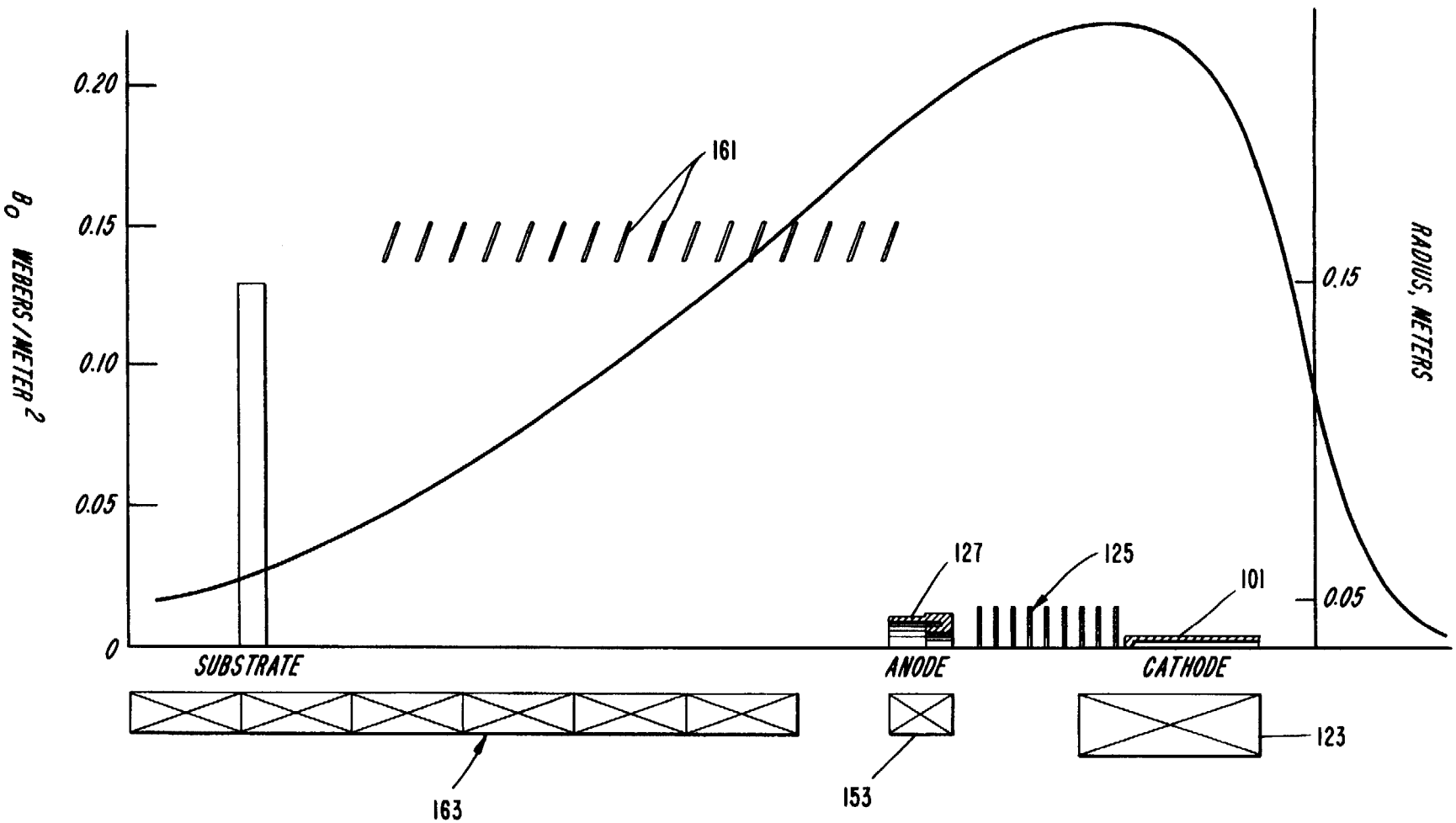
FIG. 27 shows a graph of magnetic field strength versus distance from substrate to cathode-buffer for the present invention.

(3) the desired profile of the overall field strength (accelerating, trimmering and focussing) is illustrated in FIG. 27, as a convenient way to present the concept. The maximum field position is slightly behind the cathode tip, and the field strength decreases smoothly towards the substrate, inversely proportional to the bounded area at any point along the centerline.

These three criteria can be satisfied by a solenoidal coil configuration. It is known that the field inside a long solenoid is fairly uniform across the bore and that it decreases in cosine fashion from the midpoint towards the ends. The value at the ends of a very long solenoid is half that at the midpoint.

FIG. 27 shows, for orientation purposes, the accelerator cathode magnet 123, the anode trimmer magnet 153, the downstream focussing magnets 163 as well as the cathode 101, anode 127 and insulator/isolators 125, 161.

The typical, symmetrical bell-curve field strength shape of a simple solenoid would accomplish the task, but the half of the field which would exist aft of the cathode, and the power required to generate it, would be entirely wasted. A better approach would be a long solenoid of lower field strength adding to the downstream field of the accelerating coil, or by the cumulative effect of a series of short coils which could be placed at intervals along the centerline.

Some feeling for the magnitude of this electromagnet can be quickly derived from simplified calculations:

(1) For a vacuum chamber of 1.5 meters diameter and 3 meters length, assume exterior placement of the confining solenoid.

(2) Consider the case as a solenoid with the substrate at one end and the electrode array at the other.

The field strength at the substrate then will be about one-half of the midpoint value, or $$B_{ss}=(\mu_o/2)(NI/1) \quad 74$$

which was previously determined to have a value of 0.022 Tesia. Therefore,

$$NI = \frac{2lB}{\mu_o} \quad 74a$$

$$= 70{,}000 \text{ ampere-turns}$$

For comparison, this is approximately twice the value required for the accelerating field.

The confining coil design will now be dictated by the requirements for power supply matching and minimum copper costs. These quantities may be related as:

$$\text{Copper Cost}=K_1 l_c A_{cs} \quad 75$$

$$\text{Power Required}=K_x I^2(l_c/A_{cs}) \quad 76$$

where $l_c$=length of conductor $A_{cs}$=conductor cross-sectional area $K_1$ l & $K_2$ are constant The length of the conductor when wound on the O.D. of the vacuum chamber will be:

$$l_c=2\,r_i N \quad 77$$

and since $$Ni = 70{,}000 \text{ amp-turns},$$

$$l_c = \frac{(4.712)(70{,}000)}{I}$$

$$= \frac{33 \times 10^4}{I}$$

Substituting above:

$$\text{Copper cost}=K_3(A_{cs}/I) \quad 78$$

$$\text{Power Requirements}=K_4(I/A_{cs}) \quad 79$$

The copper costs and power costs are hence inversely related and cannot be optimized separately. The preliminary design then will be based on the selection of a convenient power supply voltage, say 400 VDC, with the conductor sizing and current to be determined.

$$R = \frac{V}{I} = \rho\frac{l_c}{A_{cs}} \quad 80$$

$$A_{cs} = \frac{\rho I l_C}{V} \quad 81$$

Earlier, $Il_c$ was found to be $=33 \times 10^4$ amp-m, $$A_{cs} = \frac{(1.7 \times 10^{-8}\Omega - m)(33 \times 10^4 \text{ amp-m})}{400 \text{ Volts}}$$

$$= 0.14 \times 10^{-4} \text{ m}^2 \text{ or } 0.14 \text{ cm}^2$$

For a conservative current of 10 amperes;

Conductor length $$l_c = \frac{33 \times 10^4 \text{ A} - m}{10 \text{ A}} = 33 \text{ Km}$$

Copper mass $$m_{cu} = \rho l_c A_{sc} \quad 82$$

$$= (8.92 \text{ g/cm}^3)(33 \times 10^5 \text{ cm})(0.14 \text{ cm}^2)$$

$$= 4121 \text{ Kgm}$$

Power required $$P = \frac{I^2 \rho l_c}{A_{cs}} \quad 83$$

$$= \frac{(100)(1.7 \times 10^{-8}\Omega - m)(33 \times 10^3 \text{ m})}{0.14 \times 10^{-4} \text{ m}^2}$$

$$= 4000 \text{ watts}$$

For a higher current level of 100 A or more which would require conductor cooling for continuous usage:

$l_c$=3300 m $m_{cu}$=412 Kgm

P=40 Kw

Figure 14:
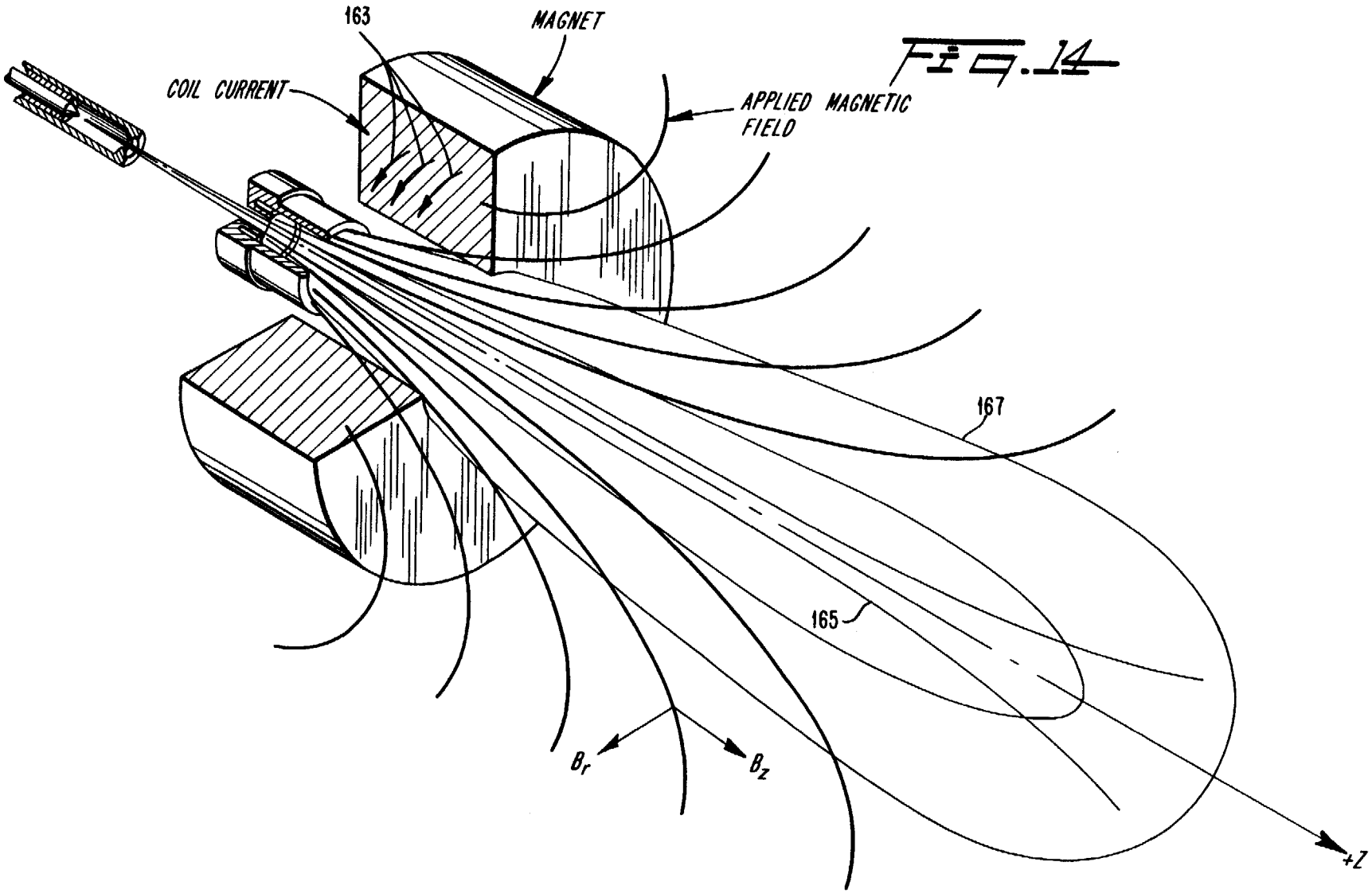
FIG. 14 shows a schematic view of the magnetic flux lines generated by passing current through the coil as indicated.

FIG. 14 shows schematically the magnet flux lines generated by passing current through the solenoid coil in the direction indicated by arrows 163. It also shows schematically the two niain features of the electrical discharge:

(i) the central cathode jet 165 or virtual cathode consisting of plasma generated by the discharge inside the cathode buffer and augmented by ions captured from the anode sheath.

(ii) the annular anode sheath 167 which consists of plasma produced by ionizing the material injected through the anode. Moving downstream, the outside diameter of the anode sheath will encompass less and less magnetic flux, $\phi$.

Figure 15:
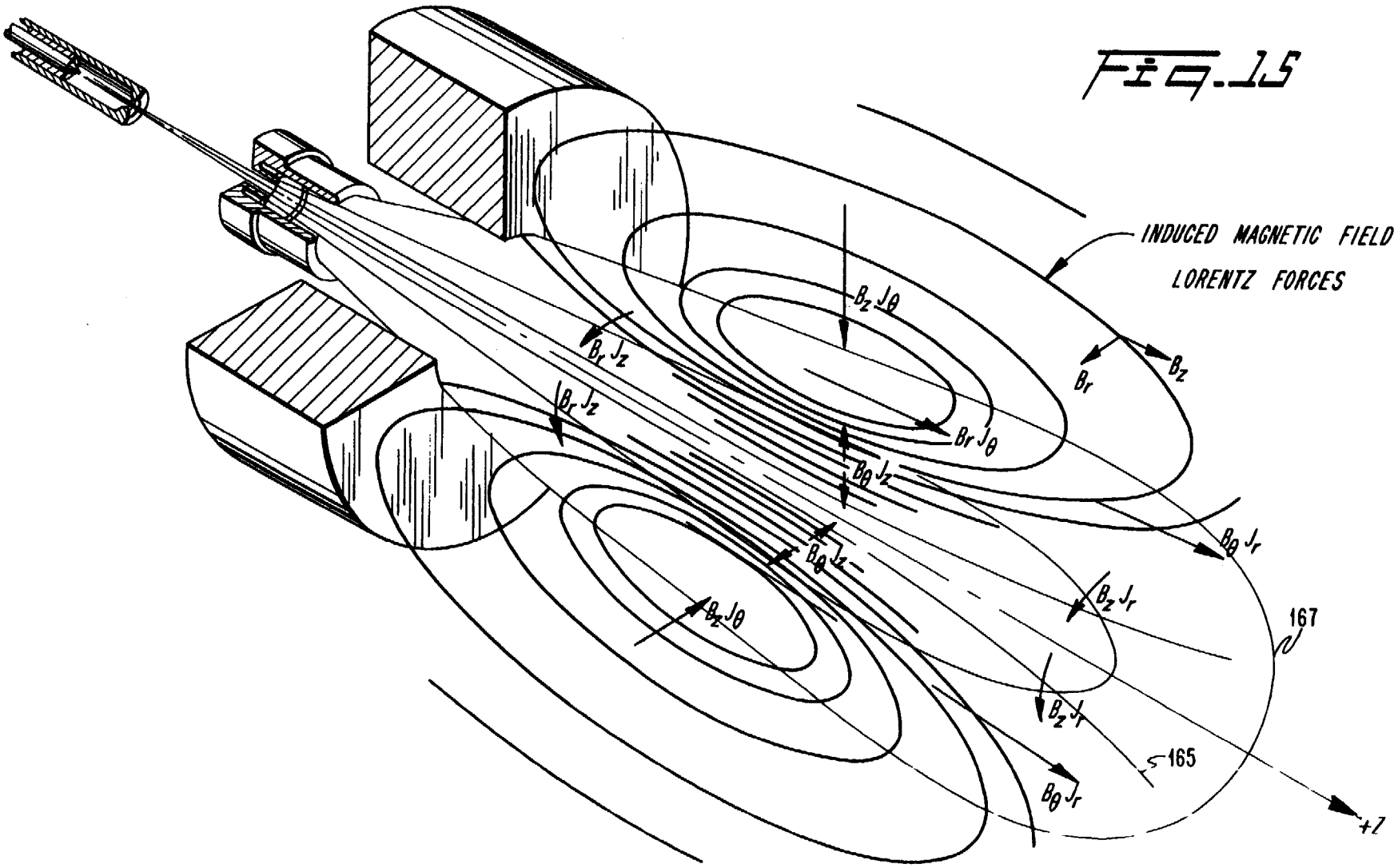
FIG. 15 shows a schematic view of plasmadynamic forces on the plasma.

FIG. 15 shows how the radial plasma dynamic forces on the plasma, $j_\theta B_z - j_z B_\theta$, separate the plasma into the structure described in FIG. 14. The axial forces, $j_r B_\theta - j_\theta B_r$, accelerate the plasma in the downstream direction, provided the solenoidal magnetic field diverges. Magnetic field lines of the induced magnetic field due to the Hall currents are also shown scbematically. These demonstrate the diamagnetic properties of the plasma, tilat is, the Hall currents flow so as to try and exclude magnetic field lines from the volume occupied by the plasma. A great deal can be learned from examining the reaction forces on the currents in the magnet and the power leads. The radial component of the induced solenoidal field interacts with the current through the coil to give a net rearward force on the magnet. If the anode power lead is radial, the axial component of the applied solenoidal magnetic field interacts with the current in the power lead to generate a torque on the power lead. The azimuthal magnetic field, interacting with the power lead that radially connects the anode and cathode to the power supply, also given a net rearward force on the structure comprising the electric circuit. Since "action" must equal "reaction" the plasma leaving the system carries both axial and angular momentum with it, which was imparted to it by the electromagnetic interactions.

FIG. 16 shows the paths taken by the electric current. This includes induced Hall currents, as well as the discharge current.

Figure 17:
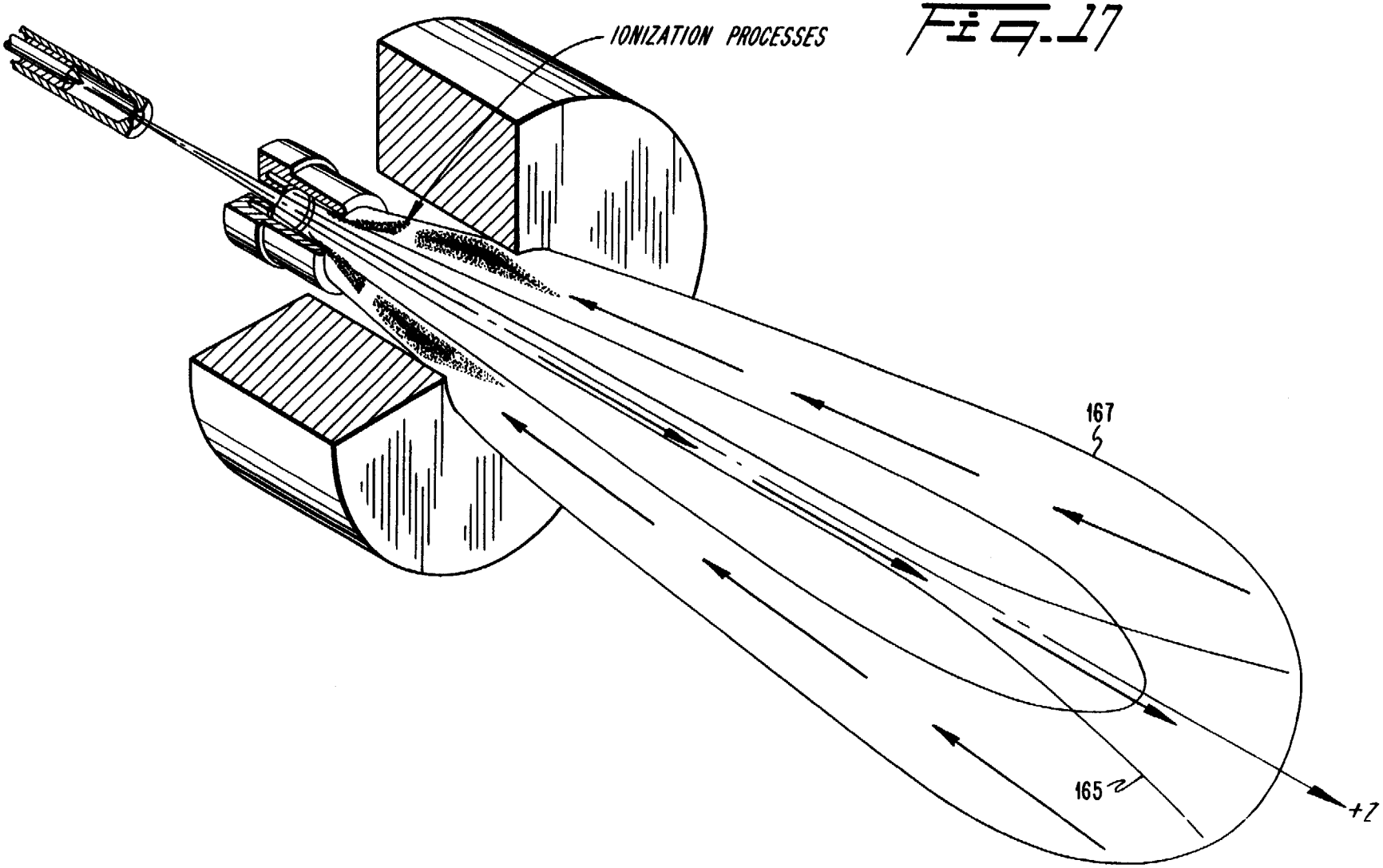
FIGS. 17–19 show schematic representations of the flow paths for atoms, electrons and ions with FIG. 19 being a cross sectional view along the line 19—19 of FIG. 18.
Figure 19:
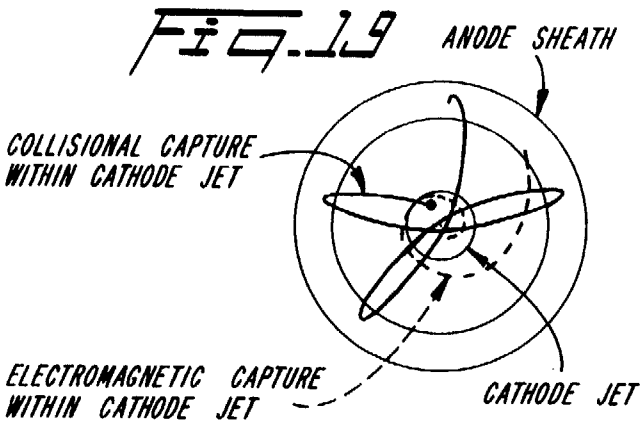
Figure 18:
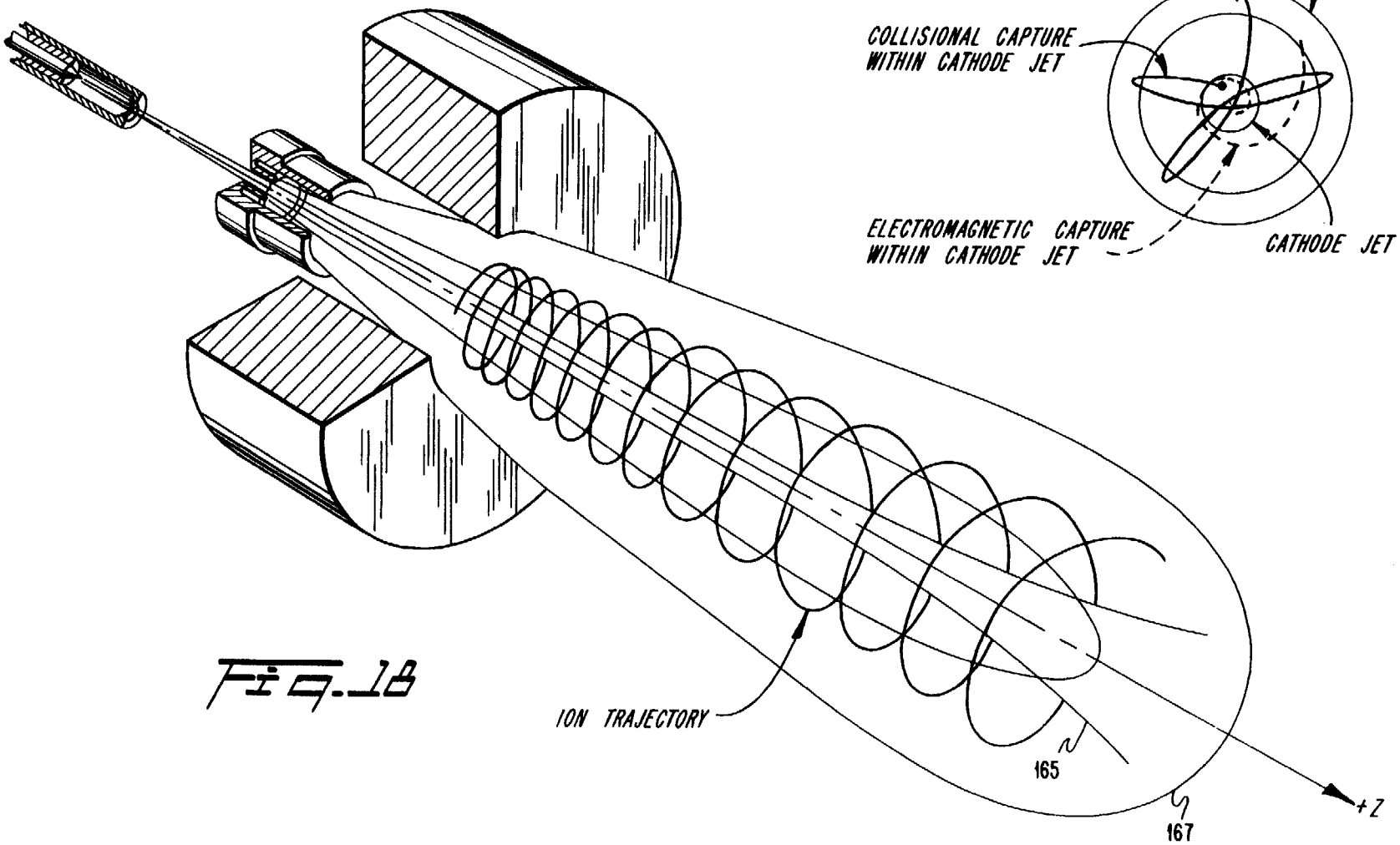
Figure 20:
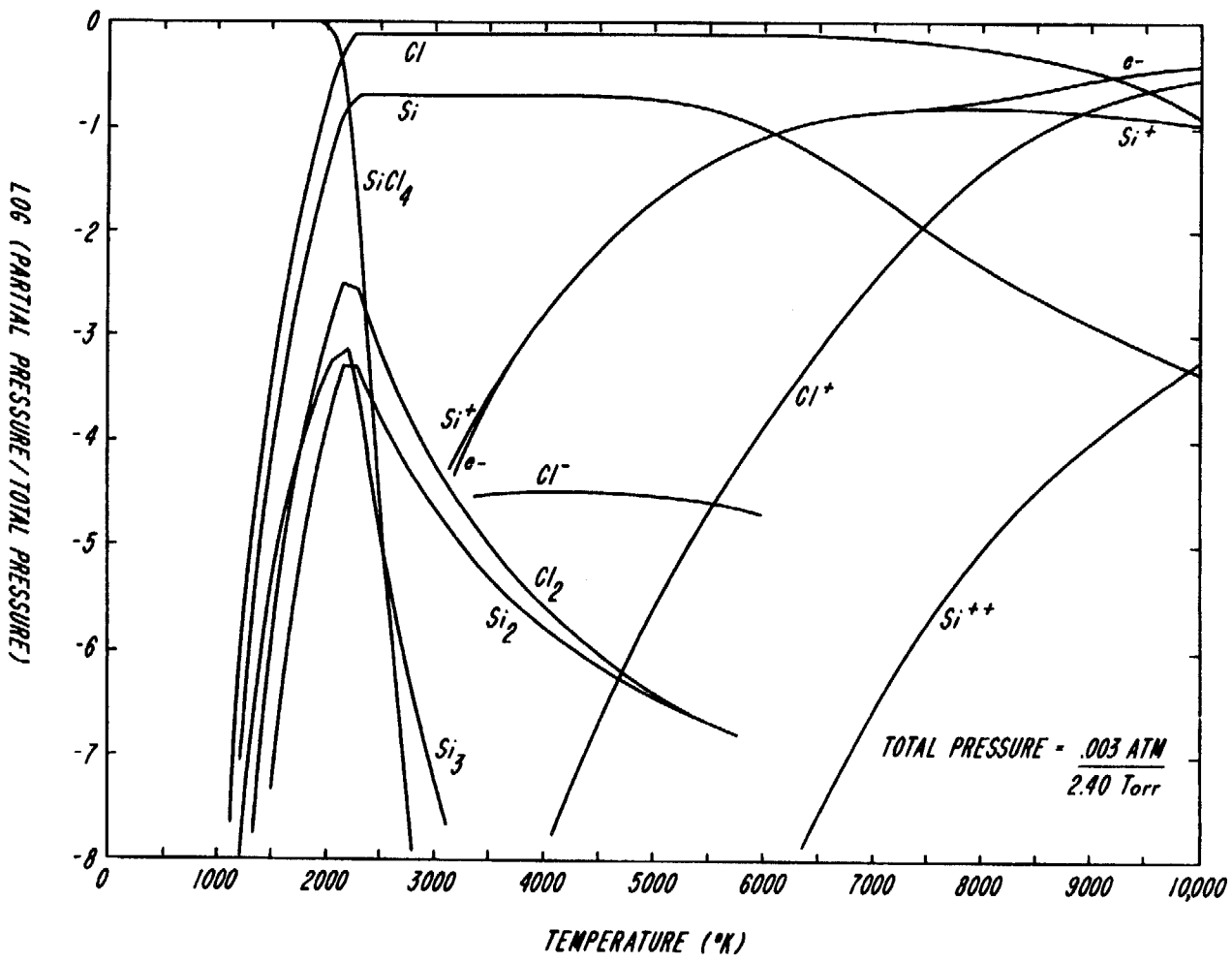
FIG. 20 shows a graph of species concentration ratios for decomposing $SiCl_4$.

FIGS. 17–19 show schematically the flow paths of all three species of particles; atoms, ions and electrons.

The magnetoplasmadynamic plasma processor described hereinabove is by no means a "conventional" plasma generator. From the previous sections it can be seen that great sophistication in technology and an equally deep understanding of plasma physics has been required to design and successfully operate this device. Some of the unique design and operational features are sunimarized below:

(1) The thermionic cathode must be buffered. (2) The orifice diameter in the buffer, the type and flow rate of the gas through this component must all be chosen to match the operational requirements of the device. This gas flow may be inert material (helium or argon), or it may contain material relevant to the accomplishment of the objectives of the device, e.g., a gas containing dopant materials for a semiconductor material which is injected through the anode.

It is suggested that, in general, the flow rate through this buffer electrode is usually less than 1/10th that injected through the anode.

(3) Adequate gas swirl must be established and maintained in this gas flow.

(4) The strength and configuration of the magnetic field near the gas cathode tip 117 must be tailored to match the geometry; otherwise cathode-to-buffer sborting and/or unstable cathode attachnient can occur.

(5) Ttie upstream isolator discs 125a–i niust be very precisely designed and positioned to accomplish the required vacuum electrical insulation between the anode and upstream structure.

(6) All plasma upstream of the anode must be electromagnetically confined in the cathode jet, predominantly by pinch forces. The plasma in this region follows magnetic field lines fairly closely. If, however, as the plasma flows downstream it encompasses more magnetic field lines, then an azimuthal velocity will be induced in the plasma. The spin direction of the injected gas must be in the same direction as the electromagnetically induced spin, e.g., if the axial component of the applied magnetic field points in the downstream direction form the cahtode tip 117, then the spin direction will be clockwise looking downstream.

(7) The anode-ionizer combination 127, etc., is extremely sophisticated as to shape and functions:

(a) it represents the best compromise between mechanical and electromagnetic confinement in order to get high mass utilization, i.e., ionize a high percentage of the material injected thru the anode 125 which one wants to ionize in order to accomplish the objectives of the processor.

(b) fine-tuning of the solenoidal magnetic field near the anode 127 is required to maintain the attachment point of the discharge on the correct lip 129.

(c) the gap between the discharge 157 (anode sheath) and the gas containnient cylinder must be optimized.

(d) the gas spin velocity at injection must be as high as possible.

(e) the correct amount of gas must be injected thru the anode to insure that the desired mode of operation is achieved, e.g.:

(i) single ionization of only one species
(ii) single ionization of more than one species
(iii) multiple ionization of only one species
(iv) multiple ionization of more than one species
(v) erosion of anode material if desired
(vi) ionization and entrainment of ambient gas if desired
(vii) other This is acconiplislied by reference to the equation for critical mass flow rate $$(mj)_{cr} = \frac{\dfrac{B_A I(R_A - R_c^1)}{} + \dfrac{\mu_o I^2}{4\pi}\left(\dfrac{3}{4} + \ln\dfrac{R_A}{R_C}\right)}{\left\{\dfrac{2|e|}{I}\left(V_r + V_D^1 + \sum_i (V_i)_i\right)\right\}} \quad 84$$

Figure 23:
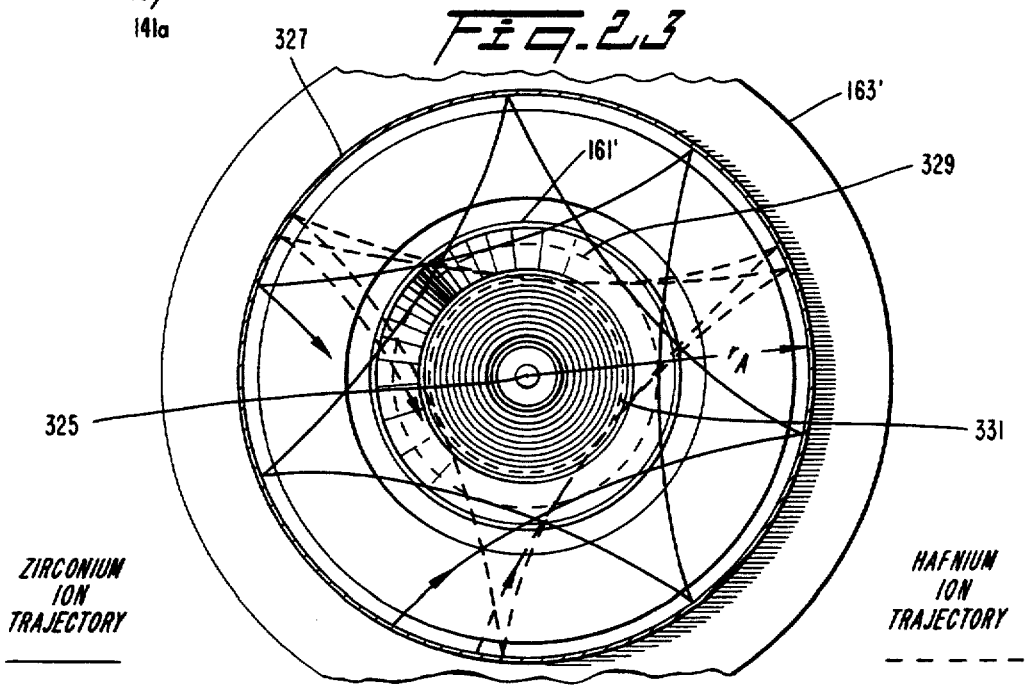
FIG. 23 shows a cross-sectional view of the processor of FIG. 22, showing how the differing ion trajectories enable separation to occur.

(8) It is essential that the major component of the working fluid be injected through the anode 127 through conduit 141, so that the ions, once formed, take up the cycloidal motion illustrated in FIGS. 18 and 23 under the combined action of the radial electric and axial magnetic fields.

(9) If the magnetic field is made to diverge (even slightly) downstream of the anode 127, the "oscillating" ions produced in the anode sheath will be eletromagnetically accelerated axially and move slowly downstream. The magnetic field must be contoured to achieve the desired downstream velocity of these ions. As the ions move radially and azimuthally, they pass through the outer layer of the cathode jet, which consists initially only of cold ions (ionized material from the cathode-buffer). Elastic collision can occur between the oscillating ions and the ions and electrons in the cathode jet. Elastic collisions between the oscillating ions and the "cool" cathode jet ions can result in capture of the oscillating ions inside the cathode jet. Conservation of angular niomentum requires that the spin velocity of the material in the cathode jet increase as more oscillating ions are captured. This rate of transfer of ions from the anode sheath to cathode jet represents a flow of electric current. This "ion current" can carry a significant fraction of the total discharge current between the anode sheath and the cathode jet; however, enough electron current must cross from the cathode jet over to the anode sheath to supply the high energy electrons needed to ionize the atoms of working fluid in the anode region and extended anode sheath.

(10) Downstream of the "electromagnetic throat" the plasma flow path 169 is determined by the magnetic field strength and shape and the plasma velocity. This is, however, not a conventional thermal plasma, where the energy resides primarily in the thermal motion as defined by a temperature. Typical plasma temperatures are 6000° K. to 40,000° K. The plasma that exits from the electromagnetic throat has the following characteristics:

(a) The ions and electrons have a high spin velocity and a comparable axial velocity.

(b) The ion temperature is less than 4000° K.

(c) The electron temperature may be anywhere between 6000° K. and 100,000° K. immediately downstrcain of the electromagnetic throat.

(d) The electron pressure will be high at the electromagnetic throat and the electrons will try to expand axially downstream. In doing so they set up an electric field which accelerates the ions. In this way the electron internal energy is transferred into axial kinetic energy on the ions. Also, if the diameter of the plasma beam expands, i.e., the magnetic field diverges, rotational ion energy transfers over to axial ion energy in order to converve angular momentum. Hence by a proper choice of the target position and of the magtictic field contour one can control at the target:

(i) the electron temperature (ii) the axial ion velocity (iii) the azimuthal ion velocity (iv) the beam cross-sectional area and hence (v) the mass flux density, the momentum flux density and the heat flux density.

This is the only plasma device known to the inventor that permits such precise control of the total particle energy as well as of mass, momentum and energy flux rates at a target or substrate surface.

(11) The distance between the anode-ionizer office 158 and the positioning where the current terminates (electromagnetic throat 144) is given approximately by:

$$L = \frac{\Phi_A^2(\sigma kT)_{avg.}\left(\frac{m}{m_a} + \frac{I}{|e|}\right)}{8\pi(p_a\pi R_c^2)} \qquad 85$$

where $\phi = \pi R_A^2(B_z)_A$ $R_A$ = inner radius of anode.

$(B_z)_A$ = average strength of the axial magnetic field at the anode.

$\sigma$ = electrical conductivity of the gas in the cathode jet.

k = Boltzman's constant

T = Gas (electron) temperature m = mass flow rate in the cathode jet.

$m_a$ = mass of atome of gas flowing in the cathode jet.

I = current flowing thru the cathode jet.

e = charge in the electron.

$$P_a\pi R_c^2 = m\sqrt{\gamma\frac{2kT}{m_a}} \qquad 86$$

Typical values for the above quantities could be:

$$\phi_A = \pi \times (2 \times 10^{-2})^2 \times .1 = 1.26 \times 10^{-4}$$

$$\sigma kT = 20{,}000 \times 1.38 \times 10^{-23} \times 10^5 = 2.76 \times 10^{-14}$$

$$\frac{m}{m_a} + \frac{I}{|e|} = \frac{3 \times 10^{-6}}{1.67 \times 10^{-27}} + \frac{3 \times 100}{1.6 \times 10^{-19}} = 3.672 \times 10^{21}$$

$$pa\pi R_c^2 = 3 \times 10^{-6}\left(\frac{2 \times 1.38 \times 10^{-23} \times 10^5}{1.67 \times 1.67 \times 10^{-27}}\right)^{i} = 9.438 \times 10^{-2}$$

$$L = \frac{(1.26 \times 10^{-4})^2 \times 3.672 \times 10^{21} \times 2.76 \times 10^{-14}}{8\pi \times 9.43 \times 10^{-2}} = .674 \text{ meters} = 26.5 \text{ inches}$$

If the magnetic field were increased from 1000 gauss to 2000 gauss, the distance L would increase to 106 inches.

The following table defines the axial, radial and tangential forces generated in the inventive device.

TABLE 4

| | |
|---|---|
| Radial Forces: | |
| (1) $B_z j_\theta$ | These forces result in pressures which serve to confine the jet to a narrow beam and, by reaction against the electrodes, to produce useful thrust. |
| (2) $B_\theta j_z$ | |
| Tangential Forces: | |
| (1) $B_z j_r$ | These forces induce the azimuthal Hall currents. |
| (2) $B_r j_z$ | |
| Axial Forces: | |
| (1) $B_\theta j_r$ | This is the self-magnetic field pumping force. |
| (2) $B_r j_\theta$ | This force results from the interaction of the Hall currents with the magnetic nozzle. Both axial forces serve to accelerate the plasma. |

Figure 24:
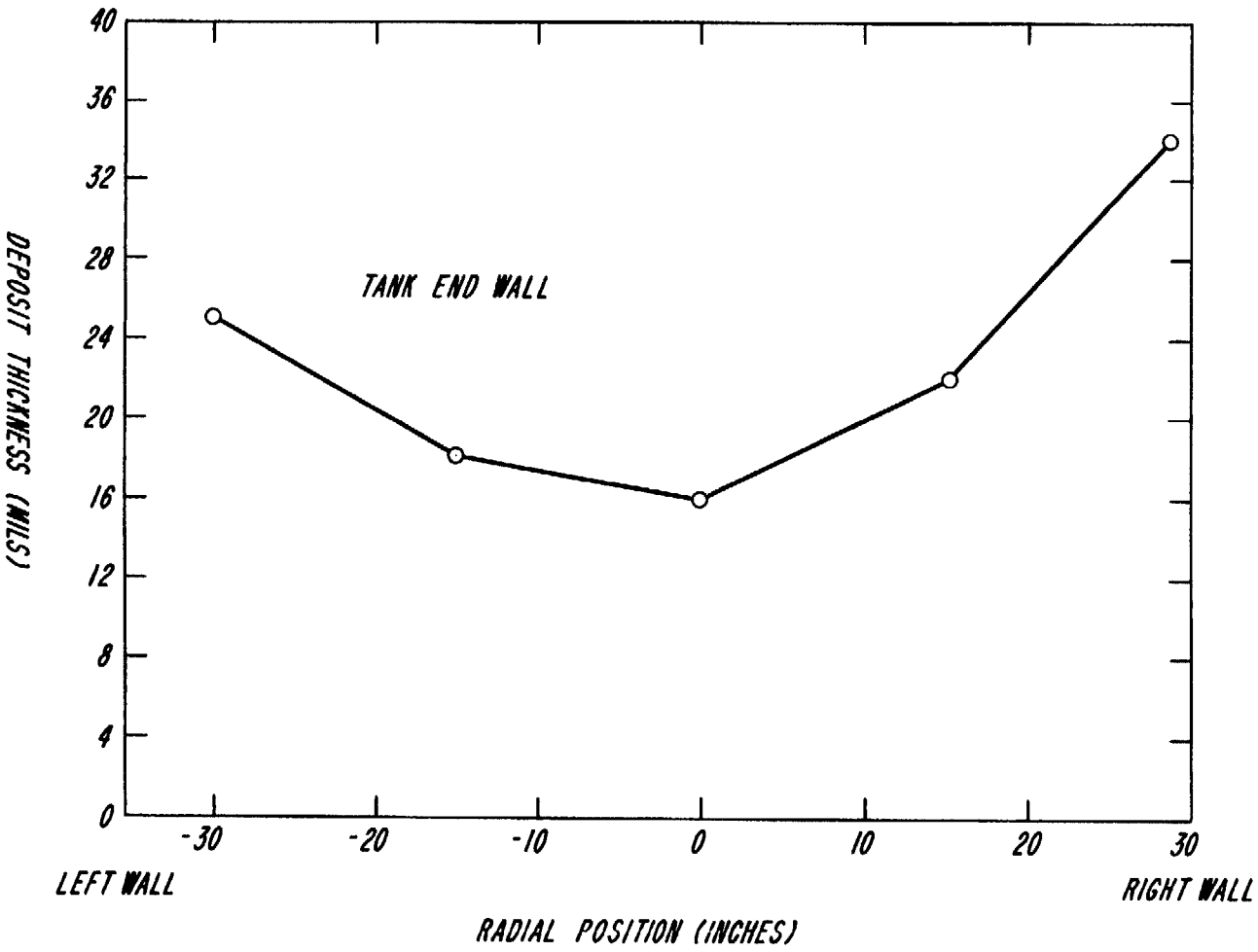
FIG. 24 shows a graph of deposit thickness versus radial position for a collector of approximately one square meter in area mounted downstream of the processor.

FIG. 24 is a graph showing the film thickness deposited on the processor collector several meters downstream of the processor as a function of the radial position from the center line of the collector. FIG. 24 indicates that a fairly uniform film can be deposited over a surface area of 60 inches diameter (1.82 square meters).

Table 5 shows data taken from a test of a lithium thruster device according to the invention.

TABLE 5

| Point No. | T gram | m mg/sec | $I_{sp}$ sec | $P_t$ $10^{-4}$ torr | $I_A$ amp | $V_A$ volt | $P_A$ kW | $P_{mag}$ kW | $P_{c+b}$ kW | $P_{an}$ kW | * $\eta_{TH}$ | ** $\eta_F$ | *** $\eta_o$ |
|---|---|---|---|---|---|---|---|---|---|---|---|---|---|
| Run 732 (contd) | | | | | | | | | | | | | |
| 85 | 24.0 | 5.68 | 4225 | (1.0) | 300 | 56.0 | 16.80 | 3.18 | 4.97 | | 0.556 | 0.290 | 0.244 |
| 86 | 24.9 | 5.68 | 4383 | — | 300 | 56.0 | 16.80 | 3.18 | 5.04 | | 0.552 | 0.312 | 0.262 |
| 87 | 25.2 | 5.68 | 4430 | 2.4 | 302 | 57.0 | 17.21 | 3.20 | 5.00 | | 0.558 | 0.312 | 0.263 |
| 88 | 26.9 | 5.66 | 4752 | (1.1) | 300 | 54.5 | 16.35 | 3.18 | 4.68 | | 0.617 | 0.375 | 0.314 |
| 89 | 31.0 | 5.67 | 5467 | 0.9 | 300 | 53.5 | 16.05 | ↑ | 4.57 | | 0.615 | 0.507 | 0.423 |
| 90 | 24.5 | 5.67 | 4320 | 2.1 | 300 | 56.0 | 16.80 | | 5.20 | | 0.548 | 0.302 | 0.254 |
| 91 | 24.3 | 5.66 | 4293 | 2.0 | 300 | 56.2 | 16.86 | | 5.20 | | 0.552 | 0.297 | 0.250 |
| 92 | 24.3 | 5.65 | 4300 | 2.2 | 300 | 56.3 | 16.89 | | 5.30 | | 0.541 | 0.297 | 0.250 |
| 93 | 24.1 | 5.65 | 4265 | 2.1 | 302 | 56.3 | 17.00 | | 5.28 | | 0.547 | 0.290 | 0.244 |
| 94 | 24.8 | 5.65 | 4389 | 2.1 | 303 | 55.7 | 16.88 | | 5.26 | | 0.536 | 0.309 | 0.260 |
| 95 | 23.7 | 5.66 | 4187 | 2.1 | 303 | 56.0 | 16.97 | ↓ | 5.19 | | 0.549 | 0.281 | 0.236 |
| 96 | 23.3 | 5.66 | 4098 | 2.1 | 303 | 54.5 | 16.51 | 3.18 | 5.08 | | 0.545 | 0.276 | 0.232 |
| 97 | 22.8 | 5.06 | 4028 | 2.1 | 304 | 55.0 | 16.72 | 3.20 | 5.08 | | 0.548 | 0.264 | 0.221 |
| 98 | 22.5 | 5.66 | 3975 | 2.1 | 302 | 54.5 | 16.46 | 3.15 | 5.08 | | 0.541 | 0.261 | 0.219 |
| 99 | 22.2 | 5.65 | 3929 | 2.0 | 302 | 55.5 | 16.76 | 3.15 | 5.26 | | 0.537 | 0.250 | 0.210 |
| 100 | 21.7 | 5.65 | 3840 | 2.0 | 303 | 55.7 | 16.88 | 3.15 | 5.13 | | 0.548 | 0.237 | 0.200 |
| 101 | 21.6 | 5.65 | 3823 | 1.9 | 303 | 55.7 | 16.88 | 3.18 | 5.17 | | 0.547 | 0.235 | 0.198 |
| 102 | 22.3 | 5.65 | 3946 | 2.0 | 303 | 56.2 | 17.03 | 3.15 | 5.24 | | 0.546 | 0.248 | 0.209 |

*Thermal efficiency not including magnet power
**Thrust efficiency not including magnet power
***Thrust efficiency not including magnet power In Table 5, the columns of data are defined as follows:

T = thrust in grams
m = mass flow rate in milligrams/sec.
$I_{sp}$ = specific impulse in sec.
$P_t$ = chamber pressure
$I_A$ = current of the discharge
$V_A$ = potential drop across the discharge
$P_A$ = electrical power of discharge
$P_{mag}$ = electrical power in the magnets
$P_{c+b}$ = power loss from the cathode and buffer
$P_{an}$ = power loss from the anode
$\eta_{th}$ = thermal efficiency
$\eta_f$ = thrust efficiency excluding magnet power
$\eta_o$ = thrust efficiency including magnet power Referring to FIG. 21 where like elements (with respect to FIGS. 11–13) have like primed reference numerals, a further embodiment of plasma processor 200 includes cathode 105' including orifice 111', anode 127' including ring 129' and cylindrical portion 131'. Between the cathode 105' and anode 127' are mounted a series of discs 125'a–c which in toto comprise an upstream vacuum insulator/isolator 125'. A single magnet 224 is shown surrounding the cathode 105' and anode 127', however, if desired, magnets corresponding to the magnets 123, 153 of the FIGS. 11–13 embodiment may be employed. Downstream of anode 127' are mounted vacuum insulator/isolator members 161'a–l which comprise a series of truncated conical members. Surrounding the members 161' are toroidal ion pump cathodes 272 and anodes 274 which are in turn surrounded by toroidal electromagnets 163'a–f shown mounted outside chamber 119' but mountable therewithin, if desired. The electromagnets 163' perform two functions: (1) they confine the plasma beam to a desired configuration, and (2) they act in conjunction with cathodes 272 and anodes 274 to pump material from the beam 270 which the operator wishes to separate from the beam. Reference numeral 250 refers to the substrate where the beam 270 is concentrated while 252 and 254 are substrate shields. As shown, conduits 282, 284 and 286 supply coolant to substrate 250 while cylindrical member 288 comprises a radiation shield for substrate 250.

In operation, this enibodiment is designed specifically for separating 2 or more species. The ionization potential of one being significantly lower than that of the others. Further, the species with the low ionization potential must be condensible as a solid on the collector (250). The collector is maintained at a temperature which ensures condensation and keeps the vapor pressure of this condensate below $10^{-2}$ Torr through appropriate cooling pipes (282) (284) (286) and shield 288. The other component (materials with higher ionization potentials) are pumped from the system using combinations of ion pumps, (163) (272) (274) and mechanical pumps (290, 292, 294, and 296).

To ensure good separation the following conditions must be met:

(1) The mass flow rate of the low ionization potential component must be equal to or slightly greater than the critical mass flow rate for single ionization.

(2) This material must be injected through the anode-ionizer (127 which is designed so that most of the molecules are dissociated and the atoms of this component are ionized inside of the anode-ionizer structure. This is accomplished by inelastic collisions between the molecules and atoms and high energy electrons in the anode sheath (167).

(3) In order to obtain as high a residence time (defined as the time during which the atom or molecule remains within the outer cylindrical portion 131') as possible, the material is injected with as high an azimuthal velocity as is possible.

(4) The ionized material will be electromagnetically confined to the plasma beam (270) and pass through the electromagnetic throat.

(5) The parameters of the processor and facility must be chosen to position this electromagnetic throat (using eq. 85) at the desired axial location.

(6) Once the unionized atoms and molecules exit the anode orifice (158'), their angular momentum will send them on radial trajectories toward the ion and mechanical pumps thru the downstream isolator/insulator segments 161'.

(7) These atoms and molecules are removed from the ambient by the ion and mechanical pumps.

(8) The ionized material is deposited on the target/substrate. This material may be collected in any of the following forms:

(i) bulk material (ii) thin films of any desired crystallinity, e.g. single crystal, polycrystal, amorphous.
(iii) wafers of any desired crystallinity, e.g. single crystal, polycrystal, amorphous.
(iv) coatings on simple or complicated shapes.
(v) thick films on some dissolvable or otherwise removable substrate so as to form simple or complicated self-supporting structures once the substrate is dissolved or removed In practice, most metals and semiconductors have low ionization potentials (5 to 10 electron volts) and gases. e.g. hydrogen, chlorine, nitrogen, etc. have high ionization potentials (12–18 electron volts). The magnetoplasmadynamic processor thus provides a means for separating metals from many of their compounds. The major restriction on the compound is that it must be capable of being fed through the anode in fluid or gaseous form. The magnetoplasmadynamic processor used in this implementation can, in many cases, provide a less expensive and faster alternative to:

(i) electro-deposition
(ii) vapor deposition.
(iii) chemical vapor deposition.
(iv) production of semiconductor wafers by any existing technique.

Figure 21:
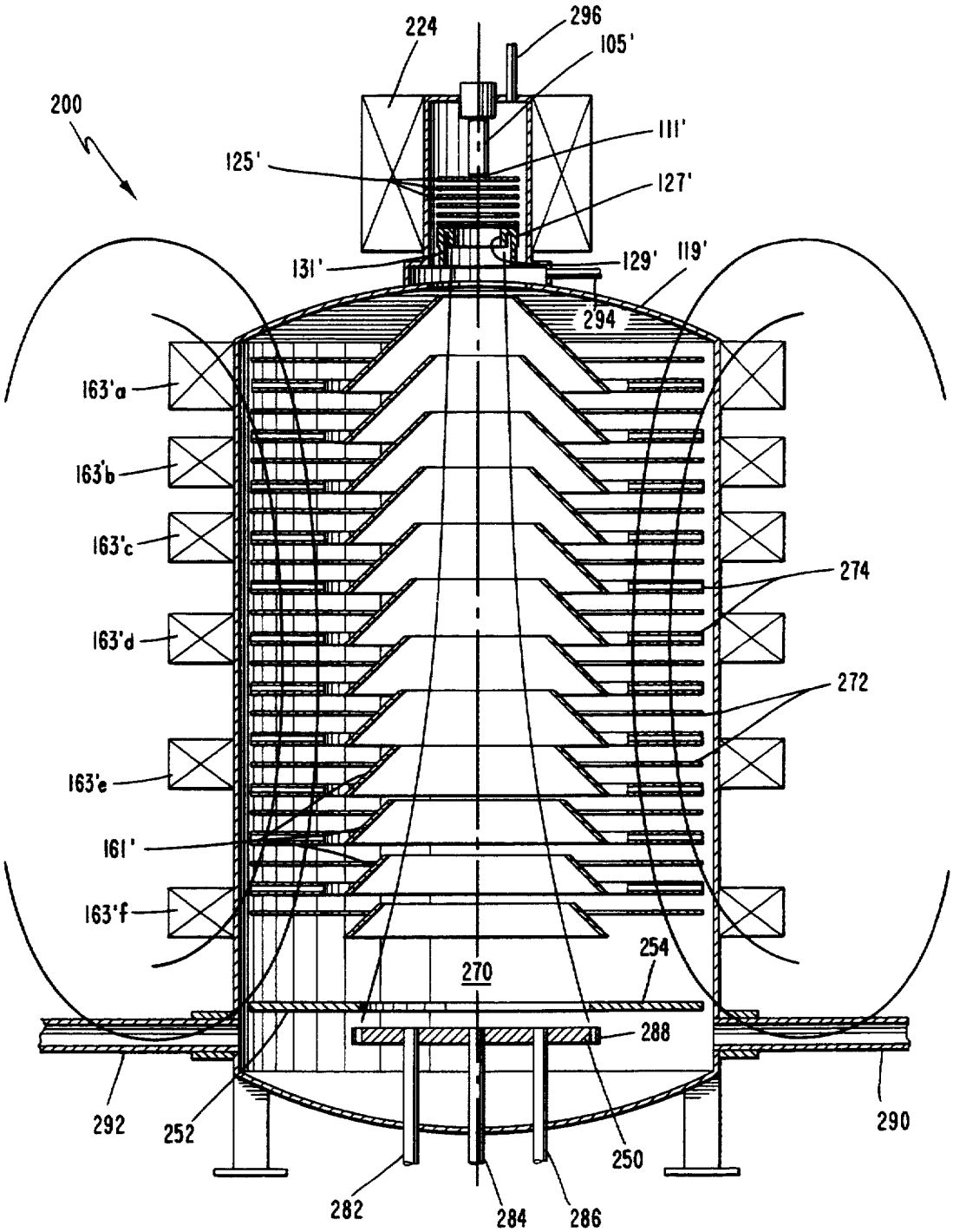
FIG. 21 shows an embodiment of processor particularly adapted to process silane feedstock, and shown with deposition target.

The implementation shown in FIG. 21 is best suited to separating metals or semiconductors from hydrides. An implementation using the cryogenic pumps shown in FIG. 8, rather than the ion pumps of FIG. 21 would be better suited for separating metals or semiconductors from halide compounds. A partial listing of materials that can be fed thru the processor as hydrides or chlorides as shown in Table 6. The melting point and boiling point of these compounds are also shown in the Table, indicating that it is feasible to feed the compounds thru the processor as fluids. The first ionization potential of the metallic or semi-conductor components, as well as those for hydrogen and chlorine are also shown in the table. These values show that significant differences exist between the ionization potential of the carrier material and that of the material to be deposited, thus permitting separation by the processor.

When high purity of the deposited material is required as many component parts of the processor as is feasible should be made from the material which is to be deposited. For instance, if silicon is to be deposited, the anode parts, the buffer electrode and the isolator segments should all be fabricated from or coated with pure silicon.

The processor and facility must be designed to obtain the desired mass, energy and momentum flux at the target/substrate. When this is done, the desired thermal processing of the depositing layer can be achieved; e.g.

(i) self annealing
(ii) inter difrusion of two or more substances.

Partial listing of materials that can be injected as chlorides or hydrides:

TABLE 6

| Material | Melting Point | Boiling Point | Metallic Ionization Potential Component |
|---|---|---|---|
| $Ga\ Cl_3$ | 77.9 | 201.3 | 5.999 |
| $As\ Cl_3$ | −8.5 | 130.2 | 9.81 |
| $Ge\ Cl_4$ | −49.5 | 84 | 7.899 |
| $Mg\ Cl_2$ | 714 | 1412 | 7.646 |
| $Mo\ Cl_5$ | 194 | 268 | 7.099 |
| Nb Cl | 264.7 | 254 | 6.88 |
| $PA\ Cl_2$ | 6.05 | d 581 | 9.0 |

TABLE 6-continued

| Material | Melting Point | Boiling Point | Metallic Ionization Potential Component |
|---|---|---|---|
| $Re\ Cl_4$ | | 500 | 7.88 |
| $Si\ Cl_4$ | −70 | 57.6 | 8.151 |
| $Ti\ Cl_4$ | −25 | 136.4 | 6.82 |
| $W\ Cl_5$ | 248 | 275.6 | 7.98 |
| Cl | | | 12.967 |
| $B_2\ H_6$ | −165.5 | −92.5 | 8.298 |
| $As\ H_3$ | −116.3 | −55 | 9.81 |
| $Ga_2\ H_6$ | −21.4 | 139 | 5.999 |
| $Ge\ H_4$ | −165 | −88.5 | 7.899 |
| $P\ H_3$ | −133 | −87.7 | 10.486 |
| $Si\ H_4$ | −185 | −111.8 | 8.151 |
| H | | | 13.598 |

Many materials can be injected thru the processor as vapor, produced in a refractory metal boiler. In this case, the processor components should be fabricated from refractory metal materials or high melting point metallic or semi-conductor materials that do no react with the working fluid, A partial listing of materials than can be fed thru the processor in this manner is shown in Table 7. When the processor is operating in this mode, the ion and mechanical pumps act to pump any residual gases or other volatile components from the ambient.

As before, the material can be deposited in any of the following forms.

(i) Bulk material.
(ii) thin films of any desired crystallinity, e.g. single crystal, polycrystal, amorphous.
(iii) wafers of any desired crystallinity, e.g. single crystal, polycrystal, amorphous.
(iv) coatings on simple or complicated shapes.
(v) thick films on some dissolvable or otherwise removable substrate so as to form simple or complicated self-supporting structures once the substrate is dissolved or removed.

TABLE 7

Partial list of materials that can be injected thru the anode as vapor produced in a refractory metal boiler:

| | |
|---|---|
| Silver | Phosphorus |
| Arsenic | Lead |
| Barium | Rubidium |
| Bismuth | Sulfur |
| Calcium | Antimony |
| Cadmium | Selenium |
| Cesium | Samarium |
| Callium | Strontium |
| Potassium | Tellurium |
| Indium | Thallium |
| Magnesium | Thulium |
| Manganese | Ytterbium |
| Sodium | Zinc |

Injection techniques similar to that shown in FIG. 13 can be used to inject, simultaneously, two or more materials. These materials should bave comparable ionization potentials. Many semi-conductor materials can be formed in this manner. A partial listing is shown in TABLE 8.

Besides forming semiconductor compounds, many other types of compounds and/or mixtures can be formed by simultaneous injection of two or more elements thru the processor and creating the proper thermal environment at the target or substrate to obtain the desired reaction rates and inter diffusion rates.

Compounds and/or mixtures can also be produced at the target or substrate by depositing only one substance and creating the proper thermal environment for it to react or mix with the material of the substrate.

By properly controlling the beam dianicter, the size and number of radiation shields around the target, and the flow rate of coolant, the proper thermal environment can be obtained using only the energy flow rate from the depositing beam of plasma.

TABLE 8

Partial list of semi conductor compounds or elements that can be produced by injection of elements as vapors through the processor.

| | |
|---|---|
| Amorphous selenium | Se |
| Grey tin | Sn |
| Tellurium | Te |
| Cadmium sulfide | CdS |
| Cadmium selenide | CdSe |
| Cadmium telluride | CdTe |
| Gallium arsenide | GaAr |
| Lead sulphide | PbS |
| Lead selenide | PbSe |
| Lead teluride | PbTe |
| Zinc sulphide | ZnS |
| Gallium antimonide | GaSb |
| Indium arsinide | JnAs |
| Indium phosphate | InP |
| Indium antimonide | InSb |

Figure 22:
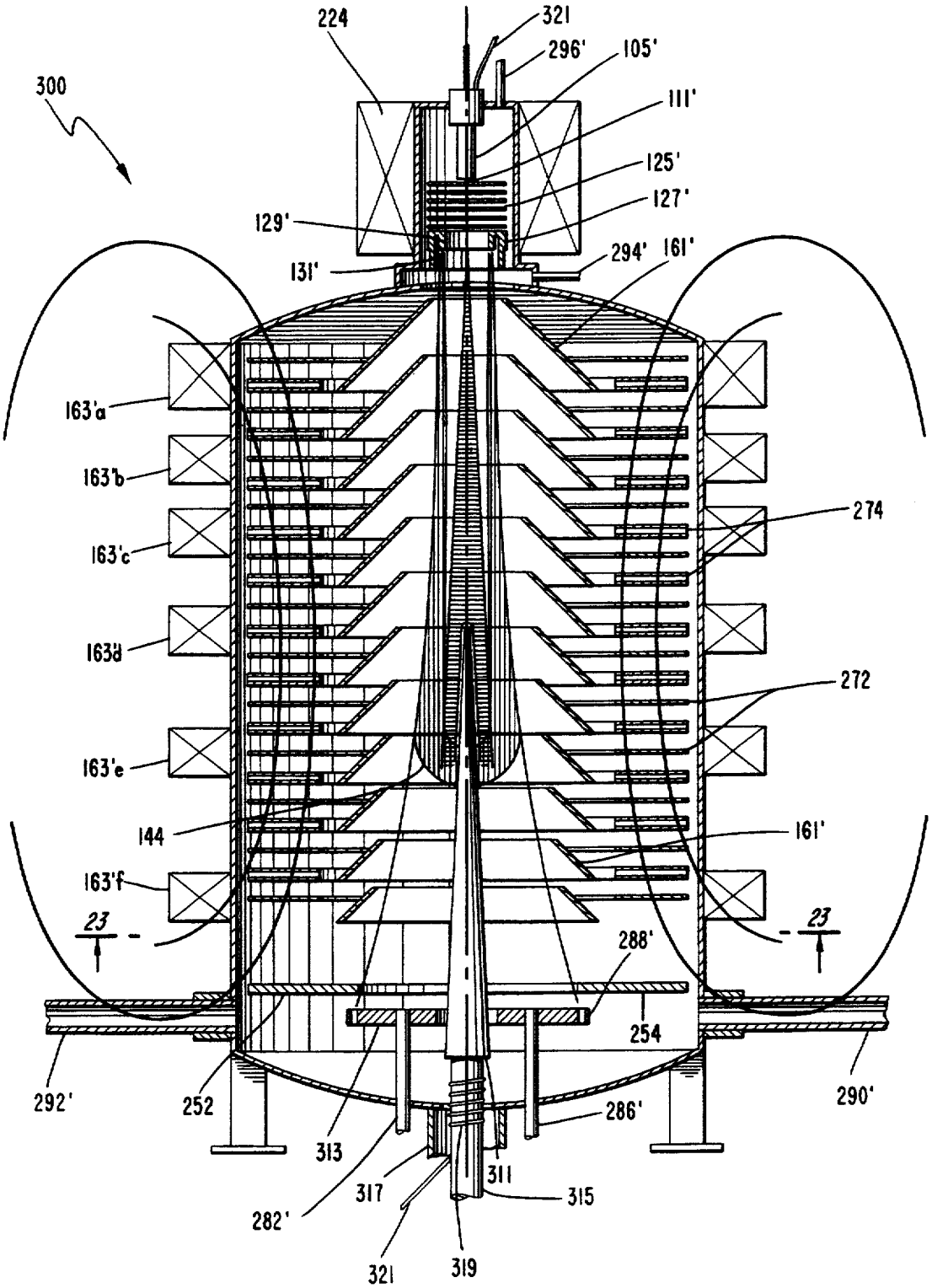
FIG. 22 shows a device similar to that shown in FIG. 21, shown with structure designed to separate ions of differing molecular weights.

The embodiments described in FIGS. 21–23 include a further feature in common, namely, they utilize three types of pumping means, mechanical, sorption and ion types to keep the vacuum chambers thereof free of undesired contamination. These vacuum pumping systems are further described as follows:

The type and capacity of vacuum pumping equipment for this invention will be dictated primarily by the physical and chemical properties of the elements or compounds to be used in the deposition process, their mass flow rate, and their relative temperatures. The prime candidates for deposition feed stock are the hydrogen and chloride compounds of silicon, so the separation and pumping schemes must be designed to effectively remove these from the process stream. The mechanisms and effectiveness of separation from silicon is treated elsewhere. The most effective means for pumping these two gases over and above mechanical means must involve different systems for each, due to their dissimilar properties.

1.HYDROGEN PUMPING

The mass flow rate of hydrogen that will be involved under various circumstances is well known. For vacuum systems design purposes, the inaximuin anticipated quantity may be approximated as follows: Taking the maximum deposition rate of silicon oil the substrate to be $10^4$or 1 $\mu$/s, the mass flow rate of silicon onto a substrate of 400 area (20 cm×20 cm) would be:

$$\begin{aligned} m &= Vpt^{-1} \\ &= (1 \times 10^{-4} \times 400)(2.33)\text{g/sec} \\ &= 0.1 \text{ g/sec.} \end{aligned} \tag{87}$$

Assume that the efficiency of utilization of the silicon would be 50%, i.e. one-half of the silicon mass wbich is fed through the anode will be effectively deposited onto the substrate. The anode mass flow rate of silicon is then 200 milligram/sec.

For the utilization of silane gas as the feed stock, the mass flow rates would be:

$$\begin{aligned} m_{SiH4} &= m_{Si}\left[1 + 4\left(\frac{1.008}{28.09}\right)\right] \\ &= 229 \text{ milligrams/second} \end{aligned}$$

and $$\begin{aligned} m_H &= m_{SiH4} - m_{Si} \\ &= 23 \text{ milligrams/second.} \end{aligned} \tag{88}$$

The pumping speed required for removal of the hydrogen will be dependent, among other things, upon the desired background pressure level to be maintained. Assuming a value of $10^{-5}$ Torr, the volumetric pumping speed would be:

$$\begin{aligned} l_{H2} &= \frac{p_1 m}{p_2 \rho_1} \\ &= \frac{(760 \text{ Torr})(23 \times 10^{-3} \text{ gm/sec})}{(10^{-5} \text{ Torr})(0.089 \text{ gm/liter})} \\ &= 20 \times 10^6 \text{ liter/sec.} \end{aligned} \tag{89}$$

This represents a very large and expensive pumping facility if typical ion pumps of commercial availability were to be used. Much more realistic facility requirements can be established by selecting lower deposition rates and higher ambient operation pressure levels. For example, deposition of $10^2$ Å/sec and operation at $10^{-4}$ Torr would reduce the hydrogen speed demand by three orders of magnitude, or to 20,000 liters/sec.

Commercially available pumps, such as the Perkin-Elmer Ultek Hydrogen 500 units can handle over 800 liters/second of hydrogen at $10^{-4}$ Torr. The lower values of hydrogen could then be managed with 25 of these units. Long term operation at $10^{-4}$ Torr is not recommended, however, and other methods of solution are to be examined. For example, very significant advantages could be gained if the hydrogen density were increased before ion pumping by lowering the temperature. Stainless steel shrouds which are cooled by liquid nitrogen could be used to effect pumping speed gains roughly in proportion to the ratio of the absolute hydrogen temperatures at absorption and subsequent evaporation from those surfaces. Structure similar to this is shown in the embodiment of FIGS. 8–10

An inherent feature of the MPD device, that might be efficiently utilized for ion type vacuum pumping, is the axial magnetic confining field. This field is nominally about 2000 gauss or 0.2 webers/m$^2$, which coincides with the typical field strength used in commercial ion pumps. The application of this existing axial magnetic field to ion pumping involves the placement of anode 274 and cathode 272 rings directly inside the test chamber, stacked alternately along the axis of the chamber. The plates would then intersect the applied axial flux lines, in the same manner as commercial ion pumps, with the noteable advantage of very large cathode collecting surfaces (or noncathode collecting surfaces in the case of a tripod pump design) and "free" magnetic fields. It would seem to be possible by careful design to achieve one to two orders of magnitude improvement by this method versus the exterior attachment through ports of a comparatively few commercial ion pumps to the chamber. This custom ion pump concept is illustrated in FIGS. 21-22.

Alternate methods of pumping include cryogenic and cryosorption. Both methods involve collection of the gas on cold surfaces, such as the shroud-like insulator-/isolators 161 shown in FIGS. 21-22 but with considerable differences in their effectiveness for various compounds. Cryogenic pumping is generally a continuous, nonsaturating process which is limited chictly by the thermal conductivity of the accumulated condensate over the cold surface. Cryogenic pumping speed is primarily a function of the surface area, condensation coefficient and kinetic impingement rate. The condensation or capture coefficient is a function again of particle impingement rate and temperature, and the surface temperature and coverage. The process is most effective for supersaturated vapors.

Cryosorption pumping is obtained by the trapping of gases in absorbent materials at cold temperatures. The process is most effective for permanent gases and unsaturated vapors. Porous adsorbent materials are used since the trapping process requires a fresh site for each trapped particle, hence large surface areas are necessary to prevent saturation of the pump. Typical adsorbent materials are activated charcoal, activated alumina, silica gel and alkali metal sieves. Materials especially recommended for hydrogen range from charcoal to palladium sieves.

The only coolant which is effective for cryosorption of hydrogen is liquid helium. Unfortunately, helium has a low latent heat of vaporization (0.9 calories per cc), and is expensive, relative to $LN_2$. The recovery of helium gas after flowing through the cryosorption shrouds is both highly desirable and feasible. On-site recompression units are commercially available.

CHLORINE PUMPING

One of the most economical sources of silicon for this process is silicon tetrachloride. The design requirements for vacuum pumping to remove the chlorine gas from the process stream after dissociation in the anode can be approached with the same initial assumptions as for hydrogen, i.e., D.R. $= 10^4$ Å/second $A_{ss} = 400\ cm^2$ $m_{Si} = 100$ mg/sec @ substract $m_{Si} = 200$ mg/sec through anode The mass flow rate of silicon tetrachloride then would be:

$$m_{SiCl_4} = m_{Si}\left[1 + 4\left(\frac{35.45}{28.09}\right)\right] = 1.21 \text{ grams/second} \quad (90)$$

$$m_{Cl} = m_{SiCl_4} = m_{Si} = 1 \text{ gram/second}$$

The pumping speed at standard temperature conditions when operating the chamber at $10^{-5}$ Torr pressure would be:

$$V_{Cl} = \frac{p_1 m}{p_2 \rho_1} = \frac{(760 \text{ Torr})(1 \text{ g/s})}{(10^{-5} \text{ Torr})(3.2 \text{ g/l})} = 24 \times 10^6 \text{ liters/second} \quad (91)$$

As with hydrogen, this rate is not practical for ion pumps. Reduction of the pumping demand could be considered by lowering the deposition rate, raising the ambient pressure, or cooling the chlorine prior to pumping.

Cooling to the temperature of liquid nitrogen shrouds, would be insufficient to obtain practical ion pumping speeds since only a fourfold increase in chlorine density could be effected by the temperature drop from the assumed 298° K. to 78° K.

This factor, combitied with the chemical incompatibility of chlorine and the common ion pump electrode materials, will dictate the use of cryogenic pumping when large amounts of chlorine are involvcd in the process chamber.

Previous considerations of this approach to cryogenic pumping of energetic chlorine indicate that a two-phase system will be desirable. The assumptions and calculations which led to this conclusion are repeated here with newly assigned values of mass flow rate:

$$\text{Impingment rate/area} = \frac{n v m_{Cl}}{4} = \frac{2}{\pi}\ \frac{p_t}{v_t} \quad (92)$$

$$\text{Evaporation rate/area} = \frac{2}{\pi}\ \frac{p_s}{v_s} \quad (93)$$

$$\text{Deposition rate} = \frac{m_{act}}{A \rho_{Cl}} \quad (94)$$

$$D.R. = \frac{2}{\pi}\left(\frac{p_t}{v_t} - \frac{p_s}{v_s}\right)\frac{1}{\rho_{Cl}} \quad (95)$$

The net heat flux rate to the surface can be expressed as:

$$q_s = \frac{m}{A}(h_t - h_s) - \frac{m_s}{A} h_s \quad (96)$$

From heat transfer considerations, $$q = K_{Cl}\frac{dT_s}{dT} \cdot \frac{dt}{dX_{F.S.}} = \frac{K_{Cl}}{D.R.}\ \frac{dT_s}{dt} \quad (97)$$

providing the shroud temperature, $T_w$, remains constant. Combining equations, $$\frac{dT_s}{dt} = \left(\frac{2}{\pi}\right)^2\left[\frac{p_t}{v_t}(h_t - h_s) - \frac{p_s}{v_s} h_s\right]\left(\frac{p_t}{v_t} - \frac{p_s}{v_s}\right)\frac{1}{K_{Cl}\rho_{Cl}} \quad (98)$$

The residual mass of chlorine in the tank will be $$\frac{d}{d_t}\left(\frac{Vp_t m_{Cl}}{KT_i}\right) = m_{Cl} - \frac{2}{\pi} A_s \left(\frac{P_t}{v_t} - \frac{p_s}{v_s}\right) \quad 99$$

With the assumption that the evaporation rate is small compared with the impingement rate, this can be written as $$m_{Cl} = \frac{2}{\pi} A_s \frac{p_t}{v_t} \quad 100$$

and the previous equation integrates to:

$$T_s - T_w = \left(\frac{m_{Cl}}{A_s}\right)^2 \left(\frac{h_t - h_s}{K_{Cl}\rho_{Cl}}\right) t \quad 101$$

Values for preliminary calculations are based on the assumptions that:

1. Chlorine atoms which form the background pressure are at the temperature of the anode, 2500° K.
2. Wall temperature can be maintained at the liquid nitrogen value of 78° K.
3. The energy change from anode temperature to condensation temperature will include:

| | |
|---|---|
| Dissociation energy | $6.78 \times 10^6$ joules/Kg |
| Latent heat of vaporization | $0.34 \times 10^6$ joules/Kg |
| Latent heat of fusion | $0.10 \times 10^6$ joules/Kg |
| Enthalpy increase for 2422° C. | $1.14 \times 10^6$ joules/Kg |
| Total | $8.26 \times 10^6$ joules/Kg |

4. Properties of solid chlorine:

Thermal conductivity, $K_{Cl} = 0.2$ watts/m$^2$ – °K.

Density, $\rho_{Cl} = 1560$ Kg/m$^3$
5. Mass flow rate of chlorine, per previous calculation $m_{Cl} = 10^{-3}$ Kg/sec
6. Ambient pressure required is $10^{-4}$ Torr, or converting.

$P_t = \frac{10^{-4}\text{ Torr}}{760\text{ Torr/Atmos}} \times 10^5$ Newtons/m$^2$/Atoms 0.0132 Newtons/m$^2$ The impingement velocity now can be calculated as $$\begin{aligned} v_t &= \left(\frac{8Kt}{\pi m_a}\right)^{\frac{1}{2}} \\ &= \left(\frac{8 \times 1.38 \times 10^{-23} \times 2500}{\pi 35 \times 1.67 \times 10^{-27}}\right)^{\frac{1}{2}} \\ &= 1226\ m/s \end{aligned} \quad 102$$

The pumping area required would be $$\begin{aligned} A_s &= \frac{\pi}{2} \frac{m_{Cl} v_t}{P_t} \\ &= \frac{\pi \times 10^{-3} \times 1226}{2 \times 0.0132} \\ &= 145 \text{ square meters} \end{aligned} \quad 103$$

The collection lifetime of the surface between shutdowns for condensate removal would be $$\begin{aligned} t &= \frac{T_s - T_w}{h_t - h_s} K_{Cl}\rho_{Cl}\left(\frac{A_s}{m_{Cl}}\right)^2 \\ &= \frac{100 - 78}{8.36 \times 10^6} \times 0.2 \times 1560 \left(\frac{145}{10^{-3}}\right)^2 \\ &= 17.26 \times 10^6 \text{ sec or 200 days} \end{aligned} \quad 104$$

The mitted capacity then is no problem. The power transtuitted to the pumping surface would be $$\begin{aligned} P &= m_{Cl}(h_t - h_s) \\ &= 10^{-3} \times 8.36 \times 10^6 \\ &= 8.36 \text{ kilowatts} \end{aligned} \quad 105$$

If only the latent heat of vaporization were to be utilized to absorb this power, $$\begin{aligned} P &= m_{N2} = \frac{8360 \text{ watts}}{2 \times 10^5 \text{ joules}/K_s} \\ &= 0.0418 \text{ Kg/sec or 3612 Kg/24 hour day} \end{aligned} \quad 106$$

The heat flux rate on the collecting surface would be $$\begin{aligned} q_s &= \frac{P_s}{A_s} \\ &= \frac{8360}{145} \\ &= 58 \text{ watts/m}^2 \text{ or } 0.0058 \text{ watts/cm}^2 \end{aligned} \quad 107$$

The conclusions drawn from these values are that the collector surface area is rather large, and the consumption of liquid nitrogen would be a major cost element. Quantatively, if the surface area needs were provided by stainless steel shrouds of 1.5 meters O.D. and 0.5 meters I.D., approximately 46 double-surfaced plates would be required.

The cost of liquid nitrogen in these quantities has been quoted (in gas) at $0.43 per 100 cubic feet. At 27,600 cubic feet per ton, the cost for 3612 kilograms/-day day would be about $470, if no gas salvage were to be made.

The two phase pumping system mentioned earlier would involve an intermediate surface to automatically cool the chlorine, prior to impingement and condensation on the liquid nitrogen-cooled shrouds.

The intermediate surface could be cooled, preferably to a temperature of a few hundred degrees Kelvin, by a relatively inexpensive liquid which possesses a good thermal capacity. The use of water would be most economic, if suitable design and operational care is taken to prevent both freezing by the $LN_2$ shrouds and boiling from the received beat flux.

To examine the feasibility of the water-cooled roughing shrouds, assume that a rather narrow range of water temperature is allowed, with inlet to the shrouds at 25° C. and flow rate adjusted to limit the exiting temperature to 50° C. The chlorine energy that is desired to be removed at this surface, through recombination and cooling, is the dissociation energy of $6.78 \times 10^6$ joules per kilogtam and the enthalpy increase from 348° k.

(based on an assumed temperature gradient across the stainless steel wall or 25° K., which can be iterated later by examining the heat flux and thermal conductivity) to 2500° K., at 471 joules per kilograin-°C., or $1.01\times10^6$ joules per kilogram. The energy to be removed then is $$P = m_{Cl}(h_l - h_s) \quad 108$$
$$= 10^{-3}\frac{\text{Kg}}{\text{sec}} \times 7.79 \times 10^6 \text{ j/Ks}$$
$$= 7.79 \times 10^3 \text{ joules per second}$$
$$= 7.79 \text{ Kilowatts}$$

The mass flow rate of water for a temperature rise of 25° C. and specific heat of $4.2\times10^3$ joules per kilograml/°C.

$$m_{H2O} = \frac{P}{C_p\Delta T} \quad 109$$
$$= \frac{7.79 \times 10^3 \text{ joules/sec}}{4.2 \times 10^3 \text{ joules/Kg °C.} \times 25° \text{ C.}}$$
$$= 0.074 \text{ Kg/sec}$$
$$= 74 \text{ grams/sec}$$

This flow rate of approximately 1 GPM is very easily achieved, and an order or two of magnitude increase is feasible if demanded.

To estimate the heat flux at the shroud wall, assume a simple cylindrical surface along the jet centerline, of 50 cm dia by 200 cm long.

$$q/A = \frac{7.79 \times 10^3 \text{ joules/sec}}{\pi \times 50 \times 200 \text{ cm}^2}$$
$$= 0.25 \text{ joules/cm}^2 \text{ sec}$$

which is a modest value. It is anticipated that the actual configuration of the shroud would consist of a number of truncated conical disks containing large center holes, spaced along the centerline so as to intersect the diffusing chlorine atoms and offer radial deflection and multiple impingement possibilities, for more effective cooling prior to final capture on the outer cryosurfaces.

The chlorine pumping concept then will be similar to the hydrogen configuration illustrated in FIGS. 21–22, with the notable substitution of water flow instead of $LN_2$ through the center chevron-shaped panels, and the use of liquid nitrogen cryosurfaces in the outer array, for chlorine pumping, in lieu of the special ion pumps or liquid helium cryosorption toroids which would be used for hydrogen.

A schematic representation of how to implement the axisymmetric mass spectrograph separation feature of the processor is shown in FIG. 22.

The plasma processor 300 shown in FIGS. 22–23 has essentially the same structure as the plasma processor 200 and corresponding elements are given corresponding reference numerals. The sole structure in the processor 500 differing from the processor 200 resides in the collection area. In particular, as shown in FIG. 22, the processor 300 includes a collector 311 for high molecular weight ions and a collector 313 for low molecular weight ions. With the addition of collector 311, coolant line 283 has been eliminated and the coolant passageways have accordingly been slightly modified.

Operationally several important new features are added.

(i) The parameters are adjusted so that a conical collector extends into the electromagnetic subsonic region of flow.

(ii) The conical collector electrode becomes part of the discharge circuit. It is connected to the negative terminal of a power supply, (not shown) the positive terminal of which is connected to the cathode. The potential of this power supply is adjusted so that only ions of the heavy component of the working fluid are collected on the cone.

(iii) The conical collector must be smaller in diameter than the cathode jet, so that electrotis from the cathode jet can meet the anode sheath and flow back toward the anode, ionizing the working fluid in the anode-ionizer region. In this case the electromagnetic throat becomes annular and occurs at an axial position well downstream of the tip of the conical collector. It must, however, be configured to be upstream of the plate used to collect the low molecular weight material.

In this application of the processor materials of comparable ionization potential but different molecular weights can be separated. An example would be separation of hafnium from zirconium. Separation of these materials by existing chemical, and metallurgical techniques is extremely difficult, and pure hafnium is almost impossible to obtain. The important parameters for separation of hafnium from zirconium are shown in Table 9.

| | Molecular Weight | Ionization Potential |
|---|---|---|
| Hafnium | 178.58 | 7.0 |
| Zirconium | 91.22 | 6.92 |

Since the ionization potentials are almost equal and the molecular weight is almost a factor of 2 different separation of these two materials in the processor configured to work as an axisymmetric mass spectrograph should be extremely precise, accurate within 0.1%.

The working fluid can be injected as vapors or compounds, as discussed with reference to FIG. 21. The mechanism of separation of the FIG. 22 embodiment is best shown in FIG. 23 is illustrated in FIG. 23. Assume, for convenience, that the two materials injected thru the anode with the lowest and comparable ionization potentials are zirconium and hafnium. By reference to the equation 38, the mass flow rate of these materials is adjusted to be slightly more than the critical value. They thus become singly ionized ions after passing thru the anode-ionizer structure. The combined effect of the radial electric field and the soienoidal magnetic field downstream of the anode will cause these ions to take up radial trajectories similar to those shown in FIG. 23. The heavier ions, in this case the hafnium, will come nearest to the center line 325, since their inertia impedes the turning effect of the $v\times B$ magnetic force. Although all of the ions will have some axial velocity, on the average their radial and azimuthal velocity will be zero on the outer circle 327, which represents the anode sheath. At the next circle inward 329 on FIG. 23, the zirconium ions will have zero radial velocity and their azimuthal velocity will be a maximum at close to their Alfvén velocity, given by equation 43. At this radial position the hafnium ions will still have some inward radial velocity and a considerable azimuthal velocity.

No zirconium ions wil) penetrate beyond this circle 329 however. The heavier hafnium ions will penetrate radially to the inner circle 331 shown on FIG. 23, where their radial velocity will become zero and their azimuthal velocity will approach their Alfvén velocity, given by Eq. 43. In order to achieve separation, then, the conical collector 311 must have a inaximum diameter greater than that of the inner circle 331 but smaller than that of the next circle out 329. As the hafnium ions strike this conical collector, the applied electric field will keep them near the surface until their energy is reduced to a low enough value for them to become first adsorbed and then incorporated into the metal structure of the collector. As this layer of hafnium builds up on the conical collector 311, the conical collector 311 is slowly withdrawn axially through the plate collector (313) by stem 315 attached to motive means (not shown) to ensure that its diameter never exceeds that of the intermediate circle 329 shown in FIG. 23. As shown in FIG. 22, the vacuum chamber includes a substantially cylindrical extension 317 in whieb the motive means for reciprocating the conical collector 311 is located. Also shown therein is cooling coil 319 surrounding the stem 315 which enables temperature control of the conical collector 311 to be had, and wire 321 which is connected at its other end with cathode 105' through a power supply (not shown) with the collector 311 having negative polarity.

The three limit circles 327, 329, 331 shown on FIG. 23 will, in reality, be smeared out into annular regions by thermal effects.

Thermal Process Annealing and Etching Using The Processor

Thermal processing and annealing of surfaces, films or layers, can be accomplished by passing an inert gas, such as argon or helium, through the processor as configured in FIGS. 11–13 and having the beam 169 impinge on the material that is to be thermally processed. The power flux and thermal stabilization of the target material can be controlled in order to accomplish the desired thermal processing with the desired surface temperature. These thermal processing procedures can involve dual mode operation of the processor in order to incorporate niore sophistication into the time history of the energy flux rate at the surface. In this mode of operation, if desired, the anode 127 and buffer 105 may be fabricated from any one of Tungsten, Molybdenum or Rhenium.

In many applications, especially in the fabrication of semi-conductor devices, it is desirable to etch surfaces to a controlled depth. The processor can be configured as in FIGS. 11–13 in order to use it as an etching machine. The major change operationally would be to pass gases through the cathode and anode which, when they combine on the target area, from a molecule or substance that will etch the surface. Selective etching can be accomplished by appropriately masking the target area. An example could be to etch selectively some silicon from the surface of a silicon semi-conductor. In order to accomplish this the following steps could be taken:

(1) Mask the surface with a template impervious to the etching material, e.g. platinum.

(2) Pass hydrogen gas through the cathode-buffer structure.

(3) Pass chlorine through a silicon anode structure.

(4) With appropriate coolant and radiation shielding operate the surface temperature at a value where the hydrogen and chlorine ions which impinge on the unmasked silicon will combine to form hydrogen chlorine molecules which will etch the silicon.

Although the invention has been described in terms of detailed preferred embodiments, it should be understood that major changes may be made in the apparatuses and methods disclosed herein without departing from the spirit thereof It is intended that the scope of the present invention be limited only by the following claims.

What is claimed is:

1. An apparatus for depositing materials in layers by using a plasma beam electromagnetically accelerated in a vacuum comprising:

(a) a vacuum chamber and associated vacuum pumping apparatus;

(b) a magnetoplasmadynamic plasma generator, the plasma generator further comprising cathode means, anode means, a cathode magnet located in substantially surrounding relation to said cathode means; a trimmer magnet located in substantially surrounding relation to said anode means; a focusing magnet, at least part of which is located beyond the anode means with respect to the cathode means;

(c) a shielded plasma generator support structure, the support structure supporting the plasma generator within the vacuum chamber;

(d) a means to supply the plasma generator with electric power, the electric power being primarily direct current and the power enabling the plasma generator to create a plasma;

(e) a target surface, the target surface being located beyond the focusing magnet with respect to the cathode *means* and anode *means*; and (f) means for injecting one or more of a plurality of materials at a location within said vacuum chamber so as to facilitate the creation of a plasma stream;

(g) said plasma stream impinging upon said target surface.

[2. The apparatus of claim 1, further including an access door enabling access to the inside of the vacuum chamber from the outside, the access door having sealing means.]

3. The apparatus of claim 3 wherein the means for injecting materials into the plasma [is further adapted to inject] *includes means for injecting* dopant material [so that the] *for selectively applying* dopant material [may be selectively applied] at said target surface.

4. The apparatus of claim 3 wherein the means for injecting one or more of a plurality of materials injects the materials adjacent to the cathode *means.*

5. The apparatus of claim 3 wherein means are provided so that the directional orientation of a flux pattern of the focusing magnet can be rotated with respect to an initial plasma center line, the initial plasma center line being a line passing through a center of the cathode *means* and a center of the anode *means*, the rotation of the directional orientation of the flux pattern of the focusing magnet being effective to enable the apparatus to deposit material selectively at various portions of the target surface.

6. The apparatus of claim 4 wherein means are provided so that the directional orientation of a flux pattern of the focusing magnet can be rotated with respect to an initial plasma center line, the initial plasma center line being a line passing through a center of the cathode *means* a center of the anode*means*, the rotation of the directional orientation of the flux pattern of the focusing magnet being effective to enable the apparatus to deposit material selectively at various portions of the target surface.

[7. The apparatus of claim 6 further comprising a robot means, the robot means being operable to move materials to and from the target surface.]

[8. The apparatus of claim 1, utilized to form semiconductor devices.]

[9. The apparatus of claim 8 wherein the semiconductor devices are silicon solar cells.]

10. The apparatus of claim 1 wherein the cathode means is a thermionic cathode.

11. The apparatus of claim 10 wherein the thermionic cathode further includes a buffer means mounted in surrounding relation thereto, said buffer means defining a buffer cavity adjacent a tip portion of said thermionic cathode, and means supplying gas to said buffer cavity.

12. The apparatus of claim 1 wherein *said means for injecting includes means for injecting* silicon [is injected] into the plasma generator during the operation of the the apparatus.

[13. The apparatus of claim 12 wherein the silicon is injected as a fluid compound.]

[14. The apparatus of claim 12 wherein the silicon is injected as elemental silicon in liquid form.]

15. The apparatus of claim 12 wherein *said means for injecting silicon includes means for injecting* the silicon [is injected] through the anode means.

16. The apparatus of claim 12 wherein *said means for injecting silicon includes means for injecting* the silicon [is injected] through the cathode means.

[17. The apparatus of claim 3, wherein the dopant is mixed with the plasma stream when the dopant is injected.]

[18. The apparatus of claim 8 wherein top terminals may be deposited on the semiconductor devices by the plasma generator.]

[19. The apparatus of claim 18 wherein the top terminals are formed by the deposition of aluminum.]

[20. The apparatus of claim 18 wherein said deposition at the top terminals is accomplished by first having the robot means first place a solid template over the target area said template having appropriate deposition openings extending therethrough and then depositing terminal material by means of the plasma generator.]

[21. The apparatus of claim 20, wherein said terminal material comprises aluminum]

22. The apparatus according to claim 1 wherein the vacuum pumping apparatus comprises a cryogenic vacuum pump and an ion vacuum pump.

[23. The apparatus of claim 22, wherein said vacuum pumping apparatus further includes a sorption pump.]

[24. The apparatus of claim 11, wherein insulation means is provided between said cathode means and said buffer means, and said means for supplying gas to said buffer cavity extends through said insulation means.]

[25. The apparatus of claim 24, further wherein cooling means is provided for said cathode means and said buffer means.]

[26. The apparatus of claim 25, wherein said cooling means comprises tube means extending within said cathode means and said buffer means, and means for supplying coolant therethrough.]

27. The apparatus of claim 1, wherein said cathode magnet is controllable to establish a [predetermined] *selected* magnetic field strength at a tip portion of said cathode means, the magnet field formed thereby diverging away from the cathode means in the direction of said anode means.

28. The apparatus of claim 27, wherein said anode means comprises a [ring-like] *ring-shaped* member and said trimmer magnet is adjustable to control the magnetic field within the ring-like anode means.

29. The apparatus of claim 1, further including upstream vacuum insulator/isolator means mounted in said vacuum chamber between said cathode means and said anode means.

30. The apparatus of claim 29, wherein said upstream vacuum insulator/isolator means comprises a plurality of discs, each said disc including an outer diameter and an opening therethrough, said openings sequentially increasing in diameter from said cathode means to said anode means with a disc closest to said cathode means having the smallest opening and a disc closest to said anode nieans having the largest opening.

31. The apparatus of claim 29, further including downstream vacuum insulator/isolator means mounted to said vacuum chamber between said anode means and said target surface.

32. The apparatus of claim 31, wherein said downstream vacuum insulator/isolator means comprises a plurality of truncated conical rings of substantially idetitical configuration.

[33. The apparatus of claim 32 wherein said upstream vacuum insulator/isolator means comprises a plurality of discs, each said disc including an outer diameter and an opening therethrough, said openings sequentially increasing in diameter from said cathode means to said anode means with a disc closest to said cathode means naving the smallest opening and a disc closest to said anode means having the largest opening.]

[34. The apparatus of claim 1, wherein said anode means includes cooling means thererer.]

35. The apparatus of claim 1, wherein said target surface includes cooling means therefor.]

36. The apparatus of claim 33, wherein said anode means forther includes conduit means for supplying feed gas thereto, said conduit means being surrounded by further vacuum insulator/isolator means.]

37. The apparatus of claim [36,] *32,* wherein said anode means further includes conduit means for supplying dopant gas thereto, said dopant gas conduit means being surrounded by [still] further vacuum insulator-/isolator means, one of said dopant gas and feed gas vacuum insulator/isolator means forther enclosing power lead means for said anode means.

38. A magnetoplasmadynamic processor comprising:

(a) an elongated vacuum chamber having a longitudinal axis therethrough;

(b) cathode-buffer means mounted in said vacuum chamber substantially aligned with said longitudinal axis and including:

(i) a cathode rod;

(ii) a buffer mounted in surrounding spaced relation to said cathode rod; and (iii) gas supply means for supplying gas to a buffer cavity formed between said cat,bode rod and said buffer;

(c) an anode-ionizer mounted in said vacuum chamber substantially aligned with said longitudinal axis and including:

(i) an inner ring portion;

(ii) an outer substantially cylindrical portion in surrounding relation to said inner ring portion;

(iii) a gap defined between said inner ring portion and said outer substantially cylindrical portion; and (iv) means for supplying gas to said gap; (d) accelerating magnet means including:

(i) a cathode magnet substantially surrounding said cathode buffer means, and (ii) a trimmer magnet substantially surrounding said anode-ionizer, and (e) upstream vacuum insulator/isolator means mounted in said vacuum chamber between said cathode-buffer means and said anode-ionizer and substantially aligned with said longitudinal axis.

39. The processor of claim 38, wherein said cathode-buffer means further includes insulation means between said cathode rod and said buffer.

40. The processor of claim 39, wherein said gas supply means includes [thread-like] passageways extending through said insulation means and communicating with said buffer cavity whereby said gas is caused to swirl in said buffer cavity.

41. The processor of claim 40, wherein said cathode rod includes a pointed tip extending into said buffer cavity.

42. The processor of claim 38, wherein said buffer includes orifice means communicating said buffer cavity with said vacuum chamber, said orifice means being substantially aligned with said axis.

43. The processor of claim 42, wherein said orifice means is of a size [designed] to maintain a back pressure of gas within said buffer cavity.

44. The processor of claim 38, wherein said inner ring portion of said anode-ionizer includes a first end substantially flush with a first end of said outer substantially cylindrical portion and said inner ring portion is significantly shorter in direction of said axis then said outer substantially cylindrical portion whereby a second end of said inner ring portion lies completely within said outer substantially cylindrical portion.

45. The [invention] *processor* of claim 44, wherein said outer substantially cylindrical portion includes first and second orifices communicating the exterior thereof with said gap, and said means for supplying gas to said gap comprises:

(a) First conduit means sealingly attached to said first orifice and communicating a rirst gas to said gap;

(b) first anode vacuum insulator/isolator means surrounding said first conduit means;

(c) second conduit means scalingly attached to said second orifice and communicating a second gas to said gap; and (d) second anode vacuum insulator/isolator means surrounding said second conduit means.

[46. The invention of claim 45, wherein said first and second anode insulator/isolator means comprise: (a) an insulative covering attached to a respective conduit means; (b) first cylindrical means surrounding said insulative covering and spaced therefrom; (e) second cylindrical means surrounding said first cylindrical means and spaced therefrom; and (d) means for structurally supporting said first and second cylindrical means in said spaced relation.]

47. The [invention] *processor* of claim 38, wherein said vacuum chamber has an annular stepped configuration adjacent said cathode-buffer means and said cathode magnet is located in overlying relation to said annular stepped configuration.

48. The [invention] *processor* of claim 38, wherein said upstream vacuum insulator/isolator means comprises a plurality of discs, each said disc including an outer diameter and an opening therethrough, said openings sequentially increasing in diameter from said cathode-buffer means to said anode-ionizer with a disc closest to said cathode-buffer means having the smallest opening and a disc closest to said anode-ionizer having the largest opening.

49. The [invention] *processor* of claim 38, wherein said vacuum chamber extends a substantial distance beyond said anode-ionizer, and further wherein said processor includes downstream vacuum insulator/isolator means mounted within said vacuum chamber.

50. The [invention] *processor* of claim 49, wherein said downstream vacuum insulator/isolator means comprises a plurality of substantially identical truncated conical segments mounted about said axis beyond said anode-ionizer.

51. The [invention] *processor* of claim 50, wherein said processor further coniprises focusing magnet means surrounding said downstream vacuum insulator-/isolator means.

[52. The invention of claim 51, wherein said focusing magnet means comprises a plurality of focusing magnets attached to the exterior of said vacuum chamber in surrounding relation to said truncated conical segments.]

[53. The invention of claim 45, wherein said first gas comprises semiconductor feed gas and said second gas comprises dopant gas.]

54. The [invention] *processor* of claim 45, wherein a target means is provided in said vacuum chamber aligned with said axis at a location spaced from said anode-ionizer, and a plasma stream formed by said processor impinges upon said target means.

[55. The invention of claim 54, wherein constituent iotis from said first and second gases combine at said target means to form a compound.]

[56. The invention of claim 54, wherein constituent ions from said first and second gases combine at said target means to form a mixture.]

[57. The invention of claim 54, wherein constituent ions from said first and second gases combine at said target means-to form an alloy.]

[58. The invention of claim 54, wherein some constituent ions from said first and second gases combine at said target to form one of a compound, a mixture and an alloy, and wherein said processor further includes pumping means for pumping from said plasma stream and vacuum chamber constituent unionized particles from said first and second gases.]

[59. The invention of claim 58, wherein said pumping means comprises mechanical pump means.]

[60. The invention of claim 58, wherein said pumping means comprises ion pump means.]

[61. The invention of claim 58, wherein said pumping means comprises sorption pump means.]

[62. The invention of claim 58, wherein said pumping means comprises mechanical and ion pump means.]

[63. The invention of claim 58, wherein said pumping means comprises mechanical and sorption pump means.]

[64. The invention of claim 58, wherein said pumping means comprises ion and sorption pump means.]

[65. The invention of claim 58, wherein said pumping means comprises mechanical, ion atid sorption pump means.1 ]

[66. The invention of claim 54, further including cooling means for said target means.]

[67. The invention of claim 78, wherein said cooling means comprises conduit means extending through said target means and supply means for supplying coolant to said conduit means.]

68. The [invention] *processor* of claim 38, further including cooling means for said cathode rod.

69. The [invention] *processor* of claim 68, further comprising cooling means for said buffer.

70. The [invention] *processor* of claim 69, further comprising, cooling means for said anode-ionizer.

71. The [invention] *processor* of claim 70, further comprising cooling means for said means for supplying gas to said gap.

72. The [invention] *processor* of claim 45, wherein said first and second orifices open into said gap tangentially whereby said first and second gases are caused to swirl within said gap.

73. The [invention] *processor* of claim 38, wherein collection means is provided in said vacuum chamber for ions of predetermined molecular weights.

74. The [invention] *processor* of claim 73, wherein said collection means comprises a first collector for high molecular weight ions and a second collector for low molecular weight ions.

75. The [invention] *processor* of claim 73, wherein said first collector comprises a substantially conically shaped member mounted along said axis and oriented with a tip portion thereof facing said anode-ionizer and a base portion thereof facing away from said anode-ionizer.

76. The [invention] *processor* of claim 75, wherein said second collector comprises a flat plate facing said anode-ionizer.

77. The [invention] *processor* of claim 76, wherein said second collector further comprises a substantially circular flat plate with a hole centrally located therein.

78. The [invention] *processor* of claim 77, wherein said first collector extends through said hole in said second collector and is substantially perpendicular to said second collector.

[79. The invention of claim 51, further including a plurality of anode elements and cathode elements mounted within said vacuum chamber in surrounding relation to said downstream vacuum insulator/isolator means.]

[80. The invention of claim 79, wherein said anode elements and cathode elements are mounted in alternating fashion with at least one anode element located between two cathode elements and at least one cathode element located between two anode elements.]

[81. The invention of claim 80, wherein said anode elements and cathode elements are surrounded by said focusing magnet means.]

[82. The invention of claim 81, wherein said focusing magnet means is operative to: (a) focus a plasma stream formed by said processor onto target means located in said vacuum chamber, and (b) interact with said cathode elements and anode elements to form an ion pump which pumps atoms or molecules from said chamber.]

[83. The invention of claim 60 wherein said ion pump means comprises: (a) a plurality of anode elements and cathode elements mounted in alternating relation in said vacuum chamber between said anode-ionizer and said target means and in surrounding relation to said plasma stream, and (b) ion pump magnet means surrounding said anode elements and cathode elements.]

[84. The invention of claim 83, wherein said ion pump magnet means further comprises focusing magnet means for focusing said plasma stream onto said target means.]

85. The [invention] *processor* of claim 54, wherein constituent ions from said first and second gases combine at said target means to form a doped semiconductor.]

86. [The invention of claim 58 wherein at least one of said first and second gases comprises a plurality of gases which are non-reactive with respect to one another.]

87. [The invention of claim 54, wherein constituent ions from said first and second gases combine at said target means to form a semi-conductor.]

88. The [invention] *processor* of claim 38, wherein the ion flux rate of a plasma stream formed by said processor is determined by the critical mass flow rate of ions in said plasma stream, said critical mass flow rate $(m_I)_{cr}$ being defined by the formula:

$$(m_I)_{cr}=(F_{EM}/V_{cr})$$

where $F_{EM}$=electromagnetic reaction force on said accelerating magnet means and on all current carrying structure within said vacuum chamber $V_{cr}$=critical exhaust velocity of said plasma stream which equals the Alfén velocity and, further, wherein gas is supplied to said gap by said gas supplying means at a sufficient rate to thereby provide the desired ion flux rate.

89. The [invention] *processor* of claim 38 wherein:

(a) said processor further includes focusing magnet means located beyond said anode-ionizer with respect to said cathode-buffer means;

(b) said processor forms a plasma stream;

(c) said plasma stream is composed of a cathode jet and an anode sheath which converge at a [predetermined] distance L beyond said anode-ionizer to form an electromagnetic throat, said [predetermined] distance L being defined by the formula:

$$L = \frac{\Phi A^2(\sigma kT)_{ave}\left[\frac{m}{M_a} + \frac{I}{|e|}\right]}{8\pi(p_o\pi R_c^2)}.$$

where $\Phi_A=\pi R_A^2(B_z)_A$ $R_A$=an inner radius of the anode-ionizer $(B_z)_A$=average strength of the axial magnetic field at said anode-ionizer $\sigma$=electrical conductivity of gas in said cathode jet.

k=Boltzman's constant

T=Gas (electron) temperature m=mass flow rate in teh cathode jet.

$m_a$=mass of an atom of gas flowing in the cathode jet.

I=current flowing thru the cathode jet.

e=charge in the electron.

$$P_a\pi R_c^2 = m\sqrt{\frac{2kT}{\gamma m_a}}.$$

$\gamma$=ratio of specific heats;

(d) and further wherein said term $(B_z)_A$ is a function of magnetic fields created by said cathode magnet, said trimmer magnet and said focusing magnet means, adjustment of said magnetic fields being operative to adjust said predetermined distance.

*90. Apparatus for depositing material onto a substrate from a vapor phase comprising:*

*(a) a cathode;*

*(b) an anode spaced from said cathode along an axis;*

*(c) means for creating a d.c. electrical arc between said cathode and said anode, including means for creating a d.c. electric field between said anode and said cathode and means for injecting a gas proximate said cathode for being ionized by said electric field;*

*(d) means for injecting a working fluid containing a material to be deposited on the substrate or a precursor thereof into the path of said ionized gas for being ionized thereby to form a plasma;*

*(e) means for creating a solenoidal magnetic field between said cathode and said anode centered about said axis, said field diverging in the direction of and beyond said anode from said cathode, said field azimuthally and axially accelerating the plasma with the divergence of said solenoidal magnetic field acting to axially accelerate said plasma beyond said anode in the direction of said divergence;*

*(f) means for positioning the substrate in the path of said accelerated plasma for forming a coating of said material thereon; and*

*(g) means for establishing a partial vacuum encompassing said arc, said plasma and said substrate.*

*91. Apparatus for treating a substrate with a material from a vapor phase comprising:*

*(a) a cathode;*

*(b) an anode spaced from said cathode along an axis;*

*(c) means for creating a d.c. electrical arc between said cathode and said anode, including means for injecting a gas proximate said cathode for being ionized by said arc;*

*(d) means for injecting a working fluid into the path of said ionized gas proximate said anode for being ionized thereby to form a plasma, said working fluid including the material for treating the substrate or a precursor thereof;*

*(e) means for creating a solenoidal magnetic field between said cathode and said anode centered about said axis, said field diverging in the direction of and beyond said anode from said cathode, said field azimuthally and axially accelerating the plasma beyond said anode in the direction of said divergence;*

*(f) means for positioning the substrate in the path of said plasma for being treated by said plasma; and*

*(g) means for establishing a partial vacuum encompassing said cathode, anode, injected gas and working fluid and substrate.*

*92. The apparatus of claim 91 wherein said means for injecting a gas includes means for azimuthal injecting said gas about said axis, and said means for injecting a working fluid into said ionized gas includes means for azimuthal injecting said working fluid about said axis.*

*93. Apparatus of claims 90 or 91 wherein said means for injecting a working fluid includes means for injecting said working fluid azimuthally about the axis of said solenoidal magnetic field.*

*94. The apparatus of claim 91, wherein the means for creating a solenoidal magnetic field comprises an accelerating magnet adjacent to the cathode.*

*95. The apparatus of claim 91, wherein said means for creating a solenoidal magnetic field comprises a cathode magnet located in substantially surrounding relation to said cathode.*

*96. The apparatus of claim 91, further including a trimmer magnet located adjacent to said anode.*

*97. The apparatus of claim 91, further including a focusing magnet located between said anode and said means for positioning the substrate.*

*98. Apparatus for depositing material onto a substrate from a vapor phase comprising:*

*(a) a cathode;*

*(b) an anode spaced from said cathode;*

*(c) means for creating a d.c. electrical arc between said cathode and said anode, including means for injecting a gas proximate said cathode;*

*(d) means for injecting a working fluid proximate said anode with a velocity component tangential to a circle normal to the axis of the solenoidal field and for ionizing said fluid to form a plasma, said ionized fluid containing a material to be deposited on the substrate or a precursor thereof;*

*(e) a plurality of magnets including an accelerating magnet adjacent to said cathode, a trimmer magnet located adjacent to said anode, and a focusing magnet located beyond said anode from said cathode;*

*(f) means for positioning the substrate in the path of said plasma beyond said focusing magnet for forming a coating of said material thereon; and*

*(g) means for establishing a partial vacuum encompassing said cathode, anode, injected gas and working fluid and substrate.*

*99. A method for depositing materials on a substrate comprising the steps of:*

*(a) establishing a d.c. arc along an axis between a cathode and an anode spaced from said cathode along said axis including injecting a gas for being ionized by said arc;*

*(b) ionizing a working fluid containing a material to be deposited on the substrate or a precursor thereof to form a plasma by injecting said fluid into the path of said ionized gas;*

*(c) azimuthal and axially accelerating the plasma beyond said anode from said cathode by subjecting said plasma to a solenoidal magnetic field centered about said axis, said field diverging in the direction of and beyond said anode from said cathode;*

*(d) coating the substrate with said material by positioning said substrate in the path of said accelerated plasma; and*

*(e) establishing a partial vacuum in the region encompassing said arc, said plasma and said substrate.*

*100. A method for treating a substrate with a material from a vapor phase comprising:*

*(a) creating a d.c. electrical arc between a cathode and an anode spaced from said cathode along an axis including injecting a gas proximate said cathode for being ionized by said arc;*

*(b) injecting a working fluid into said ionized gas proximate said anode for being ionized thereby to form a plasma, said working fluid including a material for treating the substrate or a precursor thereof;*

*(c) creating a solenoidal magnetic field between said cathode and said anode centered about said axis, said field diverging in the direction of and beyond said anode from said cathode, said field azimuthally and axially accelerating said plasma beyond said anode in the direction of said divergence;*

*(d) positioning the substrate in the path of said plasma for being treated by said plasma; and*

*(e) establishing a partial vacuum in the region encompassing said cathode, anode, injected gas and working fluid and substrate.*

*101. The method of claim 100 wherein said gas and said working fluid are injected azimuthally about said axis.*

*102. The method of claim 100 wherein said plasma forms a coating of said material on said substrate.*

*103. Apparatus for practicing the method of claim 100 for treating a substrate with a material from a vapor phase, comprising:*

*(a) a cathode;*

*(b) an anode spaced from said cathode along an axis;*

*(c) means for creating a d.c. electrical arc between said cathode and said anode including injecting a gas proximate said cathode for being ionized by said arc;*

*(d) means for injecting a working fluid into said ionized gas proximate said anode for being ionized thereby to form a plasma, said working fluid including a material for treating the substrate or a precursor thereof;*

*(e) means for creating a solenoidal magnetic field between said cathode and said anode centered about said axis, said field diverging in the direction of and beyond said anode from said cathode, said field azimuthally and axially accelerating said plasma beyond said anode in the direction of said divergence;*

*(f) means for positioning the substrate in the path of said plasma for being treated by said plasma; and*

*(g) means for establishing a partial vacuum in the region encompassing said cathode, anode, injected gas and working fluid and substrate.*

*104. Apparatus for separating a higher molecules weight material from a lower molecular weight material in a vapor phase comprising:*

*(a) a cathode;*

*(b) an anode spaced from said cathode along an axis;*

*(c) means for creating a d.c. electrical arc discharge, between said anode and said cathode, including injecting a gas proximate said cathode for being ionized by said arc discharge, said anode being configured for causing said arc discharge to extend along said axis beyond said anode from said cathode;*

*(d) means for injecting a working fluid into the path of said ionized gas for being ionized thereby to form a plasma, said plasma containing ions of said materials to be separated;*

*(e) means for establishing a solenoidal magnetic field about said axis, said field diverging in the direction of and beyond said anode from said cathode for azimuthal and axially accelerating said plasma beyond said anode in the direction of said divergence;*

*(f) a first surface positioned in the central portion of said plasma, centered on said axis for depositing the higher molecular weight material thereon;*

*(g) a second surface positioned in a peripheral portion of said plasma surrounding said central portion for depositing said lower molecular weight material thereon; and*

*(h) means for establishing a partial vacuum in the region encompassing said cathode, anode, arc, plasma and first and second surfaces.*

*105. The apparatus of claim 104 wherein the portion of the arc discharge extending beyond said anode includes a cathode jet and an anode sheath, and wherein said first surface extends into said cathode jet.*

*106. The apparatus of claims 90, 91, 98 or 104 wherein said anode includes a substantially cylindrical hollow portion extending axially downstream away from said cathode for assisting in the ionization of said working fluid.*

*107. The apparatus of claims 90, 91, 98 or 104 further including vacuum insulator/isolator means between said cathode and anode.*

*108. A method for separating a higher molecular weight material from a lower molecular weight material in a vapor phase comprising:*

*(a) establishing a d.c. electrical arc discharge between a cathode and an anode spaced from said cathode along an axis, said arc discharge including an ionized gas and having a portion extending along said axis from said anode in the direction away from said cathode;*

*(b) ionizing a working fluid to form a plasma by injecting said fluid into the path of said ionized gas, said ionized working fluid containing ions of such different molecular weight materials to be separated;*

*(c) establishing a solenoidal magnetic field centered about said axis, said field diverging in the direction of and beyond said anode from said cathode, said field azimuthally and axially accelerating said plasma beyond said anode in the direction of said divergence;*

*(d) depositing the higher molecular weight material on a first surface located in the central portion of said plasma centered on said axis;*

*(e) depositing said lower molecular weight material on a second surface located in a peripheral area of said plasma surrounding said central portion; and*

*(f) establishing a partial vacuum in the region encompassing said cathode, anode, arc discharge, plasma and first and second surfaces.*

*109. The method of claim 108 wherein said portion of said arc discharge extending beyond said anode includes a cathode jet and an anode sheath, and wherein said step of depositing the higher weight material includes collecting said higher molecular weight ions on a surface extending into said cathode jet.*

* * * * *